US010027942B2

(12) United States Patent
Ishiga et al.

(10) Patent No.: US 10,027,942 B2
(45) Date of Patent: Jul. 17, 2018

(54) IMAGING PROCESSING APPARATUS, IMAGE-CAPTURING APPARATUS, AND STORAGE MEDIUM HAVING IMAGE PROCESSING PROGRAM STORED THEREON

(71) Applicant: NIKON CORPORATION, Tokyo (JP)

(72) Inventors: Kenichi Ishiga, Yokohama (JP); Kiyoshige Shibazaki, Higashimurayama (JP); Muneki Hamashima, Fukaya (JP); Susumu Mori, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 824 days.

(21) Appl. No.: 14/482,397

(22) Filed: Sep. 10, 2014

(65) Prior Publication Data

US 2015/0062307 A1 Mar. 5, 2015

Related U.S. Application Data

(63) Continuation of application No. PCT/JP2013/001746, filed on Mar. 14, 2013.

(30) Foreign Application Priority Data

Mar. 16, 2012 (JP) ................................ 2012-061012
Aug. 22, 2012 (JP) ................................ 2012-183511

(51) Int. Cl.
*H04N 13/00* (2018.01)
*H04N 13/02* (2006.01)
(Continued)

(52) U.S. Cl.
CPC ..... *H04N 13/0011* (2013.01); *H04N 13/0018* (2013.01); *H04N 13/0037* (2013.01);
(Continued)

(58) Field of Classification Search
CPC .... H04N 5/3696; H04N 9/045; H04N 13/001; H04N 13/0018; H04N 13/0097; H04N 13/00207; H04N 13/0217; H04N 13/0257
(Continued)

(56) References Cited

U.S. PATENT DOCUMENTS 6,836,572 B2 12/2004 Ishiga et al.
7,236,628 B2 6/2007 Chen et al.
(Continued)

FOREIGN PATENT DOCUMENTS

JP A-2003-7994 1/2003
WO WO 2006/006373 A1 1/2006
(Continued)

OTHER PUBLICATIONS

International Preliminary Report on Patentability issued in International Patent Application No. PCT/JP2013/001746 dated Sep. 16, 2014.

(Continued)

*Primary Examiner* — Jimmy S Lee
(74) *Attorney, Agent, or Firm* — Oliff PLC

(57) ABSTRACT

A technique is disclosed to obtain first image data including a first pixel value of a first pixel having a no-parallax opening corresponding to a reference direction, a second pixel value of a second pixel having a parallax opening that causes parallax in one direction and a third pixel value of a third pixel having a parallax opening that causes parallax in the opposite direction, to calculate, for a pixel position of the second pixel, a fourth pixel value by averaging the second pixel value at the pixel position and a hypothetical third pixel value and to calculate, for a pixel position of the third pixel, a fifth pixel value by averaging the third pixel value at the pixel position and a hypothetical second pixel value,
(Continued)

and to use the first pixel value, the fourth pixel value and the fifth pixel value to produce 2D second image data.

9 Claims, 33 Drawing Sheets

(51) Int. Cl.
*H04N 5/369* (2011.01)
*H04N 9/04* (2006.01)

(52) U.S. Cl.
CPC ..... *H04N 13/0207* (2013.01); *H04N 13/0217* (2013.01); *H04N 13/0257* (2013.01); *H04N 5/3696* (2013.01); *H04N 9/045* (2013.01)

(58) Field of Classification Search
USPC .......................................................... 348/49
See application file for complete search history.

(56) References Cited

U.S. PATENT DOCUMENTS

| | | | | |
|---|---|---|---|---|
| 7,391,903 | B2 | 6/2008 | Ishiga | |
| 7,565,007 | B2 | 7/2009 | Ishiga | |
| 7,957,588 | B2 | 6/2011 | Ishiga | |
| 8,274,715 | B2 * | 9/2012 | Hamilton, Jr. | H04N 9/045 348/147 |
| 8,508,580 | B2 * | 8/2013 | McNamer | H04N 13/0221 348/43 |
| 8,611,654 | B2 * | 12/2013 | Yadav | G06T 5/009 348/645 |
| 9,165,964 | B2 * | 10/2015 | Fukuda | G03B 13/36 |
| 2008/0123999 | A1 * | 5/2008 | Ishiga | H04N 9/045 382/300 |
| 2009/0051790 | A1 * | 2/2009 | Campbell | G06T 5/006 348/241 |
| 2009/0074324 | A1 * | 3/2009 | Ishiga | H04N 9/045 382/282 |
| 2010/0201853 | A1 | 8/2010 | Ishiga | |
| 2011/0007390 | A1 * | 1/2011 | Yanamoto | G02B 27/2214 359/466 |
| 2011/0255592 | A1 * | 10/2011 | Sung | H04N 13/0011 375/240.02 |
| 2012/0114225 | A1 * | 5/2012 | Lim | G06K 9/48 382/154 |
| 2012/0140100 | A1 | 6/2012 | Shibazaki et al. | |
| 2012/0193515 | A1 * | 8/2012 | Agranov | G01S 3/782 250/208.1 |
| 2013/0100251 | A1 | 4/2013 | Endo | |
| 2013/0107017 | A1 | 5/2013 | Endo | |
| 2013/0107019 | A1 | 5/2013 | Ooshima et al. | |
| 2013/0162780 | A1 | 6/2013 | Kurahashi | |
| 2013/0278730 | A1 | 10/2013 | Hasegawa et al. | |

FOREIGN PATENT DOCUMENTS

| | | | |
|---|---|---|---|
| WO | WO 2012/002071 | A1 | 1/2012 |
| WO | WO 2012/002297 | A1 | 1/2012 |
| WO | WO 2012/002298 | A1 | 1/2012 |
| WO | WO 2012/036019 | A1 | 3/2012 |
| WO | WO 2012/039346 | A1 | 3/2012 |
| WO | WO 2012/073491 | A1 | 6/2012 |
| WO | WO 2013/136819 | A1 | 9/2013 |

OTHER PUBLICATIONS

International Search Report issued in International Patent Application No. PCT/JP2013/001746 dated May 7, 2013 (with translation).

* cited by examiner $N:Lt:Rt=14:1:1$ $R_N:G_N:B_N=1:2:1$ $R_{Lt}:G_{Lt}:B_{Lt}=1:2:1$ $R_{Rt}:G_{Rt}:B_{Rt}=1:2:1$

IMAGING PROCESSING APPARATUS, IMAGE-CAPTURING APPARATUS, AND STORAGE MEDIUM HAVING IMAGE PROCESSING PROGRAM STORED THEREON

The Contents of the following Japanese patent applications are incorporated herein by reference:

No. 2012-061012 filed on Mar. 16, 2012,
No. 2012-183511 filed on Aug. 22, 2012, and
PCT/JP2013/001746 filed on Mar. 14, 2013.

BACKGROUND

1. Technical Field

The present invention relates to an image processing apparatus, an image-capturing apparatus and a storage medium having an image processing program stored thereon.

2. Related Art

A known image-capturing apparatus uses a single image-capturing optical system to produce, with a single image-capturing operation, a plurality of parallax images having a parallax therebetween.

Patent Document 1: Japanese Patent Application Publication No. 2003-7994

Image-capturing apparatus of this type experience imbalance between the parallax images, for example, variance in illuminance, which is uniquely attributed to the combination of the parallax pixels and the single optical system. The imbalance between the parallax images has negative impact on image processing utilizing the parallax images.

SUMMARY

A first aspect of the innovations herein may include an image processing apparatus including an obtaining unit configured to obtain first image data including (i) a first pixel value of a first pixel having a no-parallax opening corresponding to a reference direction and a first filter for a first component color among a plurality of color components forming a color of a subject image, (ii) a second pixel value of a second pixel having a parallax opening that causes parallax in one direction with respect to the reference direction and a second filter for a second component color among the plurality of color components and (iii) a third pixel value of a third pixel having a parallax opening that causes parallax in the other direction opposite to the one direction and the second filter, a calculating unit configured to calculate, for a pixel position of the second pixel, a fourth pixel value by averaging the second pixel value at the pixel position and a hypothetical third pixel value calculated using third pixel values of surrounding third pixels and to calculate, for a pixel position of the third pixel, a fifth pixel value by averaging the third pixel value at the pixel position and a hypothetical second pixel value calculated using second pixel values of surrounding second pixels, and an image producing unit configured to use the first pixel value, the fourth pixel value and the fifth pixel value to produce second image data that is 2D image data in the reference direction including color information corresponding to at least the first component color and the second component color.

A second aspect of the innovations herein may include an image-capturing apparatus including an image sensor configured to capture a subject image; and the above-described image processing apparatus. Here, the first image data is produced based on an output from the image sensor.

A third aspect of the innovations herein may include a storage medium having an image processing program stored thereon, the image processing program causing a computer to perform procedures of obtaining first image data including (i) a first pixel value of a first pixel having a no-parallax opening corresponding to a reference direction and a first filter for a first component color among a plurality of color components forming a color of a subject image, (ii) a second pixel value of a second pixel having a parallax opening that causes parallax in one direction with respect to the reference direction and a second filter for a second component color among the plurality of color components and (iii) a third pixel value of a third pixel having a parallax opening that causes parallax in the other direction opposite to the one direction and the second filter, calculating, for a pixel position of the second pixel, a fourth pixel value by averaging the second pixel value at the pixel position and a hypothetical third pixel value calculated using third pixel values of surrounding third pixels and to calculate, for a pixel position of the third pixel, a fifth pixel value by averaging the third pixel value at the pixel position and a hypothetical second pixel value calculated using second pixel values of surrounding second pixels, and using the first pixel value, the fourth pixel value and the fifth pixel value to produce second image data that is 2D image data in the reference direction including color information corresponding to at least the first component color and the second component color.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

A digital camera relating to the present embodiment, which is a form of an image processing apparatus and an image-capturing apparatus, is configured to be capable of producing for a single scene a plurality of images from a plurality of viewpoints with a single image-capturing operation. Here, the images from different viewpoints are referred to as parallax images.

Patent Document 1 discloses an image-capturing technique using a single-plate color solid imaging device of Bayer arrangement in which half of the pixels are parallax pixels open on the left side only and the other half of the pixels are parallax pixels open on the right-hand side only. According to this technique, a stereoscopic image can be formed using a single camera with a single image-capturing operation. However, Patent Document 1 does not particularly describe a method of producing color images for left and right eyes from the data resulting from the image-capturing operation. Furthermore, Patent Document 1 does not describe the sensor characteristics of the image sensor constructed by the parallax pixels that are only half-open, and what kind of problems exist and need to be solved to obtain high-resolution stereoscopic images.

The present invention intends to provide a method of producing high-resolution stereoscopic images taking an optical system and sensor characteristics into consideration. According to the present invention, a single-plate image sensor having half-open parallax pixels for left and right eyes is used to produce high-resolution left-eye and right-eye images by appropriately addressing the problem of uneven illuminance distributions between the left-eye and right-eye pixels when stereoscopic images are captured.

The following first describes the experimental facts about the characteristics of a sensor including parallax pixels having left-open and right-open masks on a single-plate image sensor and the algorithm for computing high-resolution stereoscopic images.

Figure 1A:
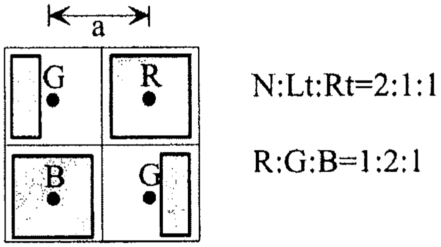
FIGS. 1A and 1B respectively show a Bayer G parallax pixel arrangement and a resolution of this arrangement in the frequency space.

Assume the case of the Bayer G parallax pixel arrangement shown in FIG. 1A. In other words, the color filter arrangement is the Bayer arrangement and one of the G pixels is a parallax pixel provided with a left-open aperture mask and the other of the G pixels is a parallax pixel provided with a right-open aperture mask. Furthermore, the R and B pixels are full-open no-parallax pixels.

Figure 1B:
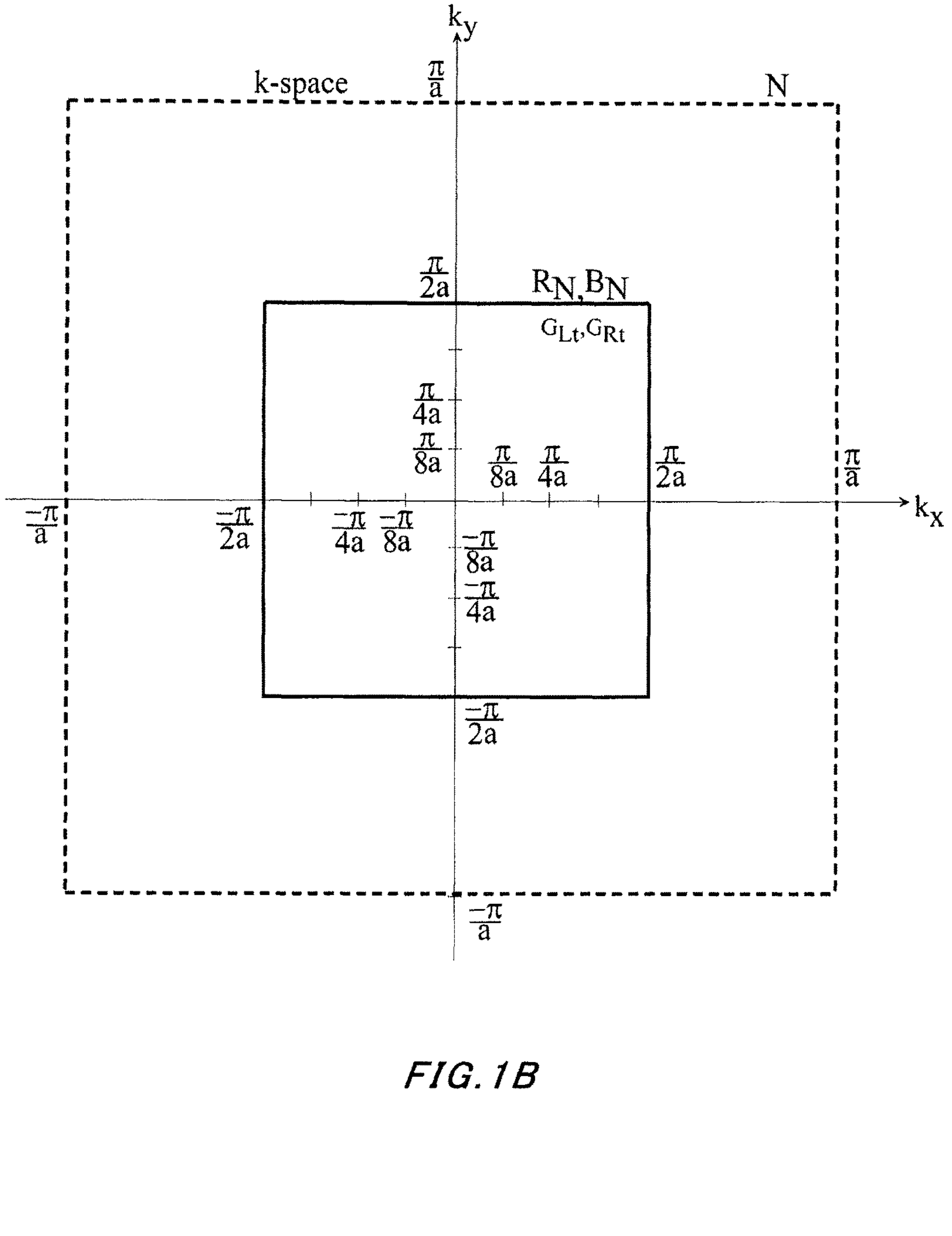

The spatial-frequency resolution for this arrangement is shown in FIG. 1B. The resolution limit frequency of sensor pixels is within the range of the Nyquist frequency, which is defined by the dotted line, represented as $k_x=[-\pi/a,+\pi/a]$, $k_y=[-\pi/a,+\pi/a]$, where a denotes the pixel pitch. However, various types of color filters and aperture masks are overlaid on a single sensor surface. Therefore, when it comes to the resolution limit frequency of a pixel of a particular color with a particular aperture mask, the resolving power is far below the original Nyquist frequency of the pixel. More specifically, the image of the left-viewpoint G component, the image of the right-viewpoint G component, the image of the middle-viewpoint no-parallax R component, and the image of the middle-viewpoint no parallax B component each only have a resolving power within the range of $k_x=[-\pi/(2a),+\pi/(2a)]$, $k_y=[-\pi/(2a),+\pi/(2a)]$, which is only half the range of the resolving power of the sensor pixel in both the x and y directions. Considering the above, when a left-viewpoint RGB color image and a right-viewpoint RGB color image are produced, the images are only expected to have a resolving power within the range of $k_x=[-\pi/(2a),+\pi(2a)]$, $k_y=[-\pi/(2a),+\pi/(2a)]$. Thus, the resolving power of the images cannot be as high as the original Nyquist limit of $k_x=[-\pi/a,+\pi/a]$, $k_y=[-\pi/a,+\pi/a]$ of the pixels.

To address this issue, the left and right parallax pixels of the G component may both be required to produce the G component without parallax. If this happens, the pixel arrangement has the same structure as the ordinary Bayer arrangement without parallax. Accordingly, the existing Bayer interpolation techniques may be employed to produce, as an intermediate image without parallax, a color image having a resolving power within the range defined by the original Nyquist frequency of $k_x=[-\pi/a,+\pi/a]$, $k_y=[-\pi/a,+\pi/a]$. Subsequently, a left-viewpoint image that only has a resolving power defined as a small area in the frequency domain is superimposed on the intermediate image without parallax. In this manner, the final left-viewpoint color image can have a resolving power defined by the original Nyqyist frequency. The same process is performed for a right-viewpoint color image.

To convert the Bayer arrangement including the G component with parallax into the Bayer arrangement in which all the pixels have no parallax as described above, an intensive process is expected to be additionally required to detect the positional shifts corresponding to the left and right parallax and to perform necessary displacement to transform pixel values with parallax into pixel values without parallax. In other words, it is necessary to perform parallax detection and displacement in order to eliminate parallax. The accuracy of the positional shift detection is normally limited, which is one of the great drawbacks for the conversion.

Figure 2A:
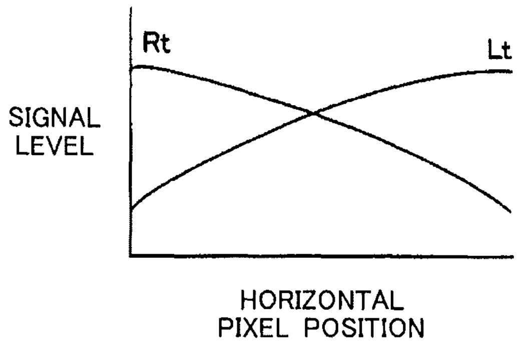
FIGS. 2A and 2B illustrate a problem of variance in illuminance between left and right parallax pixels.
Figure 2B:
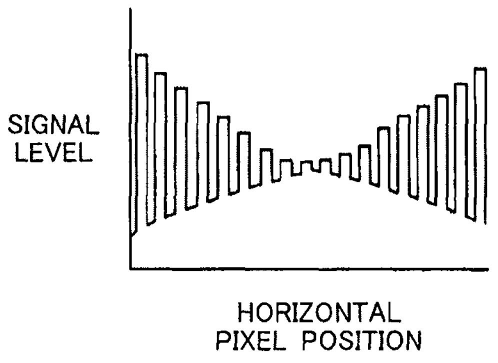

Even if the displacement to eliminate the parallax is successfully performed, there is actually another significant problem. Since the imaginary pupil position in parallax pixels is off the center, the image of a subject captured through a left parallax pixel is bright on the right-hand side and dark on the left side and, on the other hand, the image of the subject captured through a right parallax pixel is bright on the left side and dark on the right-hand side. In other words, even when capturing the images of the same subject, the left and right parallax pixels produce images of very different illuminance levels. When such parallax pixels are alternately arranged in accordance with the Bayer arrangement, G pixels with totally different gain balances are arranged. Therefore, ordinary Bayer interpolation will create a false structure of a checkerboard pattern. Experiments prove that, the larger the aperture of an optical system is, the larger the variance in illuminance distribution is between the left and right parallax pixels. Here, the unevenness in illuminance may be characterized by capturing in advance images of a uniform surface under various optical conditions, but this countermeasure is realistically difficult since correctional data needs to be prepared for all kinds of lenses. This is shown in FIG. 2.

An experiment was actually performed where ordinary Bayer interpolation was performed on the data resulting from capturing images without considering the parallax of the data and under the assumption that the Bayer arrangement without parallax was employed. In this case, a checker board pattern was seen on the entire image due to the variance in gain among the G pixels. Furthermore, it has been confirmed that unevenly-colored ribbon-like portions of false colors are seen, which seems to be equivalent to the amount of parallax, at various positions in the image due to the parallax or the variance in gain.

Figure 3A:
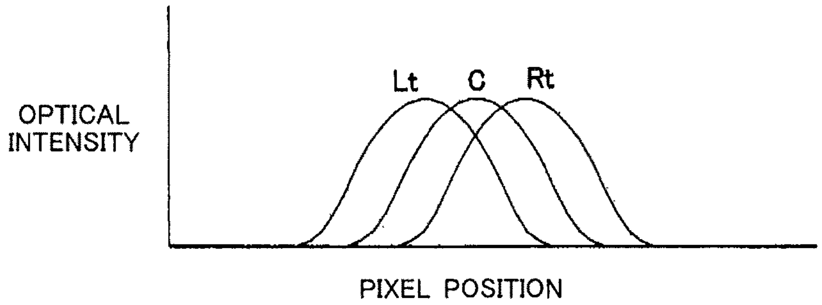
FIGS. 3A and 3B are used to illustrate a blur subject image.
Figure 3B:
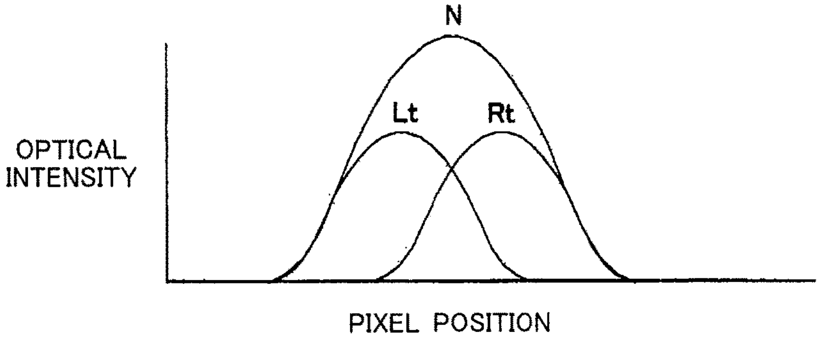

Here, a method is proposed that is designed to simultaneously solve the problem of the variance in illuminance between parallax pixels and the problem of the difference in subject position caused by the parallax while taking into consideration the characteristics of the subject images captured using a monocular pupil-division approach. As shown in FIG. 14, when images are captured in the monocular pupil-division approach, no parallax is found between left and right parallax pixels in focused subject images and parallax is only found between left and right parallax pixels in unfocused subject images. In other words, parallax is included only in blur. A blurred subject image shown in FIG. 3 can be produced into an image without parallax by simply calculating an average. Accordingly, for the focus position at which a change in image structure can be captured on the pixel-by-pixel basis, averaging the left and right parallax pixels does not change the structure of the captured image signal. On the other hand, for the unfocused position of a blurred subject image, the parallax is completely eliminated by averaging the left and right parallax pixels, and the problem of the variance in gain due to the variance in illuminance is also completely eliminated. Thus, the two problems can be simultaneously solved. Experiments have proved that the two problems can be surprisingly perfectly solved. This paves the way to produce high-resolution intermediate images without parallax. In other words, it is no longer necessary to capture images of a uniform surface in advance and the data of subject images can be directly used to correct variance in illuminance between left and right parallax pixels. Thus, a very simple solution can be provided, which is unique to the monocular pupil-division approach.

The averaging can be performed in two difference ways. Specifically, an arithmetic or geometric average is calculated. When an arithmetic average is calculated, a subject image having a large blur width equal to the total of two separated blur widths is produced at the intermediate position. When a geometric average is calculated, a subject image having the same blur width as each of the two separated blur widths is produced at the intermediate position. When an arithmetic average is calculated, a subject image having the same blur width as the full-open no-parallax pixel is formed. When a geometric average is calculated, a subject image having the same blur width as the half-open parallax pixel is formed.

The intermediate image without parallax can be used to be displayed on a monitor or printed out as a conventional high-resolution two-dimensional image.

<First Embodiment>

Bayer arrangement having parallax pixels assigned to G pixels

The following describes an example using an image sensor where primitive lattices having the arrangement shown in FIG. 1A are periodically arranged. The frequency resolution region of the reciprocal lattice space of the image sensor is also shown for various combinations of colors and parallax directions. The frequency resolution region is represented by a k-space of a wave number of $k=2\pi f$, where f denotes the frequency. The frequency resolution region is represented by a first Brillouin zone representative of a Wigner-Seitz cell of the reciprocal lattice space. The following operations can produce such effects that an intermediate image without parallax (reference image) has an outwardly expanded frequency resolution region, which is closer to the Nyquist frequency region.

Flow Chart

1) A color-and-parallax multiplexed mosaic image data is input.

2) The global gain balance of the color-and-parallax multiplexed mosaic image is corrected.

3) Provisional parallax images are produced.

4) A no-parallax color mosaic image is produced by performing local illuminance distribution correction between the left and right pixels (local gain balance correction).

5) A no-parallax reference image is produced.

6) Actual parallax images are produced.

7) The actual parallax images are converted into an output color space.

Detailed Description

1) A color-and-parallax multiplexed mosaic image data is input.

A color-and-parallax multiplexed single-plate mosaic image shown in FIGS. 1A and 1B: $M(x,y)$ The gray level is a linear gray level output by A/D conversion. In other words, the pixel value is in proportion to the amount of light. This may be referred to raw data.

2) The global gain balance of the color-and-parallax multiplexed mosaic image is corrected.

As the aperture is stopped down, the difference between the illuminance of the left parallax pixel and the illuminance of the right parallax pixel actually increases not only the relative difference in distribution between the left and right parallax pixels but also the difference in average signal level between the entire left and right images. Therefore, gain correction is performed to achieve uniform brightness as a whole at this stage. To do so, the captured subject images are used without a change to calculate the average value $\overline{Lt}$, for the entire image, of the pixel values of the left parallax pixels and the average value $\overline{Rt}$, for the entire image, of the pixel values of the right parallax pixels. This is based on an assumption that even though there is parallax, the left and right parallax pixels capture subject image of similar regions and that the subject images themselves can be used to produce signal information necessary for level match without requiring image-capturing of a uniform surface. As the reference point between the left and right images, the average value is calculated, and the gain correction is performed in such a manner that the signal levels match the average value. Here, the reference point is determined in two different ways: arithmetic and geometric averages.

For the purposes of description, in the mosaic image $M(x,y)$, the signal plane of the G component left parallax pixels is represented as $Lt_{mosaic}(x,y)$ and the signal plane of the G component right parallax pixels is represented as $Rt_{mosaic}(x,y)$.

a) Arithmetic Average

The average value:

$$\overline{m}=\frac{\overline{Lt}+\overline{Rt}}{2}$$

The gain value for the left parallax pixels:

$$\overline{g}_{Lt}=\frac{\overline{m}}{\overline{Lt}}=\frac{\overline{Lt}+\overline{Rt}}{2\overline{Lt}}$$

The gain value for the right parallax pixels:

$$\overline{g}_{Rt}=\frac{\overline{m}}{\overline{Rt}}=\frac{\overline{Lt}+\overline{Rt}}{2\overline{Rt}}$$

The global gain correction for the left parallax pixels:

$$Lt'_{mosaic}(x,y)=Lt_{mosaic}(x,y)\cdot\overline{g}_{Lt}=Lt_{mosaic}(x,y)\cdot\frac{\overline{Lt}+\overline{Rt}}{2\overline{L}}$$

The global gain correction for the right parallax pixels:

$$Rt'_{mosaic}(x,y)=Rt_{mosaic}(x,y)\cdot\overline{g}_{Rt}=Rt_{mosaic}(x,y)\cdot\frac{\overline{Lt}+\overline{Rt}}{2\overline{Rt}}$$

b) Geometric Average

The average value:

$$\overline{m}=\sqrt{\overline{Lt}\cdot\overline{Rt}}$$

The gain value for the left parallax pixels:

$$\overline{g}_{Lt}=\frac{\overline{m}}{\overline{Lt}}=\frac{\sqrt{\overline{Lt}\cdot\overline{Rt}}}{\overline{Lt}}=\sqrt{\frac{\overline{Rt}}{\overline{Lt}}}$$

The gain value for the right parallax pixels:

$$\overline{g}_{Rt}=\frac{\overline{m}}{\overline{Rt}}=\frac{\sqrt{\overline{Lt}\cdot\overline{Rt}}}{\overline{Lt}}=\sqrt{\frac{\overline{Lt}}{\overline{Rt}}}$$

The global gain correction for the left parallax pixels:

$$Lt'_{mosaic}(x,y)=Lt_{mosaic}(x,y)\cdot\overline{g}_{Lt}=Lt_{mosaic}(x,y)\cdot\sqrt{\frac{\overline{Rt}}{\overline{Lt}}}$$

The global gain correction for the right parallax pixels:

$$Rt'_{mosaic}(x,y)=Rt_{mosaic}(x,y)\cdot\overline{g}_{Rt}=Rt_{mosaic}(x,y)\cdot\sqrt{\frac{\overline{Lt}}{\overline{Rt}}}$$

In the present embodiment, the arithmetic average approach is employed. In this manner, a mosaic image M'(x,y) is produced by correcting the left parallax pixels with a single gain coefficient and correcting the right parallax pixels with a single gain coefficient and output. Note that this step can be simultaneously realized when the local gain correction of the step 4 is performed and may be omitted if appropriate.

3) Provisional parallax images are produced.

Left and right parallax images with a low spatial-frequency resolution are produced.

Simple averaging interpolation is performed on the G color plane formed by a collection of the left parallax pixels. The pixel values in the adjacent pixels are used to perform linear interpolation according to the distance ratio. Likewise, simple averaging interpolation is performed on the G color plane formed by a collection of the right parallax pixels. Namely, Lt(x,y) and Rt(x,y) are respectively derived from $Lt_{mosaic}$(x,y) and $Rt_{mosaic}$(x,y).

The provisional left parallax image: Lt(x,y)

The provisional right parallax image: Rt(x,y)

When the provisional left and right parallax images Lt(x,y) and Rt(x,y) are produced, high definition may be achieved by incorporating direction determination within the signal planes.

4) A no-parallax color mosaic image is produced by performing illuminance distribution correction between the left and right pixels (local gain balance correction).

Subsequently, in a similar manner to the global gain correction performed in the step 1, local gain correction is performed on the pixel-by-pixel basis so that uniform illuminance is achieved between the left parallax pixels in a plane and the right parallax pixels in a plane. In this manner, a new Bayer plane with uniform gain is produced. This is equivalent to replacing the pixel values with an average value and thus produces a parallax-eliminated Bayer plane. This plane is referred to as $M_N$(x,y).

In this case, there are also two different ways of determining the target value, which may be referred to as the reference point, to which each pixel value is adapted. To be specific, an arithmetic or geometric average is calculated.

a) Arithmetic Average

The average value for each pixel:

$$m(x,y)=\frac{Lt(x,y)+Rt(x,y)}{2}$$

The gain value for each left parallax pixel:

$$g_{Lt}(x,y)=\frac{m(x,y)}{Lt(x,y)}=\frac{Lt(x,y)+Rt(x,y)}{2Lt(x,y)}$$

The gain value for each right parallax pixel:

$$g_{Rt}(x,y)=\frac{m(x,y)}{Lt(x,y)}=\frac{Lt(x,y)+Rt(x,y)}{2Rt(x,y)}$$

The local gain correction for each left parallax pixel:

$$Lt(x,y)\cdot g_{Lt}(x,y)=m(x,y)$$

The local gain correction for each right parallax pixel:

$$Rt(x,y)\cdot g_{Rt}(x,y)=m(x,y)$$

b) Geometric Average

The average value for each pixel:

$$m(x,y)=\sqrt{Lt(x,y)\cdot Rt(x,y)}$$

The gain value for each left parallax pixel:

$$g_{Lt}(x, y) = \frac{m(x, y)}{Lt(x, y)} = \sqrt{\frac{Rt(x, y)}{Lt(x, y)}}$$

The gain value for each right parallax pixel:

$$g_{Rt}(x, y) = \frac{m(x, y)}{Rt(x, y)} = \sqrt{\frac{Lt(x, y)}{Rt(x, y)}}$$

The local gain correction for each left parallax pixel:

$$Lt(x,y)\cdot g_{Lt}(x,y)=m(x,y)$$

The local gain correction for each right parallax pixel:

$$Rt(x,y)\cdot g_{Rt}(x,y)=m(x,y)$$

The local gain correction is performed on each pixel in such a manner that the average value for each pixel that is initially calculated may be simply substituted. In this sense, the local gain correction can be referred to as modulation to eliminate the parallax. In the present embodiment, the arithmetic average approach is employed. In the above-described manner, the no-parallax Bayer plane image $M_N(x, y)$ is output by converting the Bayer plane data in such a manner that the average value between the left and right viewpoint images is used as the no-parallax pixel value of the new G pixel position.

5) A no-parallax reference image is produced.

In the above-described manner, the G component illuminance is balanced, and the parallax-eliminated Bayer plane $M_N(x,y)$ can be used to produce, as an intermediate image, a no-parallax color image that has a resolution as high as the Nyquist frequency of the number of pixels of the sensors with the use of a conventional color interpolation technique. For example, the most advanced known Bayer interpolation technique is the interpolation algorithm disclosed in US Patent Application Publication No. 2010/0201853 invented by the same inventor as the present application. This technique incorporates the best and highly advanced demosaicking technique that comprehensively apply the technique of enhancing the direction determination resolution to resolve the Nyquist frequency in the horizontal and vertical directions disclosed in U.S. Pat. No. 6,836,572, the technique of increasing the resolution in the diagonal direction for interpolation value calculation disclosed in U.S. Pat. No. 7,236,628, the adaptive false color preventive technique based on color determination and the technique of enhancing the resolution of the direction determination disclosed in U.S. Pat. No. 7,565,007, the adaptive false color preventive technique based on the color gradient determination disclosed in U.S. Pat. No. 7,391,903 and the technique of enhancing the direction determination resolution. These patents are invented by the same inventor as the present application.

The following does not describe all of the above techniques but focuses only on the technique of enhancing the horizontal and vertical Nyquist resolutions and the diagonal resolution of the G component, which determines the luminance, and the technique of using the color difference interpolation to enhance the resolutions of the R and B components.

5-1) Transformation to the gamma space based on gray level conversion

To perform the high-resolution Bayer interpolation described above, gray level conversion is further performed to realize a uniform noise space, and interpolation values are predicted in the gamma space (image processing space) for interpolation. This technique is introduced by the invention of U.S. Pat. No. 7,957,588 invented by the same inventor as the present application.

The input signal is denoted by x, the output signal is denoted by y, and the gray levels of the input and output signals are both defined within the range of [0,1]. The gray level curve (gamma curve) is defined so that the input and output characteristics go through (x,y)=(0,0) and (1,1). When the maximum value of the actually input gray level X is denoted by Xmax and the maximum value of the output gray level Y is denoted by Ymax, x=X/Xmax and y=Y/Ymax. The gray level conversion is performed as represented by the following expression.

$$Y = Y_{max} \cdot f\left(\frac{X}{X_{max}}\right)$$

Here, the gray level characteristics of y=f(x) are represented as follows.

$$y = \frac{\sqrt{x+\varepsilon} - \sqrt{\varepsilon}}{\sqrt{1+\varepsilon} - \sqrt{\varepsilon}}$$

The positive offset value ε is set higher as the image-capturing condition becomes more light sensitive, in other words, as the dark current noise component increases.

5-2) Color interpolation

Only the simple color interpolation described in U.S. Pat. No. 7,957,588 (WO 2006/006373) invented by the same inventor as the present application is herein described again. However, (x,y) is replaced by [i,j]. In addition, the G component on the $M_N$ plane after the gray level conversion is denoted by G and the R and B components are denoted by Z.

In the step 4, the CPU performs the interpolation as follows. Here, the pixels having color information corresponding to the R component are referred to as R pixels, the pixels having the color information corresponding to the B component are referred to as B pixels, and the pixels having the color information corresponding to the G component are referred to as G pixels. The signal value of the R component corresponding to the pixel indicated by the pixel position [i,j] in the space for the interpolation is denoted by R[i,j], the signal value of the G component is denoted by G[i,j], and the signal value of the B component is denoted by B[i,j].

<Direction Determination>

The CPU calculates, using the following expressions (3) and (4), the degree of similarity in the vertical direction CvN[i,j] and the degree of similarity in the horizontal direction ChN[i,j] for the pixel whose position is indicated by [i,j] and which is not the G pixel (the R or B pixel).

$$Cv[i,j]=\{|G[i,j-1]-G[i,j+1]|+(|G[i,j-1]-Z[i,j]|+|G[i,j+1]-Z[i,j]|)/2\}/2 \quad (3)$$

$$Ch[i,j]=\{|G[i-1,j]-G[i+1,j]|+(|G[i-1,j]-Z[i,j]|+|G[i+1,j]-Z[i,j]|)/2\}/2 \quad (4)$$

Here, Z[i,j] represents the signal value of the R or B component for the pixel position [i,j]. The first term represents the same-color degree of similarity representing the degree of similarity between the pixels of the same color with one pixel placed therebetween and the second term represents the different-color degree of similarity representing the degree of similarity between the pixels of different colors that are adjacent to each other. The different-color degree of similarity corresponds to the resolving power of the Nyquist frequency in the vertical and horizontal directions.

The absolute value of the first term in the expressions (3) and (4) above is used to roughly detect the direction by comparing the pixels of the G component. The absolute values of the second and third terms of the expressions (3) and (4) above are used to finely detect the similarity that cannot be detected by using the first term. The CPU calculates, for each coordinate point, the degrees of similarity in the vertical and horizontal directions using the expressions (3) and (4), and determines the direction of similarity using the following expression (5) based on the degrees of similarity in the vertical and horizontal directions for the target coordinate point [i,j].

$$\left.\begin{array}{ll} \text{if } |Cv[i,j]-Ch[i,j]| \le Th & HV[i,j]=0 \\ \text{else if } Cv[i,j] < Ch[i,j] & HV[i,j]=1 \\ \text{else} & HV[i,j]=-1 \end{array}\right\} \quad (5)$$

In the expression (5), Th indicates the threshold value used to avoid erroneous decision caused by the noise contained in the signal value and changes according to the ISO speed. Furthermore, HV[i,j] indicates the direction of the similarity for the pixel position [i,j]. Here, HV[i,j]=0 means similarity in the vertical and horizontal directions, HV[i,j]=1 means similarity in the vertical direction, and HV[i,j]=−1 means similarity in the horizontal direction.

<G Interpolation>

The CPU performs interpolation for the G component based on the determined direction of similarity and using the unevenness information of the R or B component. The externally dividing point cannot be predicted merely by the interpolation of the internally dividing point based on the surrounding G components. Whether the externally dividing point should be interpolated can be determined by examining the information of the different color component in the to-be-interpolated position and the information of the same color component in near positions to determine whether the image structure is convex upwardly or downwardly. In other words, high frequency component information obtained by sampling of the different color component is superimposed on the to-be-interpolated color component. The G color interpolation is calculated for the central R pixel whose position is represented as [i,j] in WO2006/006373 in FIG. 4 by using the following expressions (6) and (9) when similarity is found in the vertical direction and using the following expressions (7) and (10) when similarity is found in the horizontal direction. The B pixel position for which the G color interpolation is performed is shown in WO2006/006373 in FIG. 5.

$$HV[i,j]=1 \quad G[i,j]=Gv[i,j] \quad (6)$$

$$HV[i,j]=-1 \quad G[i,j]=Gh[i,j] \quad (7)$$

$$HV[i,j]=0 \quad G[i,j]=(Gv[i,j]+Gh[i,j])/2 \quad (8)$$

$$Gv[i,j]=(G[i,j-1]+G[i,j+1])/2+(2\times Z[i,j]-Z[i,j-2]-Z[i,j+2])/4 \quad (9)$$

$$Gh[i,j]=(G[i-1,j]+G[i+1,j])/2+(2\times Z[i,j]-Z[i-2,j]-Z[i+2,j])/4 \quad (10)$$

Note that Z[i,j] is the signal value of the R or B component at the pixel position [i,j]. Adding the average value of the signal values of the to-be- interpolated color component, which is represented by the first term, and the second derivative of the signal values of the different color component, which is represented by the second term or the correction term, together can effectively enhance the spatial resolution in the diagonal direction.

The first term in the expression (9) represents the average value calculated from the signal values G[i,j−1] and G[i,j+1] of the G component pixels that are adjacent to the pixel position [i,j] in the vertical direction. The second term in the expression (9) represents the amount of change calculated from the signal values R[i,j], R[i,j−2] and R[i,j+2] of the R component pixels that are adjacent in the vertical direction. Adding the average value of the signal values of the G component and the amount of the change in the signal values of the R component together can produce the interpolation value of the G component G[i,j]. Such an interpolation technique can predict signal values for other points than the internally dividing point of the G component and is thus referred to as extrapolation for convenience.

The expression (10) is used to perform extrapolation in the horizontal direction based on the signal values of the pixels that are adjacent to the pixel position [i,j] in the horizontal direction, as in the vertical extrapolation described above.

The CPU uses the expressions (9) and (10) to calculate the G color interpolation values when the similarity is found in both the vertical and horizontal directions and calculates the average value of the two calculated G color interpolation values as the G color interpolation value.

<R Interpolation>

Figure 6:
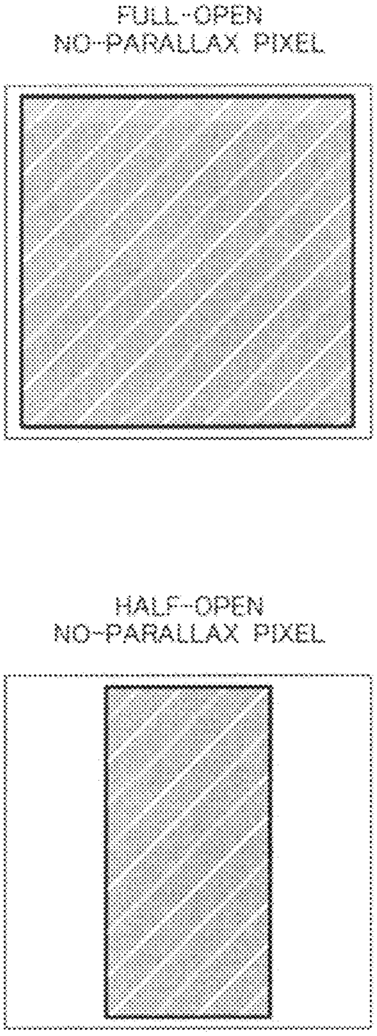
FIG. 6 illustrates how to change a no-parallax pixel from the full-open state to the half-open state.

The R color interpolation is performed using the following expressions (11) to (13) for the pixel positions [i+1,j], [i,j+1], [i+1,j+1] other than the R pixel position [i,j] shown in WO2006/006373 in, for example, FIG. 6. Here, the unevenness information of the G component signal values (see WO2006/006373 FIG. 7) corresponding to all the pixel positions, obtained through the G interpolation described above, is utilized.

$$R[i+1,j]=(R[i,j]+R[i+2,j])/2+\left(\begin{array}{c} 2\times G[i+1,j]- \\ G[i,j]-G[i+2,j] \end{array}\right)\Big/2 \quad (11)$$

$$R[i,j+1]=(R[i,j]+R[i,j+2])/2+\left(\begin{array}{c} 2\times G[i,j]- \\ G[i,j]-G[i,j+2] \end{array}\right)\Big/2 \quad (12)$$

-continued $$R[i+1, j+1] = \left( \begin{array}{c} R[i, j] + R[i+2, j] + \\ R[i, j+2] + R[i+2, j+2] \end{array} \right) \Big/ 4 + \left( \begin{array}{c} 2 \times G[i+1, j+1] - \\ G[i, j] - G[i+2, j] - \\ G[i, j+2] - G[i+2, j+2] \end{array} \right) \Big/ 4 \quad (13)$$

The first term in the expressions (11) to (13) above indicates the average value calculated from the R component signal values at the pixels adjacent to the coordinate point of the target pixel subject to the R component interpolation. The second term in the expressions (11) to (13) above indicates the amount of change calculated from the G component signal values at the coordinate point of the R component interpolation target pixel and at the pixels adjacent to the coordinate point. In other words, as in the extrapolation performed for the G interpolation, the R component interpolation value is obtained by adding the amount of change in the G component signal values to the average value of the R component signal values. This is equivalent to generating the color difference Cr=R−G at the R position and performing averaging interpolation within the color difference plane.

<B Interpolation>

B component interpolation is performed in a similar manner to the R component interpolation. For instance, the B color interpolation values are calculated using the following expressions (14) to (16) below respectively for, for instance, the pixel positions [i+1, j], [i, j+1] and [i+1, j+1] other than the B pixel position [i,j] in WO2006/006373 in FIG. 8. Here, the unevenness information of the G component signal values (see WO2006/006373 in FIG. 9) corresponding to all the pixel positions, obtained through the G interpolation described above, is utilized.

$$B[i+1, j] = (B[i, j] + B[i+2, j])/2 + \left( \begin{array}{c} 2 \times G[i+1, j] - \\ G[i, j] - G[i+2, j] \end{array} \right) \Big/ 2 \quad (11)$$

$$B[i, j+1] = (B[i, j] + B[i, j+2])/2 + \left( \begin{array}{c} 2 \times G[i, j] - \\ G[i, j] - G[i, j+2] \end{array} \right) \Big/ 2 \quad (12)$$

$$B[i+1, j+1] = \left( \begin{array}{c} B[i, j] + B[i+2, j] + \\ B[i, j+2] + R[i+2, j+2] \end{array} \right) \Big/ 4 + \left( \begin{array}{c} 2 \times G[i+1, j+1] - \\ G[i, j] - G[i+2, j] - \\ G[i, j+2] - G[i+2, j+2] \end{array} \right) \Big/ 4 \quad (13)$$

As indicated by the expressions (14) to (16) above, the B component interpolation value is obtained by adding the amount of change in the G component signal values to the average value of the B component signal values. This is equivalent to generating the color difference Cb=B−G at the B position and performing averaging interpolation within this color difference plane. Since the sample frequencies of the R and B components are lower than that of the G component, the high frequency component in the G component signal values is reflected in the R and B component interpolation values using the color differences R−G and B−G. Accordingly, such interpolation for the chromatic components is hereafter referred to as color difference interpolation for convenience.

5-3) Transformation to the original linear gray level space using inverse gray level conversion The inverse gray level conversion, which is inverse to the gray level conversion performed in the step 5-1, is performed on the Bayer interpolated RGB color planes to restore linear gray level RGB data.

$$X = X_{max} f^{-1}\left(\frac{Y}{Y_{max}}\right)$$

The resulting no-parallax RGB color images are represented by $R_N(x,y)$, $G_N(x,y)$, $B_N(x,y)$. These are RGB data represented using linear gray levels.

6) Actual parallax images are produced.

The provisional left parallax image Lt(x,y) having a low resolution produced in the step 3 and the no-parallax color images $R_N(x,y)$, $G_N(x,y)$, $B_N(x,y)$ having a high resolution produced as the intermediate images in the step 5 are used to produce left parallax color images $R_{Lt}(x,y)$, $G_{Lt}(x,y)$, $B_{Lt}(x,y)$ having a high resolution that is to be actually output. Likewise, the provisional right parallax image Rt(x, y) having a low resolution produced in the step 3 and the no-parallax color images $R_N(x,y)$, $G_N(x,y)$, $B_N(x,y)$ having a high resolution produced as the intermediate images in the step 5 are used to produce right parallax color images $R_{Rt}(x,y)$, $G_{Rt}(x,y)$, $B_{Rt}(x,y)$ having a high resolution that is to be actually output. This realizes position shift by superimposing the parallax components of the provisional parallax images and can be referred to as parallax modulation.

The parallax modulation is performed in two different ways: using arithmetic and geometric averages as a reference point. Both methods can successfully produce parallax modulation effects. However, the parallax modulation using the arithmetic average as the reference point may be employed when the no-parallax pixels of the image sensor have full-open masks, and the parallax modulation using the geometric average as the reference point may be employed when the no-parallax pixels have half-open masks like the parallax pixels. Accordingly, the present embodiment uses the parallax modulation using the arithmetic average as the reference point.

a) Parallax Modulation Using the Arithmetic Average as the Reference Point

The left parallax modulation $$R_{Lt}(x, y) = R_N(x, y)\frac{2Lt(x, y)}{Lt(x, y) + Rt(x, y)}$$

$$G_{Lt}(x, y) = G_N(x, y)\frac{2Lt(x, y)}{Lt(x, y) + Rt(x, y)}$$

$$B_{Lt}(x, y) = B_N(x, y)\frac{2Lt(x, y)}{Lt(x, y) + Rt(x, y)}$$

The right Parallax modulation $$R_{Rt}(x, y) = R_N(x, y)\frac{2Rt(x, y)}{Lt(x, y) + Rt(x, y)}$$

$$G_{Rt}(x, y) = G_N(x, y)\frac{2Rt(x, y)}{Lt(x, y) + Rt(x, y)}$$

$$B_{Rt}(x, y) = B_N(x, y)\frac{2Rt(x, y)}{Lt(x, y) + Rt(x, y)}$$

b) Parallax Modulation Using the Geometric Average as the Reference Point

The left parallax modulation $$R_{Lt}(x, y) = R_N(x, y)\frac{Lt(x, y)}{\sqrt{Lt(x, y)\cdot Rt(x, y)}} = R_N(x, y)\sqrt{\frac{Lt(x, y)}{Rt(x, y)}}$$

$$G_{Lt}(x, y) = G_N(x, y)\frac{Lt(x, y)}{\sqrt{Lt(x, y)\cdot Rt(x, y)}} = G_N(x, y)\sqrt{\frac{Lt(x, y)}{Rt(x, y)}}$$

$$B_{Lt}(x, y) = B_N(x, y)\frac{Lt(x, y)}{\sqrt{Lt(x, y)\cdot Rt(x, y)}} = B_N(x, y)\sqrt{\frac{Lt(x, y)}{Rt(x, y)}}$$

The right Parallax modulation $$R_{Rt}(x, y) = R_N(x, y)\frac{Rt(x, y)}{\sqrt{Lt(x, y)\cdot Rt(x, y)}} = R_N(x, y)\sqrt{\frac{Rt(x, y)}{Lt(x, y)}}$$

$$G_{Rt}(x, y) = G_N(x, y)\frac{Rt(x, y)}{\sqrt{Lt(x, y)\cdot Rt(x, y)}} = G_N(x, y)\sqrt{\frac{Rt(x, y)}{Lt(x, y)}}$$

$$B_{Rt}(x, y) = B_N(x, y)\frac{Rt(x, y)}{\sqrt{Lt(x, y)\cdot Rt(x, y)}} = B_N(x, y)\sqrt{\frac{Rt(x, y)}{Lt(x, y)}}$$

As seen from the above, the parallax modulation expressions defined in the step 6 and the parallax elimination expressions (the local gain balance correction) for the variance in illuminance correction between the left and right pixels defined in the step 4 achieve modulation based on multiplication of the terms that are inversely related to each other. Therefore, the step 6 adds parallax and the step 4 eliminates parallax.

7) The actual parallax images are converted into an output color space.

The resulting high-resolution and no-parallax intermediate color images $R_N(x,y)$, $G_N(x,y)$, $B_N(x,y)$, high-resolution and left-parallax color images $R_{Lt}(x,y)$, $G_{Lt}(x,y)$, $B_{Lt}(x,y)$ and high-resolution and right-parallax color images $R_{Rt}(x, y)$, $G_{Rt}(x,y)$, $B_{Rt}(x,y)$ each undergo color matrix conversion and also undergo gamma conversion from the RGB color space of the camera having the sensor spectroscopic characteristics to the standard sRGB color space. In this manner, an image of the output color space is produced and output.

Effect 1

While the characteristics of the monocular pupil-division method are taken into consideration, the variance in illuminance distribution between the left and right pixels and the difference in subject position caused by the presence of parallax are simultaneously eliminated. Namely, the first embodiment takes advantage of such a nature of a subject image that parallax only exists in blur to prevent the spatial resolution from dropping in every way possible, and can produce a no-parallax intermediate image based on the averaging to simultaneously solve the two problems of the parallax and the variance in illuminance.

Effect 2

The advantages of the conventional demosaicking technique can be used as before, and high-resolution images can be produced.

Note 1

See FIG. 6, which shows how to change the state of the no-parallax pixels from the full-open state to the half-open state.

In the first to third embodiments, the no-parallax pixels have a blur width corresponding to the full-open area that is equal to the sum of the open areas of the left and right parallax pixels. Therefore, an arithmetic average is calculated between the left and right parallax pixel values for the illuminance distribution correction designed to generate no-parallax pixel values for the parallax pixels, in order to match the blur width of the parallax images to the blur width of the subject images captured through the no-parallax pixels. Furthermore, when the parallax modulation is finally applied, considering that the no-parallax color images form subject images having a blur width corresponding to the full-open state, the image having a blur width corresponding to the full-open state obtained by calculating the arithmetic average of the left and right viewpoint images is taken as a reference point for the denominator of the parallax modulation, which keeps the ratio constant, and the parallax modulation is performed so that the resulting left and right color images again have a blur width corresponding to the half-open state.

On the other hand, in the no-parallax pixels relating to the first to third embodiments, the aperture masks having the same shape and the same opening area as the left and right parallax pixels may be positioned in the center of the no-parallax pixels. In this case, the illuminance distribution correction performed to produce the no-parallax pixel values for the parallax pixels uses the geometric average as the average value between the left and right parallax pixel values to match the blur width of the parallax images to the blur width of the captured subject images of the no-parallax pixels. Furthermore, when the parallax modulation is finally applied, considering that the no-parallax color images form subject images having a blur width corresponding to the half-open state, the image having a blur width corresponding to the half-open state obtained by calculating the geometric average of the left and right viewpoint images is taken as a reference point for the denominator of the parallax modulation, which keeps the ratio constant, and the parallax modulation is performed so that the resulting left and right color images again have a blur width corresponding to the half-open state.

In other words, when the no-parallax pixels have a full-open mask area, the arithmetic average may be used as the reference point both in the parallax elimination for the variance in illuminance correction and in the final parallax modulation. On the other hand, when the no-parallax pixels have a half-open mask area, the geometric average may be used as the reference point both in the parallax elimination for the variance in illuminance correction and in the final parallax modulation.

This concept applies to all of the following embodiments.

<Second Embodiment>

Bayer Arrangement Having Fewer Parallax Pixels Assigned to R, G and B Pixels

Figure 4A:
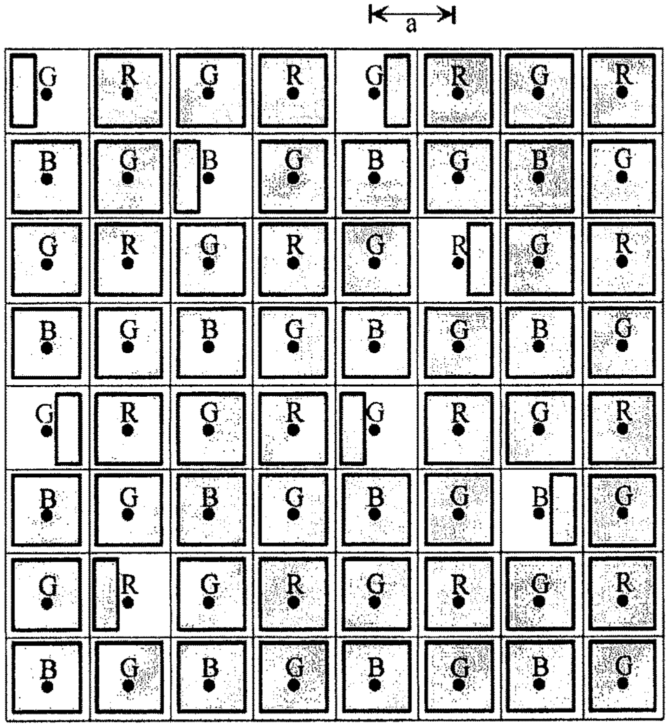
FIGS. 4A and 4B respectively illustrate a pixel arrangement and the resolution of this arrangement in the frequency space.

The following describes an example using an image sensor where primitive lattices having the arrangement shown in FIG. 4A are periodically arranged. The frequency resolution region of the reciprocal lattice space of the image sensor is also shown for various combinations of colors and parallax directions. This image sensor takes advantage of such a nature of a monocular pupil-division type that parallax only exists in blur subject regions, and is thus structured such that the density of the parallax pixels is reduced and the number of no-parallax pixels is increased as much as possible. The no-parallax and parallax pixels are both basically arranged in accordance with the Bayer arrangement, and the left and right parallax pixels are provided with color filters with the ratio of R:G:B=1:2:1. In other words, the second embodiment puts more emphasis on the resolving power of the no-parallax intermediate image obtained by the original signal than the first embodiment, and intends to superimpose the high frequency component of the intermediate image onto the left and right parallax pixels by means of the parallax modulation in order to obtain a high-resolution stereoscopic image. Therefore, the second embodiment provides for the color and parallax arrangement that enables high-resolution 2D and 3D images to be produced even in the non-focused region.

Flow Chart: same as the flow chart of the first embodiment

Detailed Description

1) A color-and-parallax multiplexed mosaic image data is input.

Figure 4B:
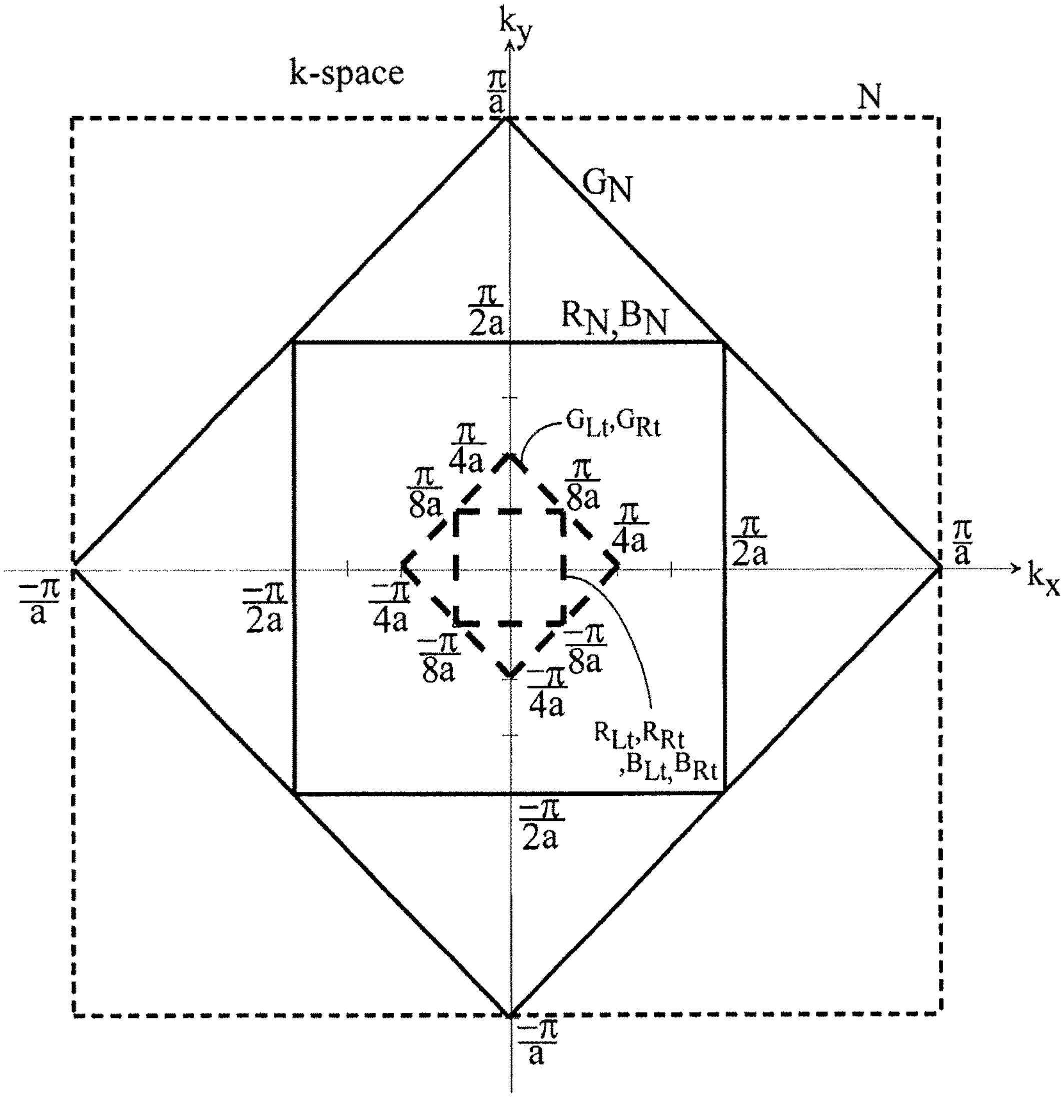

A color-and-parallax multiplexed single-plate mosaic image shown in FIGS. 4A and 4B:M(x,y)

The gray level is a linear gray level output by A/D conversion.

2) The global gain balance of the color-and-parallax multiplexed mosaic image is corrected.

The captured subject images are used without a change to calculate the average value $\bar{N}$, for the entire image, the pixel values of the no-parallax pixels, the average value $\bar{Lt}$, for the entire image, the pixel values of the left parallax pixels and the average value $\bar{Rt}$, for the entire image, the pixel values of the right parallax pixels. The second embodiment is different from the first embodiment in that there are three signal levels. To start with, as the reference point between the left and right pixels, the average value is calculated, and the gain correction is performed in such a manner that the signal levels match the average value. Here, the reference point is determined in two different ways: arithmetic and geometric averages. After this, a geometric average is determined between the signal level obtained by the averaging between the left and right pixels and the signal level of the no-parallax pixels, and the gain correction is performed in such a manner that the signal levels match the geometric average. This process is performed for each of the R, G and B color components.

The average values corresponding to the R, G and B color components are represented as follows.

$\bar{R}_N$, $\bar{R}_{Lt}$, $\bar{R}_{Rt}$, $\bar{G}_N$, $\bar{G}_{Lt}$, $\bar{G}_{Rt}$ $\bar{B}_N$, $\bar{B}_{Lt}$, $\bar{B}_{Rt}$ For convenience, in the mosaic image M(x,y), the signal plane of the R component no-parallax pixels is represented as $R_{N\_mosaic}(x,y)$, the signal plane of the R component left parallax pixels is represented as $R_{Lt\_mosaic}(x,y)$, the signal plane of the R component right parallax pixels is represented as $R_{Rt\_mosaic}(x,y)$, the signal plane of the G component no-parallax pixels is represented as $G_{N\_mosaic}(x,y)$, the signal plane of the G component left parallax pixels is represented as $G_{Lt\_mosaic}(x,y)$, the signal plane of the G component right parallax pixels is represented as $G_{Rt\_mosaic}(x,y)$, the signal plane of the B component no-parallax pixels is represented as $B_{N\_mosaic}(x,y)$, the signal plane of the B component left parallax pixels is represented as $B_{Lt\_mosaic}(x,y)$ and the signal plane of the B component right parallax pixels is represented as $B_{Rt\_mosaic}(x,y)$.

a) When an Arithmetic Average is Calculated Between the Left and Right Parallax Pixels The average value:

$$\bar{m}_R = \sqrt{\bar{R}_N \cdot \frac{\bar{R}_{Lt} + \bar{R}_{Rt}}{2}}$$

$$\bar{m}_G = \sqrt{\bar{G}_N \cdot \frac{\bar{G}_{Lt} + \bar{G}_{Rt}}{2}}$$

$$\bar{m}_B = \sqrt{\bar{B}_N \cdot \frac{\bar{B}_{Lt} + \bar{B}_{Rt}}{2}}$$

The gain value for the no-parallax pixels:

$$\bar{g}_{R_N} = \frac{\bar{m}_R}{\bar{R}_N} = \sqrt{\frac{\bar{R}_{Lt} + \bar{R}_{Rt}}{2\bar{R}_N}}$$

$$\bar{g}_{G_N} = \frac{\bar{m}_G}{\bar{G}_N} = \sqrt{\frac{\bar{G}_{Lt} + \bar{G}_{Rt}}{2\bar{G}_N}}$$

$$\bar{g}_{B_N} = \frac{\bar{m}_B}{\bar{B}_N} = \sqrt{\frac{\bar{B}_{Lt} + \bar{B}_{Rt}}{2\bar{B}_N}}$$

The gain value for the left parallax pixels:

$$\bar{g}_{R_{Lt}} = \frac{\bar{m}_R}{\bar{R}_{Lt}} = \sqrt{\frac{\bar{R}_N}{\bar{R}_{Lt}} \cdot \frac{\bar{R}_{Lt} + \bar{R}_{Rt}}{2\bar{R}_{Lt}}}$$

$$\bar{g}_{G_{Lt}} = \frac{\bar{m}_G}{\bar{G}_{Lt}} = \sqrt{\frac{\bar{G}_N}{\bar{G}_{Lt}} \cdot \frac{\bar{G}_{Lt} + \bar{G}_{Rt}}{2\bar{G}_{Lt}}}$$

$$\bar{g}_{B_{Lt}} = \frac{\bar{m}_B}{\bar{B}_{Lt}} = \sqrt{\frac{\bar{B}_N}{\bar{B}_{Lt}} \cdot \frac{\bar{B}_{Lt} + \bar{B}_{Rt}}{2\bar{B}_{Lt}}}$$

The gain value for the right parallax pixels:

$$\bar{g}_{R_{Rt}} = \frac{\bar{m}_R}{\bar{R}_{Rt}} = \sqrt{\frac{\bar{R}_N}{\bar{R}_{Rt}} \cdot \frac{\bar{R}_{Lt} + \bar{R}_{Rt}}{2\bar{R}_{Rt}}}$$

$$\bar{g}_{G_{Rt}} = \frac{\bar{m}_G}{\bar{G}_{Rt}} = \sqrt{\frac{\bar{G}_N}{\bar{G}_{Rt}} \cdot \frac{\bar{G}_{Lt} + \bar{G}_{Rt}}{2\bar{G}_{Rt}}}$$

$$\bar{g}_{B_{Rt}} = \frac{\bar{m}_B}{\bar{B}_{Rt}} = \sqrt{\frac{\bar{B}_N}{\bar{B}_{Rt}} \cdot \frac{\bar{B}_{Lt} + \bar{B}_{Rt}}{2\bar{B}_{Rt}}}$$

The global gain correction for the no-parallax pixels:

$$R'_{N\_mosaic}(x, y) = R_{N\_mosaic}(x, y) \cdot \bar{g}_{R_N} = R_{N\_mosaic}(x, y) \cdot \sqrt{\frac{\bar{R}_{Lt} + \bar{R}_{Rt}}{2\bar{R}_N}}$$

$$G'_{N\_mosaic}(x, y) = G_{N\_mosaic}(x, y) \cdot \bar{g}_{G_N} = G_{N\_mosaic}(x, y) \cdot \sqrt{\frac{\bar{G}_{Lt} + \bar{G}_{Rt}}{2\bar{G}_N}}$$

$$B'_{N\_mosaic}(x, y) = B_{N\_mosaic}(x, y) \cdot \bar{g}_{B_N} = B_{N\_mosaic}(x, y) \cdot \sqrt{\frac{\bar{B}_{Lt} + \bar{B}_{Rt}}{2\bar{B}_N}}$$

The global gain correction for the left parallax pixels:

$$R'_{Lt\_mosaic}(x,y)=R_{Lt\_mosaic}(x,y)\cdot\bar{g}_{R_{Lt}}=R_{Lt\_mosaic}(x,y)\cdot\sqrt{\frac{\bar{R}_N}{\bar{R}_{Lt}}\cdot\frac{\bar{R}_{Lt}+\bar{R}_{Rt}}{2\bar{R}_{Lt}}}$$

$$G'_{Lt\_mosaic}(x,y)=G_{Lt\_mosaic}(x,y)\cdot\bar{g}_{G_{Lt}}=G_{Lt\_mosaic}(x,y)\cdot\sqrt{\frac{\bar{G}_N}{\bar{G}_{Lt}}\cdot\frac{\bar{G}_{Lt}+\bar{G}_{Rt}}{2\bar{G}_{Lt}}}$$

$$B'_{Lt\_mosaic}(x,y)=B_{Lt\_mosaic}(x,y)\cdot\bar{g}_{B_{Lt}}=B_{Lt\_mosaic}(x,y)\cdot\sqrt{\frac{\bar{B}_N}{\bar{B}_{Lt}}\cdot\frac{\bar{B}_{Lt}+\bar{B}_{Rt}}{2\bar{B}_{Lt}}}$$

The global gain correction for the right parallax pixels:

$$R'_{Rt\_mosaic}(x,y)=R_{Rt\_mosaic}(x,y)\cdot\bar{g}_{R_{Rt}}=R_{Rt\_mosaic}(x,y)\cdot\sqrt{\frac{\bar{R}_N}{\bar{R}_{Rt}}\cdot\frac{\bar{R}_{Lt}+\bar{R}_{Rt}}{2\bar{R}_{Rt}}}$$

$$G'_{Rt\_mosaic}(x,y)=G_{Rt\_mosaic}(x,y)\cdot\bar{g}_{G_{Rt}}=G_{Rt\_mosaic}(x,y)\cdot\sqrt{\frac{\bar{G}_N}{\bar{G}_{Rt}}\cdot\frac{\bar{G}_{Lt}+\bar{G}_{Rt}}{2\bar{G}_{Rt}}}$$

$$B'_{Rt\_mosaic}(x,y)=B_{Rt\_mosaic}(x,y)\cdot\bar{g}_{B_{Rt}}=B_{Rt\_mosaic}(x,y)\cdot\sqrt{\frac{\bar{B}_N}{\bar{B}_{Rt}}\cdot\frac{\bar{B}_{Lt}+\bar{B}_{Rt}}{2\bar{B}_{Rt}}}$$

b) When a Geometric Average is Calculated Between the Left and Right Parallax Pixels The average value:

$$\bar{m}_R=\sqrt{\bar{R}_N\cdot\sqrt{\bar{R}_{Lt}\cdot\bar{R}_{Rt}}}$$

$$\bar{m}_G=\sqrt{\bar{G}_N\cdot\sqrt{\bar{G}_{Lt}\cdot\bar{G}_{Rt}}}$$

$$\bar{m}_B=\sqrt{\bar{B}_N\cdot\sqrt{\bar{B}_{Lt}\cdot\bar{B}_{Rt}}}$$

The gain value for the no-parallax pixels:

$$\bar{g}_{R_N}=\frac{\bar{m}_R}{\bar{R}_N}=\sqrt{\frac{\sqrt{\bar{R}_{Lt}\cdot\bar{R}_{Rt}}}{\bar{R}_N}}$$

$$\bar{g}_{G_N}=\frac{\bar{m}_G}{\bar{G}_N}=\sqrt{\frac{\sqrt{\bar{G}_{Lt}\cdot\bar{G}_{Rt}}}{\bar{G}_N}}$$

$$\bar{g}_{B_N}=\frac{\bar{m}_B}{\bar{B}_N}=\sqrt{\frac{\sqrt{\bar{B}_{Lt}\cdot\bar{B}_{Rt}}}{\bar{B}_N}}$$

The gain value for the left parallax pixels:

$$\bar{g}_{R_{Lt}}=\frac{\bar{m}_R}{\bar{R}_{Lt}}=\sqrt{\frac{\bar{R}_N}{\bar{R}_{Lt}}\cdot\sqrt{\frac{\bar{R}_{Rt}}{\bar{R}_{Lt}}}}$$

$$\bar{g}_{G_{Lt}}=\frac{\bar{m}_G}{\bar{G}_{Lt}}=\sqrt{\frac{\bar{G}_N}{\bar{G}_{Lt}}\cdot\sqrt{\frac{\bar{G}_{Rt}}{\bar{G}_{Lt}}}}$$

$$\bar{g}_{B_{Lt}}=\frac{\bar{m}_B}{\bar{B}_{Lt}}=\sqrt{\frac{\bar{B}_N}{\bar{B}_{Lt}}\cdot\sqrt{\frac{\bar{B}_{Rt}}{\bar{B}_{Lt}}}}$$

The gain value for the right parallax pixels:

$$\bar{g}_{R_{Rt}}=\frac{\bar{m}_R}{\bar{R}_{Rt}}=\sqrt{\frac{\bar{R}_N}{\bar{R}_{Rt}}\cdot\sqrt{\frac{\bar{R}_{Lt}}{\bar{R}_{Rt}}}}$$

$$\bar{g}_{G_{Rt}}=\frac{\bar{m}_G}{\bar{G}_{Rt}}=\sqrt{\frac{\bar{G}_N}{\bar{G}_{Rt}}\cdot\sqrt{\frac{\bar{G}_{Lt}}{\bar{G}_{Rt}}}}$$

$$\bar{g}_{B_{Rt}}=\frac{\bar{m}_B}{\bar{B}_{Rt}}=\sqrt{\frac{\bar{B}_N}{\bar{B}_{Rt}}\cdot\sqrt{\frac{\bar{B}_{Lt}}{\bar{B}_{Rt}}}}$$

The global gain correction for the no-parallax pixels:

$$R'_{N\_mosaic}(x,y)=R_{N\_mosaic}(x,y)\cdot\bar{g}_{R_N}=R_{N\_mosaic}(x,y)\cdot\sqrt{\frac{\sqrt{\bar{R}_{Lt}\cdot\bar{R}_{Rt}}}{\bar{R}_N}}$$

$$G'_{N\_mosaic}(x,y)=G_{N\_mosaic}(x,y)\cdot\bar{g}_{G_N}=G_{N\_mosaic}(x,y)\cdot\sqrt{\frac{\sqrt{\bar{G}_{Lt}\cdot\bar{G}_{Rt}}}{\bar{G}_N}}$$

$$B'_{N\_mosaic}(x,y)=B_{N\_mosaic}(x,y)\cdot\bar{g}_{B_N}=B_{N\_mosaic}(x,y)\cdot\sqrt{\frac{\sqrt{\bar{B}_{Lt}\cdot\bar{B}_{Rt}}}{\bar{B}_N}}$$

The global gain correction for the left parallax pixels:

$$R'_{Lt\_mosaic}(x,y)=R_{Lt\_mosaic}(x,y)\cdot\bar{g}_{R_{Lt}}=R_{Lt\_mosaic}(x,y)\cdot\sqrt{\frac{\bar{R}_N}{\bar{R}_{Lt}}\cdot\sqrt{\frac{\bar{R}_{Rt}}{\bar{R}_{Lt}}}}$$

$$G'_{Lt\_mosaic}(x,y)=G_{Lt\_mosaic}(x,y)\cdot\bar{g}_{G_{Lt}}=G_{Lt\_mosaic}(x,y)\cdot\sqrt{\frac{\bar{G}_N}{\bar{G}_{Lt}}\cdot\sqrt{\frac{\bar{G}_{Rt}}{\bar{G}_{Lt}}}}$$

$$B'_{Lt\_mosaic}(x,y)=B_{Lt\_mosaic}(x,y)\cdot\bar{g}_{B_{Lt}}=B_{Lt\_mosaic}(x,y)\cdot\sqrt{\frac{\bar{B}_N}{\bar{B}_{Lt}}\cdot\sqrt{\frac{\bar{B}_{Rt}}{\bar{B}_{Lt}}}}$$

The global gain correction for the right parallax pixels:

$$R'_{Rt\_mosaic}(x, y) = R_{Rt\_mosaic}(x, y)\cdot \bar{g}_{R_{Rt}} = R_{Rt\_mosaic}(x, y)\cdot \sqrt{\frac{\bar{R}_N}{\bar{R}_{Rt}}\cdot \sqrt{\frac{\bar{R}_{Lt}}{\bar{R}_{Rt}}}}$$

$$G'_{Rt\_mosaic}(x, y) = G_{Rt\_mosaic}(x, y)\cdot \bar{g}_{G_{Rt}} = G_{Rt\_mosaic}(x, y)\cdot \sqrt{\frac{\bar{G}_N}{\bar{G}_{Rt}}\cdot \sqrt{\frac{\bar{G}_{Lt}}{\bar{G}_{Rt}}}}$$

$$B'_{Rt\_mosaic}(x, y) = B_{Rt\_mosaic}(x, y)\cdot \bar{g}_{B_{Rt}} = B_{Rt\_mosaic}(x, y)\cdot \sqrt{\frac{\bar{B}_N}{\bar{B}_{Rt}}\cdot \sqrt{\frac{\bar{B}_{Lt}}{\bar{B}_{Rt}}}}$$

The arithmetic average approach is employed when all of the no-parallax pixels have the full-open masks. The geometric average approach is employed when all of the no-parallax pixels have the half-open masks. Accordingly, the second embodiment employs the arithmetic average approach. In this way, a mosaic image M'(x,y) is output which has been obtained by correcting the no-parallax pixels with a single gain coefficient, correcting the left parallax pixels with a single gain coefficient and correcting the right parallax pixels with a single gain coefficient.

3) Provisional parallax images are produced.

Provisional left and right parallax images with a low spatial-frequency resolution are produced.

Simple averaging interpolation is performed on the G color plane formed by a collection of the left parallax pixels. The pixel values in the adjacent pixels are used to perform linear interpolation according to the distance ratio. Likewise, simple averaging interpolation is performed on the G color plane formed by a collection of the right parallax pixels. Likewise, simple averaging interpolation is performed on the G color plane formed by a collection of the no-parallax pixels. The same processes are performed for each of the R, G and B color components. Namely, $R_{Lt}$(x,y) is produced from $R_{Lt\_mosaic}$(x,y), $R_{Rt}$(x,y) is produced from $R_{Rt\_mosaic}$(x,y), $R_N$(x,y) is produced from $R_{N\_mosaic}$(x,y), $G_{Lt}$(x,y) is produced from $G_{Lt\_mosaic}$(x,y), $G_{Rt}$(x,y) is produced from $G_{Rt\_mosaic}$(x,y), $G_N$(x,y) is produced from $G_{N\_mosaic}$(x,y), $B_{Lt}$(x,y) is produced from $B_{Lt\_mosaic}$(x,y), $G_{Rt}$(x,y) is produced from $B_{Rt\_mosaic}$(x,y), and $G_N$(x,y) is produced from $B_{N\_mosaic}$(x,y).

The provisional R component no-parallax image: $R_N$(x,y)

The provisional G component no-parallax image: $G_N$(x,y)

The provisional B component no-parallax image: $B_N$(x,y)

The provisional R component left parallax image: $R_{Lt}$(x, y)

The provisional G component left parallax image: $G_{Lt}$(x, y)

The provisional B component left parallax image: $B_{Lt}$(x, y)

The provisional R component right parallax image: $R_{Rt}$(x,y)

The provisional G component right parallax image: $G_{Rt}$(x,y)

The provisional B component right parallax image: $B_{Rt}$(x,y)

When the provisional no-parallax images $R_N$(x,y), $G_N$(x, y) and $B_N$(x,y) are produced, high resolution may be achieved by incorporating the direction determination within the signal planes.

4) A no-parallax color mosaic image is produced by performing illuminance distribution correction between the left and right pixels (local gain balance correction).

Subsequently, in a similar manner to the global gain correction performed in the step 1, local gain correction is first performed on the pixel-by-pixel basis so that uniform illuminance is achieved between the left parallax pixels in a plane and the right parallax pixels in a plane. This processing can eliminate the parallax between the left and right pixels. In addition, illuminance matching is further performed between the signal plane resulting from the averaging between the left and right pixels and the captured signal plane of the no-parallax pixels. In this manner, a new Bayer plane with uniform gain in every pixel is produced. This is equivalent to replacing the pixel values with an average value and thus produces a parallax-eliminated Bayer plane. This plane is referred to as $M_N$(x,y).

In this case, there are also two different ways of determining the target value, which may be referred to as the reference point, to which the each pixel value is adapted to in order to eliminate the parallax between the left and right pixels. To be specific, an arithmetic or geometric average is calculated. When all of the no-parallax pixels have a full-open mask area, the arithmetic average approach needs to be selected in order to match the blur width of the subject image obtained by eliminating the parallax between the left and right pixels to the blur width corresponding to the full-open mask area. On the other hand, when all of the no-parallax pixels have a half-open mask area, the geometric average approach needs to be selected in order to match the blur width of the subject image obtained by eliminating the parallax between the left and right pixels to the blur width corresponding to the half-open mask area.

The averaging between the signal plane obtained by eliminating the parallax between the left and right pixels and the captured signal plane of the no-parallax pixels needs to be performed while keeping the blur width of both of the signal planes since both of the signal planes have already been processed into the subject images having the same blur width. Therefore, this averaging should be performed by calculating the geometric average in either case. The following specifically describes the expressions used for this operation.

a) When an Arithmetic Average is Calculated Between the Left and Right Parallax Pixels The average value for each pixel:

$$m_R(x, y) = \sqrt{R_N(x, y)\cdot \frac{R_{Lt}(x, y) + R_{Rt}(x, y)}{2}}$$

$$m_G(x, y) = \sqrt{G_N(x, y)\cdot \frac{G_{Lt}(x, y) + G_{Rt}(x, y)}{2}}$$

$$m_B(x, y) = \sqrt{B_N(x, y)\cdot \frac{B_{Lt}(x, y) + B_{Rt}(x, y)}{2}}$$

The gain value for each no-parallax pixel:

$$g_{R_N}(x, y) = \frac{m_R(x, y)}{R_N(x, y)} = \sqrt{\frac{R_{Lt}(x, y) + R_{Rt}(x, y)}{2R_N(x, y)}}$$

$$g_{G_N}(x, y) = \frac{m_G(x, y)}{G_N(x, y)} = \sqrt{\frac{G_{Lt}(x, y) + G_{Rt}(x, y)}{2G_N(x, y)}}$$

-continued $$g_{B_N}(x,y)=\frac{m_B(x,y)}{B_N(x,y)}=\sqrt{\frac{B_{Lt}(x,y)+B_{Rt}(x,y)}{2B_N(x,y)}}$$

The gain value for each left parallax pixel:

$$g_{R_{Lt}}(x,y)=\frac{m_R(x,y)}{R_{Lt}(x,y)}=\sqrt{\frac{R_N(x,y)}{R_{Lt}(x,y)}\cdot\frac{R_{Lt}(x,y)+R_{Rt}(x,y)}{2R_{Lt}(x,y)}}$$

$$g_{G_{Lt}}(x,y)=\frac{m_G(x,y)}{G_{Lt}(x,y)}=\sqrt{\frac{G_N(x,y)}{G_{Lt}(x,y)}\cdot\frac{G_{Lt}(x,y)+G_{Rt}(x,y)}{2G_{Lt}(x,y)}}$$

$$g_{B_{Lt}}(x,y)=\frac{m_B(x,y)}{B_{Lt}(x,y)}=\sqrt{\frac{B_N(x,y)}{B_{Lt}(x,y)}\cdot\frac{B_{Lt}(x,y)+B_{Rt}(x,y)}{2B_{Lt}(x,y)}}$$

The gain value for each right parallax pixel:

$$g_{R_{Rt}}(x,y)=\frac{m_R(x,y)}{R_{Rt}(x,y)}=\sqrt{\frac{R_N(x,y)}{R_{Rt}(x,y)}\cdot\frac{R_{Lt}(x,y)+R_{Rt}(x,y)}{2R_{Rt}(x,y)}}$$

$$g_{G_{Rt}}(x,y)=\frac{m_G(x,y)}{G_{Rt}(x,y)}=\sqrt{\frac{G_N(x,y)}{G_{Rt}(x,y)}\cdot\frac{G_{Lt}(x,y)+G_{Rt}(x,y)}{2G_{Rt}(x,y)}}$$

$$g_{B_{Rt}}(x,y)=\frac{m_B(x,y)}{B_{Rt}(x,y)}=\sqrt{\frac{B_N(x,y)}{B_{Rt}(x,y)}\cdot\frac{B_{Lt}(x,y)+B_{Rt}(x,y)}{2B_{Rt}(x,y)}}$$

The local gain correction for each no-parallax pixel:

$$R_N(x,y)\cdot g_{R_N}(x,y)=m_R(x,y)$$

$$G_N(x,y)\cdot g_{G_N}(x,y)=m_G(x,y)$$

$$B_N(x,y)\cdot g_{B_N}(x,y)=m_B(x,y)$$

The local gain correction for each left parallax pixel:

$$R_{Lt}(x,y)\cdot g_{R_{Lt}}(x,y)=m_R(x,y)$$

$$G_{Lt}(x,y)\cdot g_{G_{Lt}}(x,y)=m_G(x,y)$$

$$B_{Lt}(x,y)\cdot g_{B_{Lt}}(x,y)=m_B(x,y)$$

The local gain correction for each right parallax pixel:

$$R_{Rt}(x,y)\cdot g_{R_{Rt}}(x,y)=m_R(x,y)$$

$$G_{Rt}(x,y)\cdot g_{G_{Rt}}(x,y)=m_G(x,y)$$

$$B_{Rt}(x,y)\cdot g_{B_{Rt}}(x,y)=m_B(x,y)$$

b) When a Geometric Average is Calculated Between the Left and Right Parallax Pixels The average value for each pixel:

$$m_R(x,y)=\sqrt{R_N(x,y)\cdot\sqrt{R_{Lt}(x,y)\cdot R_{Rt}(x,y)}}$$

$$m_G(x,y)=\sqrt{G_N(x,y)\cdot\sqrt{G_{Lt}(x,y)\cdot G_{Rt}(x,y)}}$$

$$m_B(x,y)=\sqrt{B_N(x,y)\cdot\sqrt{B_{Lt}(x,y)\cdot B_{Rt}(x,y)}}$$

The gain value for each no-parallax pixel:

$$g_{R_N}(x,y)=\frac{m_R(x,y)}{R_N(x,y)}=\sqrt{\frac{\sqrt{R_{Lt}(x,y)\cdot R_{Rt}(x,y)}}{R_N(x,y)}}$$

$$g_{G_N}(x,y)=\frac{m_G(x,y)}{G_N(x,y)}=\sqrt{\frac{\sqrt{G_{Lt}(x,y)\cdot G_{Rt}(x,y)}}{G_N(x,y)}}$$

$$g_{B_N}(x,y)=\frac{m_B(x,y)}{B_N(x,y)}=\sqrt{\frac{\sqrt{B_{Lt}(x,y)\cdot B_{Rt}(x,y)}}{B_N(x,y)}}$$

The gain value for each left parallax pixel:

$$g_{R_{Lt}}(x,y)=\frac{m_R(x,y)}{R_{Lt}(x,y)}=\sqrt{\frac{R_N(x,y)}{R_{Lt}(x,y)}\cdot\sqrt{\frac{R_{Rt}(x,y)}{R_{Lt}(x,y)}}}$$

$$g_{G_{Lt}}(x,y)=\frac{m_G(x,y)}{G_{Lt}(x,y)}=\sqrt{\frac{G_N(x,y)}{G_{Lt}(x,y)}\cdot\sqrt{\frac{G_{Rt}(x,y)}{G_{Lt}(x,y)}}}$$

$$g_{B_{Lt}}(x,y)=\frac{m_B(x,y)}{B_{Lt}(x,y)}=\sqrt{\frac{B_N(x,y)}{B_{Lt}(x,y)}\cdot\sqrt{\frac{B_{Rt}(x,y)}{B_{Lt}(x,y)}}}$$

The gain value for each right parallax pixel:

$$g_{R_{Rt}}(x,y)=\frac{m_R(x,y)}{R_{Rt}(x,y)}=\sqrt{\frac{R_N(x,y)}{R_{Rt}(x,y)}\cdot\sqrt{\frac{R_{Lt}(x,y)}{R_{Rt}(x,y)}}}$$

$$g_{G_{Rt}}(x,y)=\frac{m_G(x,y)}{G_{Rt}(x,y)}=\sqrt{\frac{G_N(x,y)}{G_{Rt}(x,y)}\cdot\sqrt{\frac{G_{Lt}(x,y)}{G_{Rt}(x,y)}}}$$

$$g_{B_{Rt}}(x,y)=\frac{m_B(x,y)}{B_{Rt}(x,y)}=\sqrt{\frac{B_N(x,y)}{B_{Rt}(x,y)}\cdot\sqrt{\frac{B_{Lt}(x,y)}{B_{Rt}(x,y)}}}$$

The local gain correction for each no-parallax pixel:

$$R_N(x,y)\cdot g_{R_N}(x,y)=m_R(x,y)_n$$

$$G_N(x,y)\cdot g_{G_N}(x,y)=m_G(x,y)$$

$$B_N(x,y)\cdot g_{B_N}(x,y)=m_B(x,y)$$

The local gain correction for each left parallax pixel:

$$R_{Lt}(x,y)\cdot g_{R_{Lt}}(x,y)=m_R(x,y)$$

$$G_{Lt}(x,y)\cdot g_{G_{Lt}}(x,y)=m_G(x,y)$$

$$B_{Lt}(x,y)\cdot g_{B_{Lt}}(x,y)=m_B(x,y)$$

The local gain correction for each right parallax pixel:

$$R_{Rt}(x,y)\cdot g_{R_{Rt}}(x,y)=m_R(x,y)$$

$$G_{Rt}(x,y)\cdot g_{G_{Rt}}(x,y)=m_G(x,y)$$

$$B_{Rt}(x,y)\cdot g_{B_{Rt}}(x,y)=m_B(x,y)$$

In the above-described manner, the no-parallax Bayer plane image $M_N(x,y)$ is output by converting the Bayer plane data in such a manner that the average value between the left and right viewpoint images is calculated and then averaged with the no-parallax image of the reference viewpoint, and that the resulting average pixel value is used as the new no-parallax pixel value.

5) A no-parallax reference image is produced.

The step 5 is performed in the same manner as in the first embodiment.

6) Actual parallax images are produced.

The low-resolution provisional left parallax color images $R_{Lt}$(x,y), $G_{Lt}$(x,y),$B_{Lt}$(x,y) produced in the step 3 and the high-resolution no-parallax color images $R_N$(x,y), $G_N$(x,y), $B_N$(x,y) produced as the intermediate images in the step 5 are used to produce high-resolution left-parallax color images $R'_{Lt}$(x,y), $G'_{Lt}$(x,y), $B'_{Lt}$(x,y) that are to be actually output. Likewise, the low-resolution provisional right parallax color images $R_{Rt}$(x,y), $G_{Rt}$(x,y), $B_{Rt}$(x,y) produced in the step 3 and the high-resolution no-parallax color images produced as the intermediate images in the step 5 $R_N$(x,y), $G_N$(x,y), $B_N$(x,y) are used to produce high-resolution right-parallax color images $R'_{Rt}$(x,y), $G'_{Rt}$(x,y), $B'_{Rt}$(x,y) that are to be actually output.

The parallax modulation is performed in two different ways: using the arithmetic and geometric averages as the reference point. Both methods can successfully produce parallax modulation effects. However, the parallax modulation using the arithmetic average as the reference point is employed when the no-parallax pixels of the image sensor have full-open masks, and the parallax modulation using the geometric average as the reference point is employed when the no-parallax pixels have half-open masks like the parallax pixels. Accordingly, the present embodiment uses the parallax modulation using the arithmetic average as the reference point.

a) Parallax Modulation Using the Arithmetic Average as the Reference Point

The left parallax modulation $$R'_{Lt}(x,y)=R_N(x,y)\frac{2R_{Lt}(x,y)}{R_{Lt}(x,y)+R_{Rt}(x,y)}\frac{2G_{Lt}(x,y)}{G_{Lt}(x,y)+G_{Rt}(x,y)}\frac{2B_{Lt}(x,y)}{B_{Lt}(x,y)+B_{Rt}(x,y)}$$

$$G'_{Lt}(x,y)=G_N(x,y)\frac{2R_{Lt}(x,y)}{R_{Lt}(x,y)+R_{Rt}(x,y)}\frac{2G_{Lt}(x,y)}{G_{Lt}(x,y)+G_{Rt}(x,y)}\frac{2B_{Lt}(x,y)}{B_{Lt}(x,y)+B_{Rt}(x,y)}$$

$$B'_{Lt}(x,y)=B_N(x,y)\frac{2R_{Lt}(x,y)}{R_{Lt}(x,y)+R_{Rt}(x,y)}\frac{2G_{Lt}(x,y)}{G_{Lt}(x,y)+G_{Rt}(x,y)}\frac{2B_{Lt}(x,y)}{B_{Lt}(x,y)+B_{Rt}(x,y)}$$

The right parallax modulation $$R'_{Rt}(x,y)=R_N(x,y)\frac{2R_{Rt}(x,y)}{R_{Lt}(x,y)+R_{Rt}(x,y)}\frac{2G_{Rt}(x,y)}{G_{Lt}(x,y)+G_{Rt}(x,y)}\frac{2B_{Rt}(x,y)}{B_{Lt}(x,y)+B_{Rt}(x,y)}$$

$$G'_{Rt}(x,y)=G_N(x,y)\frac{2R_{Rt}(x,y)}{R_{Lt}(x,y)+R_{Rt}(x,y)}\frac{2G_{Rt}(x,y)}{G_{Lt}(x,y)+G_{Rt}(x,y)}\frac{2B_{Rt}(x,y)}{B_{Lt}(x,y)+B_{Rt}(x,y)}$$

$$B'_{Rt}(x,y)=B_N(x,y)\frac{2R_{Rt}(x,y)}{R_{Lt}(x,y)+R_{Rt}(x,y)}$$

-continued $$\frac{2G_{Rt}(x,y)}{G_{Lt}(x,y)+G_{Rt}(x,y)}\frac{2B_{Rt}(x,y)}{B_{Lt}(x,y)+B_{Rt}(x,y)}$$

b) Parallax Modulation Using the Geometric Average as the Reference Point

The left parallax modulation $$R'_{Lt}(x,y)=R_N(x,y)\frac{R_{Lt}(x,y)}{\sqrt{R_{Lt}(x,y)\cdot R_{Rt}(x,y)}}\frac{G_{Lt}(x,y)}{\sqrt{G_{Lt}(x,y)\cdot G_{Rt}(x,y)}}\frac{B_{Lt}(x,y)}{\sqrt{B_{Lt}(x,y)\cdot B_{Rt}(x,y)}}$$

$$G'_{Lt}(x,y)=G_N(x,y)\frac{R_{Lt}(x,y)}{\sqrt{R_{Lt}(x,y)\cdot R_{Rt}(x,y)}}\frac{G_{Lt}(x,y)}{\sqrt{G_{Lt}(x,y)\cdot G_{Rt}(x,y)}}\frac{B_{Lt}(x,y)}{\sqrt{B_{Lt}(x,y)\cdot B_{Rt}(x,y)}}$$

$$B'_{Lt}(x,y)=B_N(x,y)\frac{R_{Lt}(x,y)}{\sqrt{R_{Lt}(x,y)\cdot R_{Rt}(x,y)}}\frac{G_{Lt}(x,y)}{\sqrt{G_{Lt}(x,y)\cdot G_{Rt}(x,y)}}\frac{B_{Lt}(x,y)}{\sqrt{B_{Lt}(x,y)\cdot B_{Rt}(x,y)}}$$

The right parallax modulation $$R'_{Rt}(x,y)=R_N(x,y)\frac{R_{Rt}(x,y)}{\sqrt{R_{Lt}(x,y)\cdot R_{Rt}(x,y)}}\frac{G_{Rt}(x,y)}{\sqrt{G_{Lt}(x,y)\cdot G_{Rt}(x,y)}}\frac{B_{Rt}(x,y)}{\sqrt{B_{Lt}(x,y)\cdot B_{Rt}(x,y)}}$$

$$G'_{Rt}(x,y)=G_N(x,y)\frac{R_{Rt}(x,y)}{\sqrt{R_{Lt}(x,y)\cdot R_{Rt}(x,y)}}\frac{G_{Rt}(x,y)}{\sqrt{G_{Lt}(x,y)\cdot G_{Rt}(x,y)}}\frac{B_{Rt}(x,y)}{\sqrt{B_{Lt}(x,y)\cdot B_{Rt}(x,y)}}$$

$$B'_{Rt}(x,y)=B_N(x,y)\frac{R_{Rt}(x,y)}{\sqrt{R_{Lt}(x,y)\cdot R_{Rt}(x,y)}}\frac{G_{Rt}(x,y)}{\sqrt{G_{Lt}(x,y)\cdot G_{Rt}(x,y)}}\frac{B_{Rt}(x,y)}{\sqrt{B_{Lt}(x,y)\cdot B_{Rt}(x,y)}}$$

The above expressions can be transformed as follows.

The left parallax modulation $$R'_{Lt}(x,y)=R_N(x,y)\sqrt{\frac{R_{Lt}(x,y)}{R_{Rt}(x,y)}}\sqrt{\frac{G_{Lt}(x,y)}{G_{Rt}(x,y)}}\sqrt{\frac{B_{Lt}(x,y)}{B_{Rt}(x,y)}}$$

$$G'_{Lt}(x,y)=G_N(x,y)\sqrt{\frac{R_{Lt}(x,y)}{R_{Rt}(x,y)}}\sqrt{\frac{G_{Lt}(x,y)}{G_{Rt}(x,y)}}\sqrt{\frac{B_{Lt}(x,y)}{B_{Rt}(x,y)}}$$

$$B'_{Lt}(x,y)=B_N(x,y)\sqrt{\frac{R_{Lt}(x,y)}{R_{Rt}(x,y)}}\sqrt{\frac{G_{Lt}(x,y)}{G_{Rt}(x,y)}}\sqrt{\frac{B_{Lt}(x,y)}{B_{Rt}(x,y)}}$$

The right parallax modulation $$R'_{Rt}(x,y)=R_N(x,y)\sqrt{\frac{R_{Rt}(x,y)}{R_{Lt}(x,y)}}\sqrt{\frac{G_{Rt}(x,y)}{G_{Lt}(x,y)}}\sqrt{\frac{B_{Rt}(x,y)}{B_{Lt}(x,y)}}$$

-continued $$G'_{Rt}(x,y)=G_N(x,y)\sqrt{\frac{R_{Rt}(x,y)}{R_{Lt}(x,y)}}\sqrt{\frac{G_{Rt}(x,y)}{G_{Lt}(x,y)}}\sqrt{\frac{B_{Rt}(x,y)}{B_{Lt}(x,y)}}$$

$$B'_{Rt}(x,y)=B_N(x,y)\sqrt{\frac{R_{Rt}(x,y)}{R_{Lt}(x,y)}}\sqrt{\frac{G_{Rt}(x,y)}{G_{Lt}(x,y)}}\sqrt{\frac{B_{Rt}(x,y)}{B_{Lt}(x,y)}}$$

7) The actual parallax images are converted into an output color space.

The step 7 is performed in the same manner as in the first embodiment.

<Third Embodiment>

Monochrome Sparse Parallax Pixel Arrangement

Figure 5A:
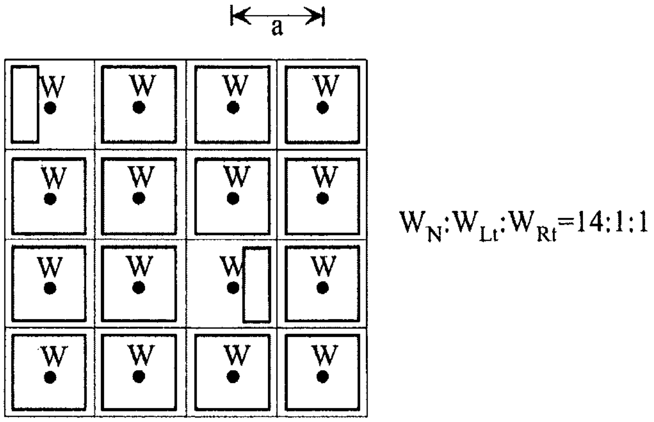
FIGS. 5A and 5B respectively illustrate a pixel arrangement and the resolution of this arrangement in the frequency space.

The following describes an example using an image sensor where primitive lattices having the arrangement shown in FIG. 5A are periodically arranged. The frequency resolution region of the reciprocal lattice space of the image sensor is also shown for various combinations of parallax directions. This monochrome image sensor having such an arrangement takes advantage of such a nature of a monocular pupil-division type that parallax only exists in blur subject regions, and is thus structured such that the density of the parallax pixels is reduced and the number of no-parallax pixels is increased as much as possible.

Flow Chart

1) A parallax multiplexed mosaic image data is input.

2) The global gain balance of the parallax multiplexed mosaic image is corrected.

3) Provisional parallax images are produced.

4) A no-parallax reference image is produced by performing local illuminance distribution correction between the left and right pixels (local gain balance correction).

5) Actual parallax images are produced.

6) The actual parallax images are converted into an output space.

Detailed Description

1) A parallax multiplexed mosaic image data is input.

Figure 5B:
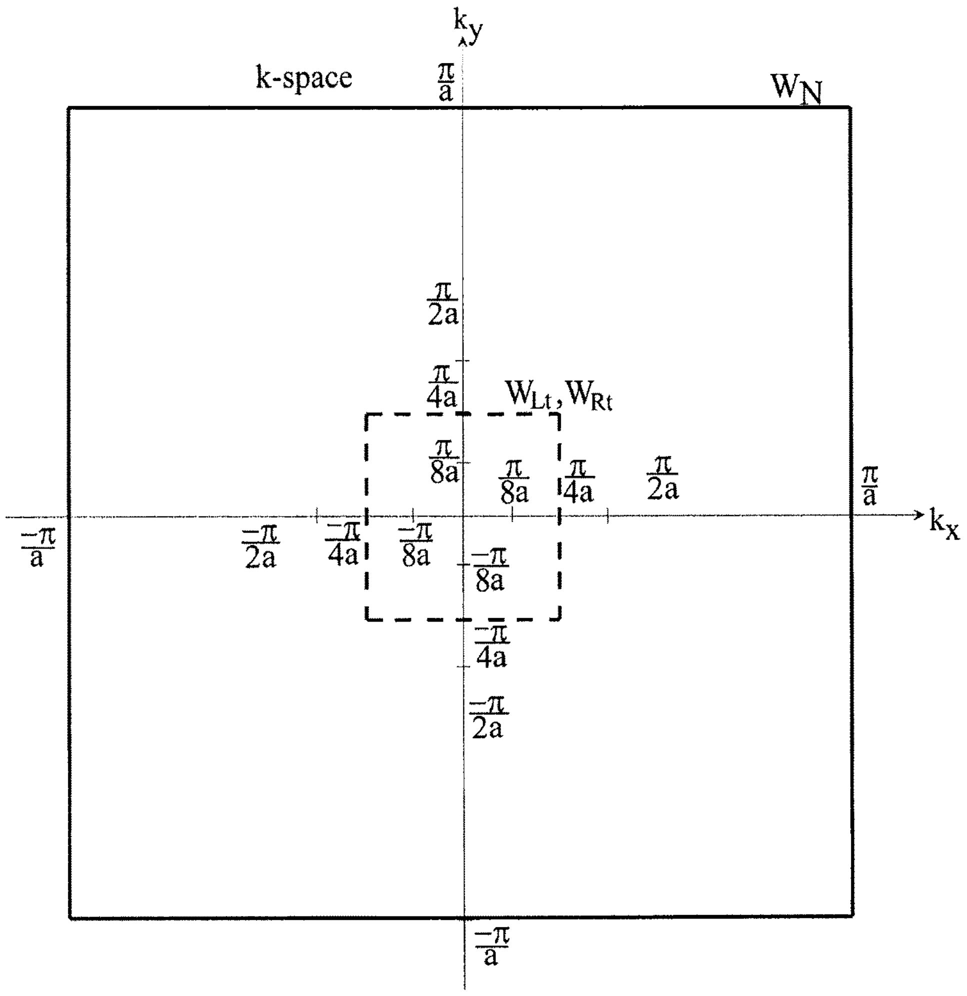

A parallax multiplexed single-plate monochrome mosaic image shown in FIGS. 5A and 5B:M(x,y)

The gray level is a linear gray level output by A/D conversion.

2) The global gain balance of the parallax multiplexed mosaic image is corrected.

The captured subject images are used without a change to calculate the average value $\bar{N}$, for the entire image, the pixel values of the no-parallax pixels, the average value $\bar{Lt}$, for the entire image, the pixel values of the left parallax pixels and the average value $\bar{Rt}$, for the entire image, the pixel values of the right parallax pixels. As in the second embodiment, there are three signal levels in the third embodiment. To start with, as the reference point between the left and right images, the average value is calculated, and the gain correction is performed in such a manner that the signal levels match the average value. Here, the reference point is determined in two different ways: arithmetic and geometric averages. After this, a geometric average is determined between the signal level obtained by the averaging between the left and right pixels and the signal level of the no-parallax pixels, and the gain correction is performed in such a manner that the signal levels match the geometric average.

For convenience, in the mosaic image M(x,y), the signal plane of the no-parallax pixels is represented as $N_{mosaic}(x,y)$, the signal plane of the left parallax pixels is represented as $Lt_{mosaic}(x,y)$, and the signal plane of the right parallax pixels is represented as $Rt_{mosaic}(x,y)$.

a) When an Arithmetic Average is Calculated Between the Left and Right Parallax Pixels The average value:

$$\bar{m}=\sqrt{\bar{N}\cdot\frac{\bar{Lt}+\bar{Rt}}{2}}$$

The gain value for the no-parallax pixels:

$$\bar{g}_N=\frac{\bar{m}}{\bar{N}}=\sqrt{\frac{\bar{Lt}+\bar{Rt}}{2\bar{N}}}$$

The gain value for the left parallax pixels:

$$\bar{g}_{Lt}=\frac{\bar{m}}{\bar{Lt}}=\sqrt{\frac{\bar{N}}{\bar{Lt}}\cdot\frac{\bar{Lt}+\bar{Rt}}{2\bar{Lt}}}$$

The gain value for the right parallax pixels:

$$\bar{g}_{Rt}=\frac{\bar{m}}{\bar{Rt}}=\sqrt{\frac{\bar{N}}{\bar{Rt}}\cdot\frac{\bar{Lt}+\bar{Rt}}{2\bar{Rt}}}$$

The global gain correction for the no-parallax pixels:

$$N'_{mosaic}(x,y)=N_{mosaic}(x,y)\cdot\bar{g}_N=N_{mosaic}(x,y)\cdot\sqrt{\frac{\bar{Lt}+\bar{Rt}}{2\bar{N}}}$$

The global gain correction for the left parallax pixels:

$$Lt'_{mosaic}(x,y)=Lt_{mosaic}(x,y)\cdot\bar{g}_{Lt}=Lt_{mosaic}(x,y)\cdot\sqrt{\frac{\bar{N}}{\bar{Lt}}\cdot\frac{\bar{Lt}+\bar{Rt}}{2\bar{Lt}}}$$

The global gain correction for the right parallax pixels:

$$Rt'_{mosaic}(x,y)=Rt_{mosaic}(x,y)\cdot\bar{g}_{Rt}=Rt_{mosaic}(x,y)\cdot\sqrt{\frac{\bar{N}}{\bar{Rt}}\cdot\frac{\bar{Lt}+\bar{Rt}}{2\bar{Rt}}}$$

b) When a Geometric Average is Calculated Between the Left and Right Parallax Pixels The average value:

$$\bar{m}=\sqrt{\bar{N}\cdot\sqrt{\bar{Lt}\cdot\bar{Rt}}}$$

The gain value for the no-parallax pixels:

$$g_N = \frac{\bar{m}}{\bar{N}} = \sqrt{\frac{\sqrt{\bar{Lt} \cdot \bar{Rt}}}{\bar{N}}}$$

The gain value for the left parallax pixels:

$$g_{Lt} = \frac{\bar{m}}{\bar{Lt}} = \sqrt{\frac{\bar{N}}{\bar{Lt}} \cdot \sqrt{\frac{\bar{Rt}}{\bar{Lt}}}}$$

The gain value for the right parallax pixels:

$$g_{Rt} = \frac{\bar{m}}{\bar{Rt}} = \sqrt{\frac{\bar{N}}{\bar{Rt}} \cdot \sqrt{\frac{\bar{Lt}}{\bar{Rt}}}}$$

The global gain correction for the no-parallax pixels:

$$N'_{mosaic}(x, y) = N_{mosaic}(x, y) \cdot g_N = N_{mosaic}(x, y) \cdot \sqrt{\frac{\sqrt{\bar{Lt} \cdot \bar{Rt}}}{\bar{N}}}$$

The global gain correction for the left parallax pixels:

$$Lt'_{mosaic}(x, y) = Lt_{mosaic}(x, y) \cdot g_{Lt} = Lt_{mosaic}(x, y) \cdot \sqrt{\frac{\bar{N}}{\bar{Lt}} \cdot \sqrt{\frac{\bar{Rt}}{\bar{Lt}}}}$$

The global gain correction for the right parallax pixels:

$$Rt'_{mosaic}(x, y) = Rt_{mosaic}(x, y) \cdot g_{Rt} = Lt_{mosaic}(x, y) \cdot \sqrt{\frac{\bar{N}}{\bar{Rt}} \cdot \sqrt{\frac{\bar{Lt}}{\bar{Rt}}}}$$

The arithmetic average approach is employed when all of the no-parallax pixels have the full-open masks. The geometric average approach is employed when all of the no-parallax pixels have the half-open masks. Accordingly, the third embodiment employs the arithmetic average approach. In this way, a mosaic image M'(x,y) is output which has been obtained by correcting the no-parallax pixels with a single gain coefficient, correcting the left parallax pixels with a single gain coefficient and correcting the right parallax pixels with a single gain coefficient.

3) Provisional parallax images are produced.

Provisional left and right parallax images with a low spatial-frequency resolution are produced.

Simple averaging interpolation is performed on the signal plane formed by a collection of the left parallax pixels. The pixel values in the adjacent pixels are used to perform linear interpolation according to the distance ratio. Likewise, simple averaging interpolation is performed on the signal plane formed by a collection of the right parallax pixels. Likewise, simple averaging interpolation is performed on the signal plane formed by a collection of the no-parallax pixels. Namely, Lt(x,y) is produced from $Lt_{mosaic}$(x,y), Rt(x, y) is produced from $Rt_{mosaic}$(x,y), and N(x,y) is produced from $N_{mosaic}$(x,y).

The provisional no-parallax image: N(x,y)

The provisional left parallax image: Lt(x,y)

The provisional right parallax image: Rt(x,y)

When the provisional no-parallax image N(x,y) is produced, high resolution may be achieved by incorporating the direction determination within the signal plane.

4) A no-parallax reference image is produced by performing illuminance distribution correction between the left and right pixels (local gain balance correction).

Subsequently, in a similar manner to the global gain correction performed in the step 1, local gain correction is first performed on the pixel-by-pixel basis so that uniform illuminance is achieved between the left parallax pixels in a plane and the right parallax pixels in a plane. This processing can eliminate the parallax between the left and right pixels. In addition, illuminance matching is further performed between the signal plane resulting from the averaging between the left and right parallax pixels and the captured signal plane of the no-parallax pixels. In this manner, a new no-parallax reference image plane with uniform gain in every pixel is produced. This is equivalent to replacing the pixel values with an average value and thus produces a no-parallax intermediate image plane. This plane is referred to as N(x,y).

a) When an Arithmetic Average is Calculated Between the Left and Right Parallax Pixels The average value for each pixel:

$$m(x, y) = \sqrt{N(x, y) \cdot \frac{Lt(x, y) + Rt(x, y)}{2}}$$

The gain value for each no-parallax pixel:

$$g_N(x, y) = \frac{m(x, y)}{N(x, y)} = \sqrt{\frac{Lt(x, y) + Rt(x, y)}{2N(x, y)}}$$

The gain value for each left parallax pixel:

$$g_{Lt}(x, y) = \frac{m(x, y)}{Lt(x, y)} = \sqrt{\frac{N(x, y)}{Lt(x, y)} \cdot \frac{Lt(x, y) + Rt(x, y)}{2Lt(x, y)}}$$

The gain value for each right parallax pixel:

$$g_{Rt}(x, y) = \frac{m(x, y)}{Rt(x, y)} = \sqrt{\frac{N(x, y)}{Rt(x, y)} \cdot \frac{Lt(x, y) + Rt(x, y)}{2Rt(x, y)}}$$

The local gain correction for each no-parallax pixel:

$$N(x,y) \cdot g_N(x,y) = m(x,y)$$

The local gain correction for each left parallax pixel:

$$Lt(x,y) \cdot g_{Lt}(x,y) = m(x,y)$$

The local gain correction for each right parallax pixel:

$$Rt(x,y) \cdot g_{Rt}(x,y) = m(x,y)$$

b) When a Geometric Average is Calculated Between the Left and Right Parallax Pixels The average value for each pixel:

$$m(x,y)=\sqrt{N(x,y)\cdot\sqrt{Lt(x,y)\cdot Rt(x,y)}}$$

The gain value for each no-parallax pixel:

$$g_N(x,y)=\frac{m(x,y)}{N(x,y)}=\sqrt{\frac{\sqrt{Lt(x,y)\cdot Rt(x,y)}}{N(x,y)}}$$

The gain value for each left parallax pixel:

$$g_{Lt}(x,y)=\frac{m(x,y)}{Lt(x,y)}=\sqrt{\frac{N(x,y)}{Lt(x,y)}\cdot\sqrt{\frac{Rt(x,y)}{Lt(x,y)}}}$$

The gain value for each right parallax pixel:

$$g_{Rt}(x,y)=\frac{m(x,y)}{Rt(x,y)}=\sqrt{\frac{N(x,y)}{Rt(x,y)}\cdot\sqrt{\frac{Lt(x,y)}{Rt(x,y)}}}$$

The local gain correction for each no-parallax pixel:

$$N(x,y)\cdot g_N(x,y)=m(x,y)$$

The local gain correction for each left parallax pixel:

$$Lt(x,y)\cdot g_{Lt}(x,y)=m(x,y)$$

The local gain correction for each right parallax pixel:

$$Rt(x,y)\cdot g_{Rt}(x,y)=m(x,y)$$

In the above-described manner, the no-parallax monochrome plane image N(x,y) is output by converting the monochrome plane data in such a manner that the average value between the left and right viewpoint images is calculated and then averaged with the no-parallax image of the reference viewpoint, and that the resulting average pixel value is used as a new no-parallax pixel value.

5) Actual parallax images are produced.

The low-resolution provisional left parallax image Lt(x,y) produced in the step 3 and the high-resolution no-parallax monochrome image N(x,y) produced as the intermediate image in the step 5 are used to produce a high-resolution left-parallax monochrome images Lt'(x,y) that is to be actually output. Likewise, the low-resolution provisional right parallax image Rt(x,y) produced in the step 3 and the high-resolution no-parallax monochrome image N(x,y) produced as the intermediate image in the step 5 are used to produce a high-resolution right-parallax monochrome image Rt'(x,y) that is to be actually output.

The parallax modulation is performed in two different ways: using the arithmetic and geometric averages as the reference point. Both methods can successfully produce parallax modulation effects. However, the parallax modulation using the arithmetic average as the reference point is employed when the no-parallax pixels of the image sensor have full-open masks, and the parallax modulation using the geometric average as the reference point is employed when the no-parallax pixels have half-open masks like the parallax pixels. Accordingly, the present embodiment uses the parallax modulation using the arithmetic average as the reference point.

a) Parallax Modulation Using the Arithmetic Average as the Reference Point

The left parallax modulation $$Lt'(x,y)=N(x,y)\frac{2Lt(x,y)}{Lt(x,y)+Rt(x,y)}$$

The right parallax modulation $$Rt'(x,y)=N(x,y)\frac{2Rt(x,y)}{Lt(x,y)+Rt(x,y)}$$

b) Parallax Modulation Using the Geometric Average as the Reference Point

The left parallax modulation $$Lt'(x,y)=N(x,y)\frac{Lt(x,y)}{\sqrt{Lt(x,y)\cdot Rt(x,y)}}=N(x,y)\sqrt{\frac{Lt(x,y)}{Rt(x,y)}}$$

The right parallax modulation $$Rt'(x,y)=N(x,y)\frac{Rt(x,y)}{\sqrt{Lt(x,y)\cdot Rt(x,y)}}=N(x,y)\sqrt{\frac{Rt(x,y)}{Lt(x,y)}}$$

6) The actual parallax images are converted into an output space.

The resulting high-resolution and no-parallax intermediate monochrome image N(x,y), a high-resolution and left-parallax monochrome image Lt'(x,y) and a high-resolution and right-parallax monochrome image Rt'(x,y) each undergo appropriate gamma conversion. In this manner, an image of the output space is produced and output.

<Note>

Conventional Pixel Array in which all the Pixels are Parallax Pixels

In the case of an image sensor of the Bayer arrangement in which only left and right parallax pixels are arranged, which is disclosed in Patent Document 1 in the conventional art, the processing performed in the first embodiment on the G parallax pixels may be also performed on the R and B parallax pixels, so that the Bayer arrangement without parallax can be provided for. The result undergoes conventional Bayer interpolation to produce intermediate images, the R, G and B low-resolution parallax images are used, and parallax modulation is applied using the same method as in the second embodiment. In this manner, high-resolution left and right parallax color images can be produced. In this way, the present invention can address the problem of the variance in illuminance between the left and right parallax pixels in the conventional image sensor.

In the first to third embodiments, the left and right parallax pixels are described. However, the variance in illuminance correction can be performed in exactly the same manner when the image sensor is rotated by 90° so that parallax is provided in the vertical direction. In addition, this is exactly the same in the case where the image sensor is rotated by 45° so that parallax is provided in a diagonal direction.

<Fourth Embodiment>

Figure 7:
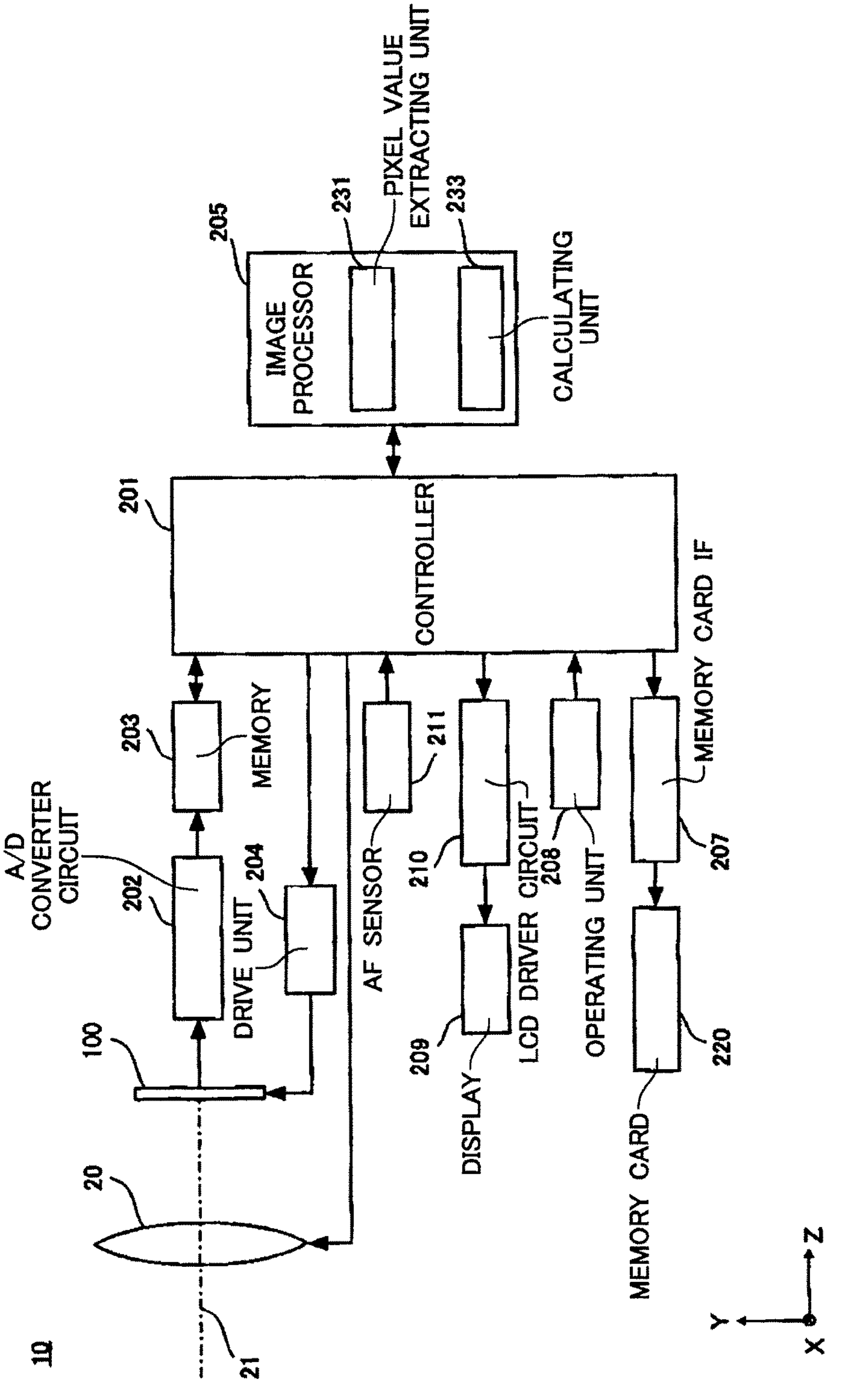
FIG. 7 illustrates the structure of a digital camera 10.

FIG. 7 illustrates the structure of a digital camera 10. The digital camera 10 includes an image-capturing lens 20, which is an image-capturing optical system, and guides incoming subject luminous flux along an optical axis 21 to an image sensor 100. The image-capturing lens 20 may be a replaceable lens that is attachable and detachable to/from the digital camera 10. The digital camera 10 includes the image sensor 100, a controller 201, an A/D converter circuit 202, a memory 203, a drive unit 204, an image processor 205, a memory card IF207, an operating unit 208, a display 209, an LCD driver circuit 210, and an AF sensor 211.

As shown in FIG. 7, a Z-axis positive direction is defined as the direction parallel to the optical axis 21 toward the image sensor 100, an X-axis positive direction is defined as the direction toward the viewer of the sheet of FIG. 7 in the plane orthogonal to the Z axis, and a Y-axis positive direction is defined as the upward direction in the sheet of FIG. 7. In some of the following drawings, their coordinate axes are shown how the respective drawings are arranged relative to the coordinate axes of FIG. 7.

The image-capturing lens 20 is constituted by a group of optical lenses and configured to form an image from the subject luminous flux from a scene in the vicinity of its focal plane. For the convenience of description, the image-capturing lens 20 is hypothetically represented by a single lens positioned in the vicinity of the pupil in FIG. 7. The image sensor 100 is positioned in the vicinity of the focal plane of the image-capturing lens 20. The image sensor 100 is an image sensor having a two-dimensionally arranged photoelectric converter elements, for example, a CCD or CMOS sensor. The timing of the image sensor 100 is controlled by the driver unit 204 so that the image sensor 100 can convert a subject image formed on the light receiving surface into an image signal and outputs the image signal to the A/D converter circuit 202.

The A/D converter circuit 202 converts the image signal output from the image sensor 100 into a digital image signal and outputs the digital image signal to the memory 203. The image processor 205 uses the memory 203 as its workspace to perform a various image processing operations and thus generates image data. To be specific, the image processor 205 includes a pixel value extracting unit 231 that is configured to extract a pixel value from a target pixel position in color image data and parallax image data and a calculating unit 233 that is configured to use the extracted pixel value to calculate a pixel value as color image data for the target pixel position. The respective image processing operations are described in detail later.

The image processor 205 additionally performs general image processing operations such as adjusting image data in accordance with a selected image format. The produced image data is converted by the LCD drive circuit 210 into a display signal and displayed on the display 209. In addition, the produced image data is stored in the memory card 220 attached to the memory card IF 207.

The AF sensor 211 is a phase detection sensor having a plurality of ranging points set in a subject space and configured to detect a defocus amount of a subject image for each ranging point. A series of image-capturing sequences is initiated when the operating unit 208 receives a user operation and outputs an operating signal to the controller 201. The various operations such as AF and AE associated with the image-capturing sequences are performed under the control of the controller 201. For example, the controller 201 analyzes the detection signal from the AF sensor 211 to perform focus control to move a focus lens that constitutes a part of the image-capturing lens 20.

Figure 8:
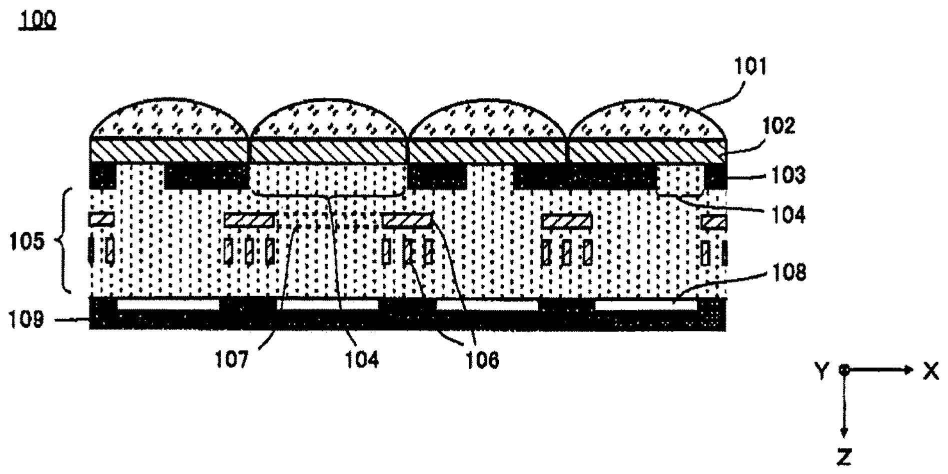
FIG. 8 is a cross-sectional view of an image sensor 100.

The following describes the structure of the image sensor 100 in detail. FIG. 8 schematically illustrates the cross-section of the image sensor 100.

The image sensor 100 is structured in such a manner that microlenses 101, color filters 102, aperture masks 103, an interconnection layer 105 and photoelectric converter elements 108 are arranged in the stated order when seen from the side facing a subject. The photoelectric converter elements 108 are formed by photodiodes that may convert incoming light into an electrical signal. The photoelectric converter elements 108 are arranged two-dimensionally on the surface of a substrate 109.

The image signals produced by the conversion performed by the photoelectric converter elements 108, control signals to control the photoelectric converter elements 108 and the like are transmitted and received via interconnections 106 provided in the interconnection layer 105. The aperture masks 103 having openings 104, which are provided in a one-to-one correspondence with the photoelectric converter elements 108, are provided in contact with the interconnection layer 105. Each of the openings 104 is shifted in accordance with a corresponding one of the photoelectric converter elements 108 and strictly positioned relative to the corresponding photoelectric converter element 108 as described later. As described later in more details, the aperture masks 103 having the openings 104 effectively cause parallax in the subject luminous flux received by the photoelectric converter elements 108.

On the other hand, no aperture masks 103 are provided on some of the photoelectric converter elements 108 that do not cause parallax. In other words, such photoelectric converter elements 108 are provided with the aperture masks 103 having such openings 104 that do not limit the subject luminous flux incident on the corresponding photoelectric converter elements 108 or allow the entire incident luminous flux to transmit through the aperture masks 103. Although these photoelectric converter elements 108 do not cause parallax, the incoming subject luminous flux is substantially defined by an opening 107 formed by the interconnections 106. Therefore, the interconnections 106 can be viewed as an aperture mask that does not cause parallax and allows the entire incoming luminous flux to pass. The aperture masks 103 may be arranged independently and separately from the photoelectric converter elements 108 and in correspondence with the photoelectric converter elements 108, or may be formed jointly with the photoelectric converter elements 108, like the way how the color filters 102 are manufactured.

The color filters 102 are provided on the aperture masks 103. Each of the color filters 102 is colored so as to transmit a particular wavelength range to a corresponding one of the photoelectric converter elements 108, and the color filters 102 are arranged in a one-to-one correspondence with the photoelectric converter elements 108. To output a color image, at least two different types of color filters that are different from each other need to be arranged. However, three or more different types of color filters may need to be arranged to produce a color image with higher quality. For example, red filters (R filters) to transmit the red wavelength range, green filters (G filters) to transmit the green wavelength range, and blue filters (B filters) to transmit the blue wavelength range may be arranged in a lattice pattern. The way how the filters are specifically arranged will be described later.

The microlenses 101 are provided on the color filters 102. The microlenses 101 are each a light collecting lens to guide more of the incident subject luminous flux to the corresponding photoelectric converter element 108. The microlenses 101 are provided in a one-to-one correspondence with the photoelectric converter elements 108. The optical axis of each microlens 101 is preferably shifted so that more of the subject luminous flux is guided to the corresponding photoelectric converter element 108 taking into consideration the relative positions between the pupil center of the image-capturing lens 20 and the corresponding photoelectric converter element 108. Furthermore, the position of each of the microlenses 101 as well as the position of the opening 104 of the corresponding aperture mask 103 may be adjusted to allow more of the particular subject luminous flux to be incident, which will be described later.

Here, a pixel is defined as a single set constituted by one of the aperture masks 103, one of the color filters 102, and one of the microlenses 101, which are provided in a one-to-one correspondence with the photoelectric converter elements 108 as described above. To be more specific, a pixel with an aperture mask 103 that causes parallax is referred to as a parallax pixel, and a pixel without an aperture mask 103 that causes parallax is referred to as a no-parallax pixel. For example, when the image sensor 100 has an effective pixel region of approximately 24 mm×16 mm, the number of pixels reaches as many as approximately 12 million.

When image sensors have high light collection efficiency and photoelectric conversion efficiency, the microlenses 101 may be omitted. Furthermore, in the case of back side illumination image sensors, the interconnection layer 105 is provided on the opposite side of the photoelectric converter elements 108. In addition, the color filters 102 and the aperture masks 103 can be integrally formed by allowing the openings 104 of the aperture masks 103 to have color components.

In the present embodiment, the aperture masks 103 are separately formed from the interconnections 106, but the function of the aperture masks 103 in the parallax pixels may be alternatively performed by the interconnections 106. In other words, defined opening shapes are formed by the interconnections 106 and limit the incident luminous flux to allow only particular partial luminous flux to pass to reach the photoelectric converter elements 108. In this case, the interconnections 106 forming the opening shapes are preferably positioned closest to the photoelectric converter elements 108 in the interconnection layer 105.

The aperture masks 103 may be formed by a transmission preventing film that is overlaid on the photoelectric converter elements 108. In this case, the aperture masks 103 are formed in such a manner that, for example, a SiN film and a $SiO_2$ film are sequentially stacked to form a transmission preventing film and regions corresponding to the openings 104 are removed by etching.

Figure 9:
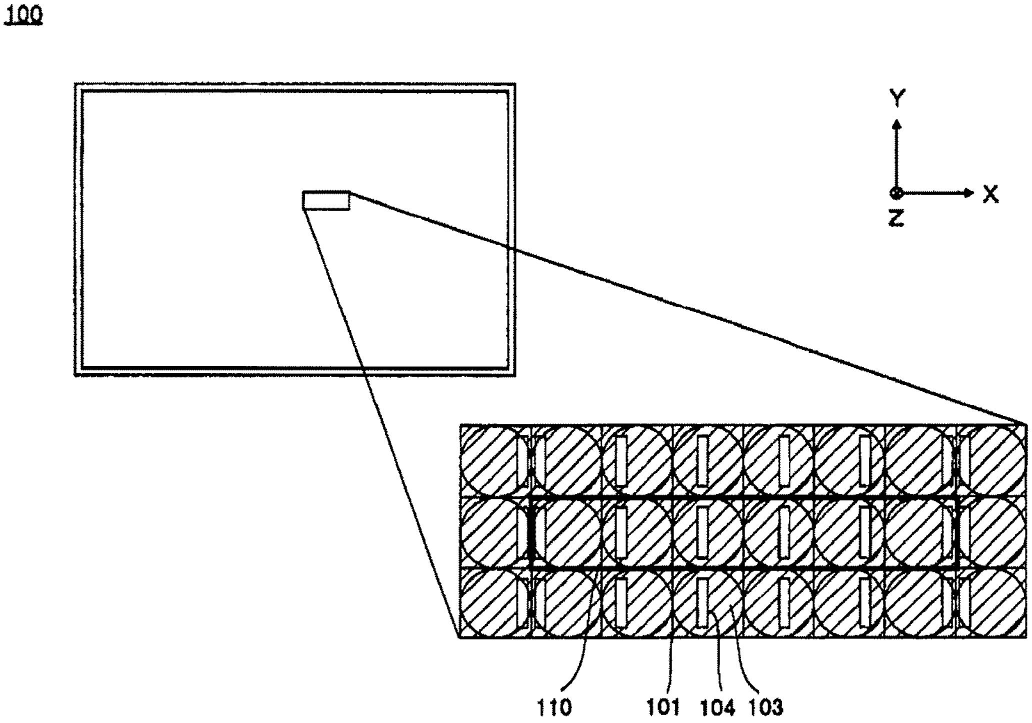
FIG. 9 schematically illustrates an enlarged portion of the image sensor.

The following describes the relation between the openings 104 of the aperture masks 103 and parallax caused. FIG. 9 schematically illustrates an enlarged portion of the image sensor 100. To simplify the description, the arrangement of the colors of the color filters 102 is not considered here, which will be mentioned later. In the following description where the arrangement of the colors of the color filters 102 is ignored, the image sensor 100 may be viewed as an image sensor that is constituted only by parallax pixels having the color filters 102 of the same color. Accordingly, the repeating pattern described in the following may be viewed as applied to the adjacent pixels among the color filters 102 of the same color.

As shown in FIG. 9, the openings 104 of the aperture masks 103 are shifted relative to the corresponding pixels. Furthermore, the openings 104 of the adjacent pixels are positioned differently from each other.

In the example shown in FIG. 9, six different types of aperture masks 103 are provided, in which the openings 104 are shifted in the left and right directions relative to the corresponding pixels. When the image sensor 100 as a whole is considered, photoelectric converter element groups, each of which has six parallax pixels having the aperture masks 103, are two-dimensionally and periodically arranged such that the openings 104 are shifted from left to right on the sheet of FIG. 9.

Figure 10A:
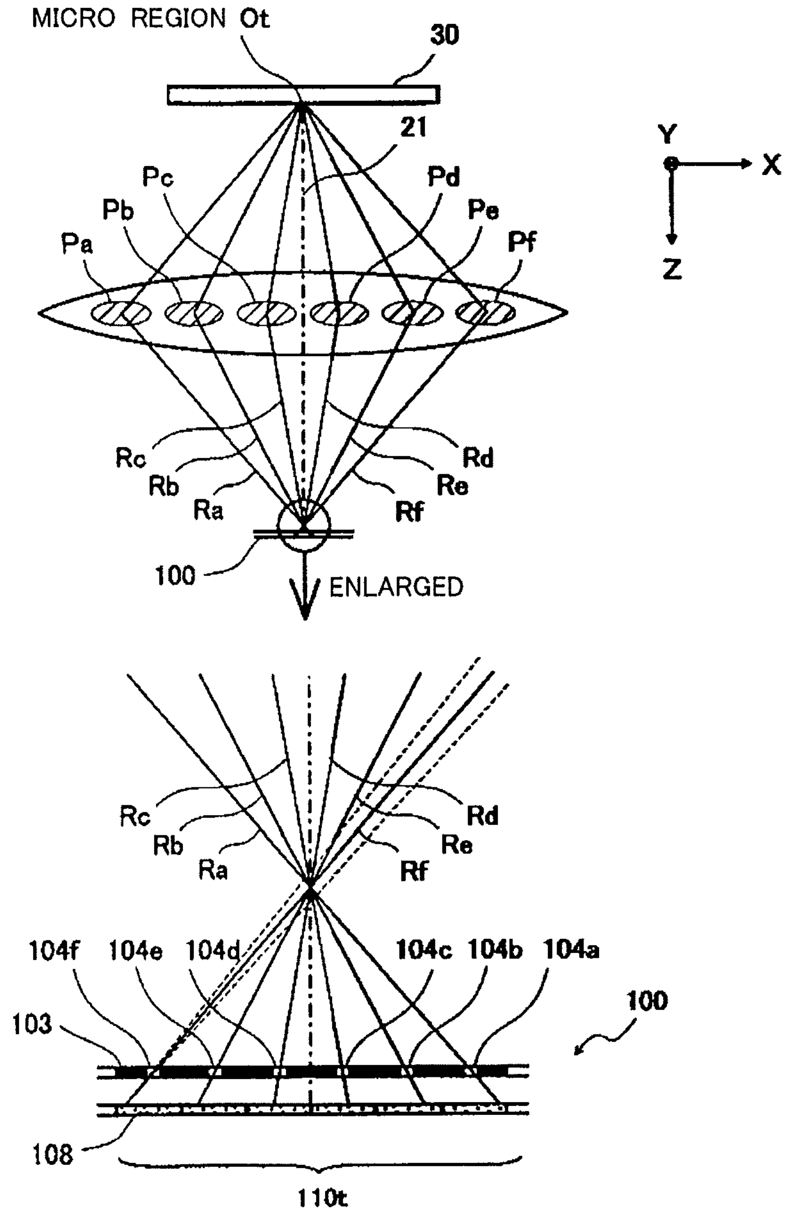
FIGS. 10A, 10B and 10C are conceptual views to illustrate the relation between a parallax pixel and a subject.
Figure 10B:
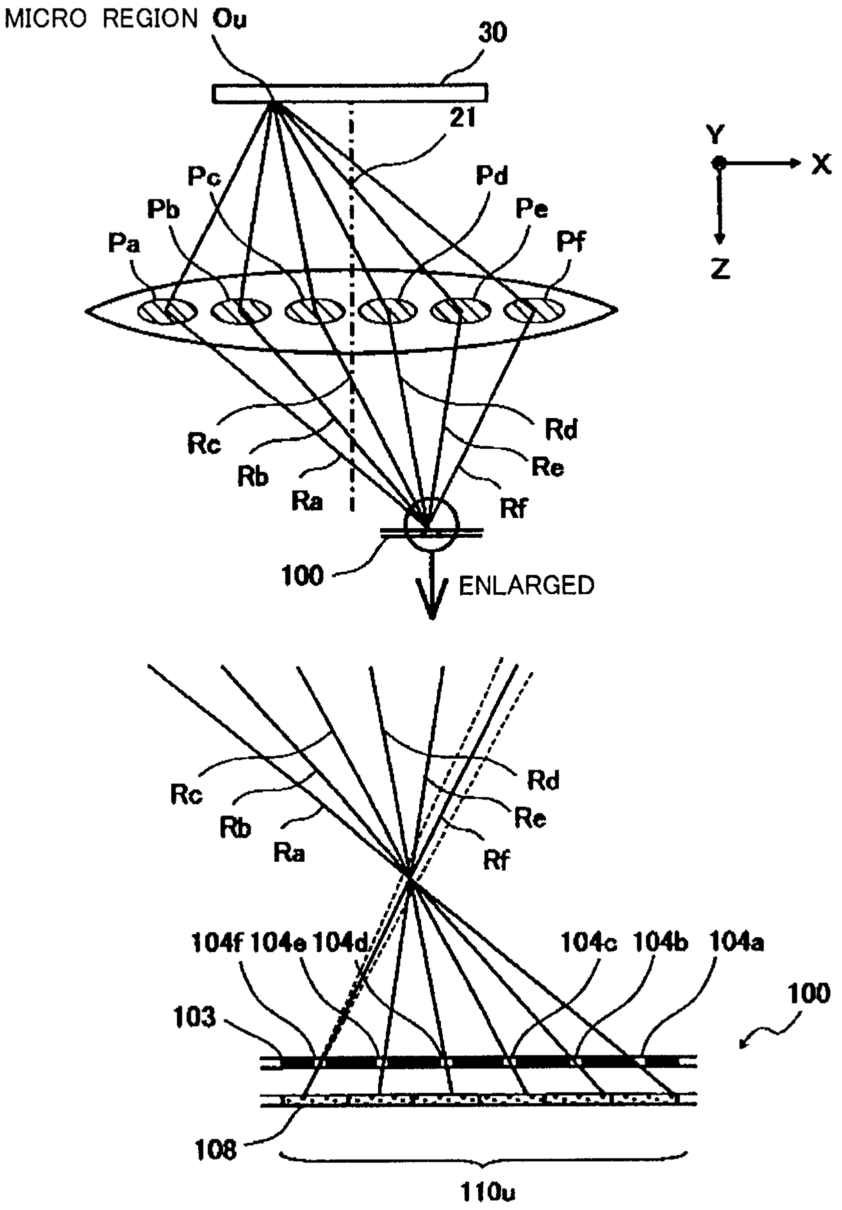
Figure 10C:
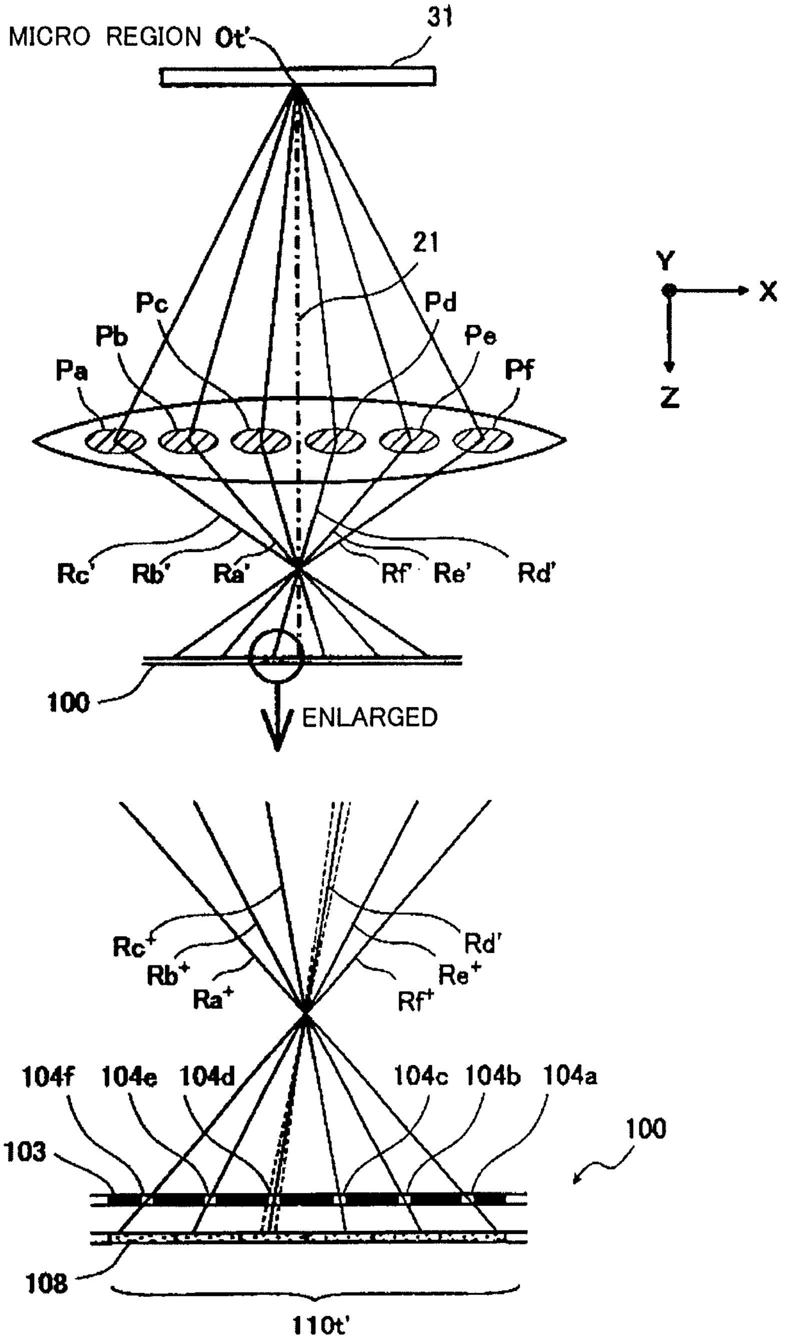

FIGS. 10A, 10B and 10C are each a conceptual diagram illustrating the relation between parallax pixels and a subject. To be specific, FIG. 10A illustrates a photoelectric converter element group having a repeating pattern 110*t* arranged at the center of the image sensor 100 through which the image-capturing optical axis 21 extends. FIG. 10B schematically illustrates a photoelectric converter element group having a repeating pattern 110*u* of the parallax pixels arranged in the peripheral portion of the image sensor 100. In FIGS. 10A and 10B, a subject 30 is positioned at a focus position relative to the image-capturing lens 20. FIG. 10C schematically illustrates the relation between the parallax pixels and the subject when a subject 31 at a non-focus position relative to the image-capturing lens 20 is captured, correspondingly to the relation shown in FIG. 10A.

The following first describes the relation between the parallax pixels and the subject when the image-capturing lens 20 captures the subject 30 at the focus position. The subject luminous flux is guided through the pupil of the image-capturing lens 20 to the image sensor 100. Here, six partial regions Pa to Pf are defined in the entire cross-sectional region through which the subject luminous flux transmits. For example, see the pixel, on the extreme left in the sheet of FIGS. 10A to 10C, of the photoelectric converter element groups having the repeating patterns 110*t* and 110*u*. The position of the opening 104*f* of the aperture mask 103 is defined so that only the subject luminous flux emitted from the partial region Pf reaches the photoelectric converter element 108 as seen from the enlarged view. Likewise, towards the pixel on the far right, the position of the opening 104*e* is defined so as to correspond to the partial region Pe, the position of the opening 104*d* is defined so as to correspond to the partial region Pd, the position of the openings 104*c* is defined so as to correspond to the partial region Pc, the position of the opening s104*b* is defined so as to correspond to the partial region Pb, and the position of the opening 104*a* is defined so as to correspond to the partial region Pa.

Stated differently, for example, the gradient of the main light ray Rf of the subject luminous flux (partial luminous flux) emitted from the partial region Pf, which is defined by the relative positions of the partial region Pf and the leftmost pixel, may determine the position of the opening 104*f*. When the photoelectric converter element 108 receives the subject luminous flux through the opening 104*f* from the subject 30 at the focus position, the subject luminous flux forms an image on the photoelectric converter element 108 as indicated by the dotted line. Likewise, toward the rightmost pixel, the gradient of the main light ray Re determines the position of the opening 104*e*, the gradient of the main light ray Rd determines the position of the opening 104*d*, the gradient of the main light ray Rc determines the position of the opening 104*c*, the gradient of the main light ray Rb determines the position of the opening 104*b*, and the gradient of the main light ray Ra determines the position of the opening 104*a*.

As shown in FIG. 10A, the luminous flux emitted from a micro region Ot of the subject 30 at the focus position, which coincides with the optical axis 21 on the subject 30, passes through the pupil of the image-capturing lens 20 and reaches the respective pixels of the photoelectric converter element group having the repeating pattern 110*t*. In other words, the pixels of the photoelectric converter element group having the repeating pattern 110*t* respectively receive the luminous flux emitted from the single micro region Ot through the six partial regions Pa to Pf. The micro region Ot has a certain spread that can accommodate the different positions of the respective pixels of the photoelectric converter element group having the repeating pattern 110*t*, but can be substantially approximated by substantially the same object point. Likewise, as shown in FIG. 10B, the luminous flux emitted from a micro region Ou of the subject 30 at the focus position, which is spaced away from the optical axis 21 on the subject 30, passes through the pupil of the image-capturing lens 20 to reach the respective pixels of the photoelectric converter element group having the repeating pattern 110*u*. In other words, the respective pixels of the photoelectric converter element group having the repeating pattern 110*u* respectively receive the luminous flux emitted from the single micro region Ou through the six partial regions Pa to Pf. Like the micro region Ot, the micro region Ou has a certain spread that can accommodate the different positions of the respective pixels of the photoelectric converter element group having the repeating pattern 110*u*, but can be substantially approximated by substantially the same object point.

That is to say, as long as the subject 30 is at the focus position, the photoelectric converter element groups capture different micro regions depending on the positions of the repeating patterns 110 on the image sensor 100, and the respective pixels of each photoelectric converter element group capture the same micro region through the different partial regions. In the respective repeating patterns 110, the corresponding pixels receive subject luminous flux from the same partial region. To be specific, in FIGS. 10A and 10B, for example, the leftmost pixels of the repeating patterns 110*t* and 110*u* receive the partial luminous flux from the same partial region Pf.

Strictly speaking, the position of the opening 104*f* of the leftmost pixel that receives the subject luminous flux from the partial region Pf in the repeating pattern 110*t* at the center through which the image-capturing optical axis 21 extends is different from the position of the opening 104*f* of the leftmost pixel that receives the subject luminous flux from the partial region Pf in the repeating pattern 110*u* at the peripheral portion. From the perspective of the functions, however, these openings can be treated as the same type of aperture masks in that they are both aperture masks to receive the subject luminous flux from the partial region Pf. Accordingly, in the example shown in FIGS. 10A to 10C, it can be said that each of the parallax pixels arranged on the image sensor 100 has one of the six types of aperture masks.

The following describes the relation between the parallax pixels and the subject when the image-capturing lens 20 captures the subject 31 at the non-focus position. In this case, the subject luminous flux from the subject 31 at the non-focus position also passes through the six partial regions Pa to Pf of the pupil of the image-capturing lens 20 to reach the image sensor 100. However, the subject luminous flux from the subject 31 at the non-focus position forms an image not on the photoelectric converter elements 108 but at a different position. For example, as shown in FIG. 10C, when the subject 31 is at a more distant position from the image sensor 100 than the subject 30 is, the subject luminous flux forms an image at a position closer to the subject 31 with respect to the photoelectric converter elements 108. On the other hand, when the subject 31 is at a position closer to the image sensor 100 than the subject 30 is, the subject luminous flux forms an image at a position on the opposite side of the subject 31 with respect to the photoelectric converter elements 108.

Accordingly, the subject luminous flux emitted from a micro region Ot' of the subject 31 at the non-focus position reaches the corresponding pixels of different repeating patterns 110 depending on which of the six partial regions Pa to Pf the subject luminous flux passes through. For example, the subject luminous flux that has passed through the partial region Pd enters the photoelectric converter element 108 having the opening 104*d* included in the repeating pattern 110*t*' as a main light ray Rd' as shown in the enlarged view of FIG. 10C. The subject luminous flux that has passed through the other partial regions may be emitted from the micro region Ot', but does not enter the photoelectric converter elements 108 included in the repeating pattern 110*t*' and enters the photoelectric converter elements 108 having the corresponding openings in different repeating patterns. In other words, the subject luminous fluxes that reach the respective photoelectric converter elements 108 constituting the repeating pattern 110*t*' are subject luminous fluxes emitted from different micro regions of the subject 31. To be specific, the subject luminous flux having the main light ray Rd' enters the photoelectric converter element 108 corresponding to the opening 104*d*, and the subject luminous fluxes having the main light rays $Ra^+$, $Rb^+$, $Rc^+$, $Re^+$, $Rf^+$, which are emitted from different micro regions of the subject 31, enter the photoelectric converter elements 108 corresponding to the other openings 104. The same relation is also seen in the repeating pattern 110*u* arranged in the peripheral portion shown in FIG. 10B.

Here, when the image sensor 100 is seen as a whole, for example, a subject image A captured by the photoelectric converter element 108 corresponding to the opening 104*a* and a subject image D captured by the photoelectric converter element 108 corresponding to the opening 104*d* match with each other if they are images of the subject at the focus position, and do not match with each other if they are images of the subject at the non-focus position. The direction and amount of the non-match are determined by on which side the subject at the non-focus position is positioned with respect to the focus position, how much the subject at the non-focus position is shifted from the focus position, and the distance between the partial region Pa and the partial region Pd. Stated differently, the subject images A and D are parallax images causing parallax therebetween. This relation also applies to the other openings, and six parallax images are formed corresponding to the openings 104*a* to 104*f*.

Accordingly, a collection of outputs from the corresponding pixels in different ones of the repeating patterns 110 configured as described above produces a parallax image. To be more specific, the outputs from the pixels that have received the subject luminous flux emitted from a particular partial region of the six partial regions Pa to Pf form a parallax image.

Figure 11:
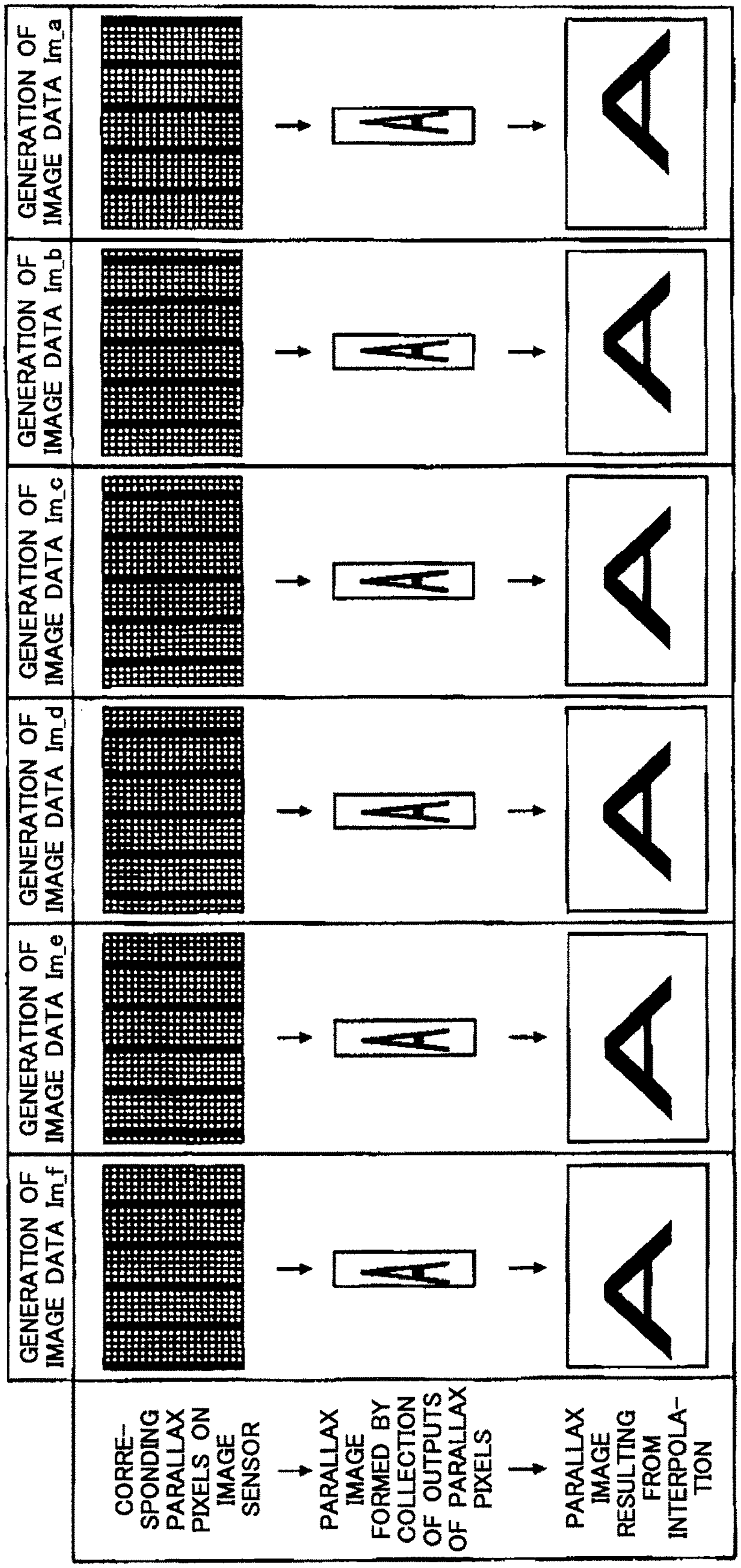
FIG. 11 is a conceptual view to illustrate how to produce a parallax image.

FIG. 11 is a conceptual diagram to illustrate an operation to produce a parallax image. FIG. 11 shows, from left to right, how parallax image data Im_f is produced by collecting the outputs from the parallax pixels corresponding to the openings 104*f*, how parallax image data Im_e is produced from the outputs of the parallax pixels corresponding to the openings 104*e*, how parallax image data Im_d is produced from the outputs of the parallax pixels corresponding to the openings 104*d*, how parallax image data Im_c is produced from the outputs of the parallax pixels corresponding to the openings 104*c*, how parallax image data Im_b is produced from the outputs of the parallax pixels corresponding to the openings 104*b*, and how parallax pixel data Im_a is produced from the outputs from the parallax pixels corresponding to the openings 104*a*. The following first describes how parallax image data Im_f is produced by collecting the outputs from the parallax pixels corresponding to the openings 104*f*.

The repeating patterns 110 each of which has a photoelectric converter element group constituted by a group of six parallax pixels are arranged side-by-side. Accordingly, on the hypothetical image sensor 100 excluding no-parallax pixels, the parallax pixels having the openings 104*f* are found every six pixels in the horizontal direction and consecutively arranged in the vertical direction. These pixels receive subject luminous fluxes from different micro regions as described above. Therefore, parallax images can be obtained by collecting and arranging the outputs from theses parallax pixels.

However, the pixels of the image sensor 100 of the present embodiment are square pixels. Therefore, if the outputs are simply collected, the number of pixels in the horizontal direction is reduced to one-sixth and vertically long image data is produced. To address this issue, interpolation is performed to increase the number of pixels in the horizontal direction six times. In this manner, the parallax image data Im_f is produced as an image having the original aspect ratio. Note that, however, the horizontal resolution is lower than the vertical resolution since the parallax image data before the interpolation represents an image whose number of pixels in the horizontal direction is reduced to one-sixth. In other words, the number of pieces of parallax image data produced is inversely related to the improvement of the resolution. The interpolation applied in the present embodiment will be specifically described later.

In the similar manner, parallax image data Im_e to parallax image data Im_a are obtained. Stated differently, the digital camera 10 can produce parallax images from six different viewpoints with horizontal parallax.

In the case of the above-described monochrome 6-viewpoint parallax scheme, the method to handle the parallax elimination and the variance in illuminance to produce the no-parallax 2D intermediate image can be developed from the method described in the third embodiment. To be more specific, an arithmetic average is calculated between Im_f and Im_a to eliminate the parallax. The resulting image data is referred to as Im_af. In the same manner, the resulting image data obtained by calculating an arithmetic average between Im_e and Im_b is referred to as Im_be. Furthermore, the resulting image data obtained by calculating an arithmetic average between Im_d and Im_c is referred to as Im_cd. To match the illuminance levels of these three images having the parallax being eliminated to each other, an arithmetic average is calculated among the three images to produce a final output image Im_out. Here, Im_out=Im_af+Im_be+Im_cd)/3. The output image Im_out obtained in the above-described manner is a no-parallax 2D image having the influence of the variance in illuminance being eliminated and a subject image that has a wide blur width equal to the sum of the blur widths corresponding to six different viewpoints or the same blur width as the image captured by a non-parallax pixel having a full-open mask.

<Additional Description About the First Embodiment>

Figure 12:
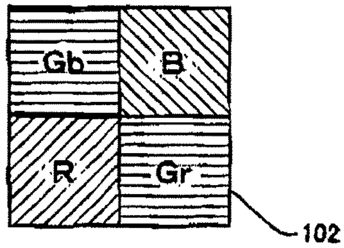
FIG. 12 illustrates a Bayer arrangement.

The following describes the color filters 102 and parallax images. FIG. 12 illustrates a Bayer arrangement. As shown in FIG. 12, green filters are assigned to the two pixels, i.e., the upper-left and lower right pixels, a red filter is assigned to one pixel, i.e., the lower left pixel, and a blue filter is assigned to one pixel, i.e., an upper right pixel in the Bayer arrangement. Here, the upper left pixel with the green filter is referred to as a Gb pixel, and the lower right pixel with the green filter is referred to as a Gr pixel. The pixel with the red filter is referred to as a R pixel, and the pixel with the blue filter is referred to as a B pixel. The horizontal direction in which the Gb pixel and the B pixel are arranged next to each other is referred to as a Gb row, and the horizontal direction in which the R pixel and the Gr pixel are arranged next to each other is referred to as a Gr row. The vertical direction in which the Gb pixel and the R pixel are arranged next to each other is referred to as a Gb column, and the vertical direction in which the B pixel and the Gr pixel are arranged next to each other is referred to as a Gr column.

Based on such an arrangement of the color filters 102, an enormous number of different repeating patterns 110 can be defined depending on to what colors the parallax and no-parallax pixels are allocated and how frequently parallax and no-parallax pixels are allocated. For example, if a large number of no-parallax pixels are allocated, high-resolution 2D image data can be obtained. Furthermore, if no-parallax pixels are equally allocated to the R, G and B pixels, high-quality 2D image data with a little color shift can be obtained. In this case, however, note that the parallax pixels are relatively fewer and a resulting 3D image, which is constituted by a plurality of parallax images, has degraded image quality. On the other hand, if a large number of parallax pixels are allocated, high-resolution 3D image data is obtained. Furthermore, if parallax pixels are equally allocated to the R, G and B pixels, high-quality 3D color image data with excellent color reproducibility can be obtained. In this case, however, note that the no-parallax pixels are relatively fewer, a low-resolution 2D image is output.

While considering such a trade-off, repeating patterns 110 having various characteristics are defined depending on which pixels are parallax or no-parallax pixels. When two types of parallax pixels are allocated in a repeating pattern 110, for example, each parallax pixel can be assumed to be one of a parallax Lt pixel having an opening 104 shifted to the left with respect to the center and a parallax Rt pixel having an opening 104 shifted to the right with respect to the center. Thus, these parallax pixels output parallax images from two different viewpoints, which realizes so-called stereoscopic view.

Figure 13A:
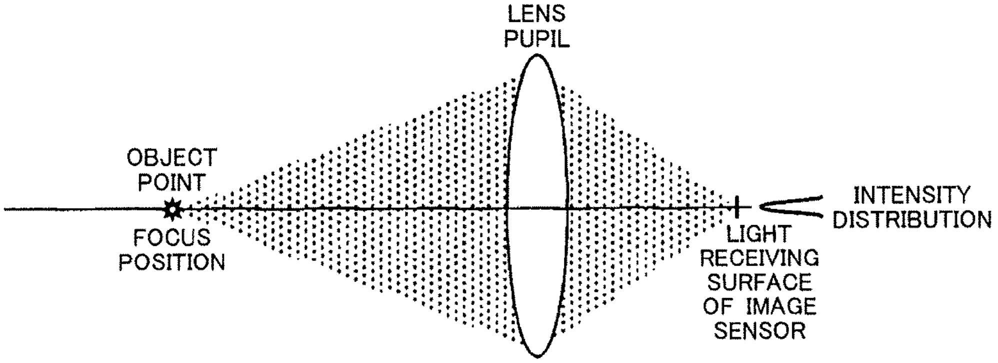
FIGS. 13A, 13B and 13C illustrate the concept of defocusing for a no-parallax pixel.
Figure 13B:
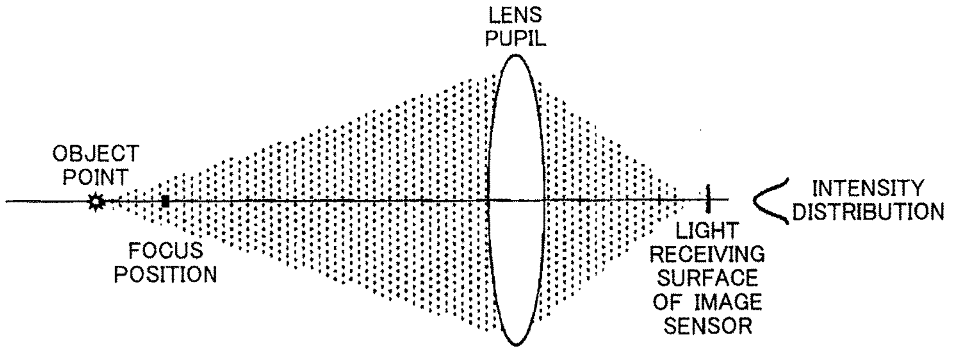
Figure 13C:
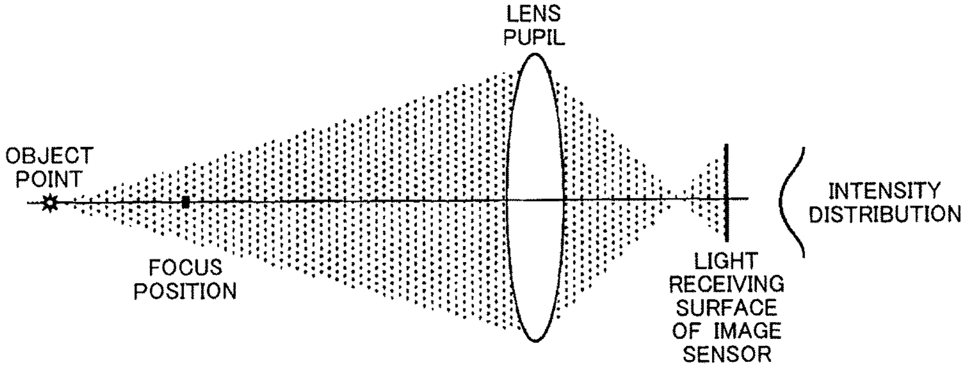

The following describes the concept of defocusing in the case where the parallax Lt pixel and the parallax Rt pixel receive light. To start with, the concept of defocusing for no-parallax pixels is briefly discussed. FIGS. 13A, 13B and 13C are used to illustrate the concept of defocusing for no-parallax pixels. As shown in FIG. 13A, when an object point, which is a subject, is at a focus position, the subject luminous flux that passes through a lens pupil and reaches the light receiving surface of an image sensor exhibits a steep optical intensity distribution having the pixel of the corresponding image point at the center. In other words, if a no-parallax pixel that receives the entire effective luminous flux passing through the lens pupil is arranged in the vicinity of the image point, the pixel corresponding to the image point has the highest output value and the surrounding pixels have radically lowered output values.

On the other hand, as shown in FIG. 13B, when the object point is off the focus position, the subject luminous flux exhibits a less steep optical intensity distribution at the light receiving surface of the image sensor, when compared with the case where the object point is at the focus position. Stated differently, such a distribution is observed that the pixel of the corresponding image point has a lowered output value, and more surrounding pixels have output values.

When the object point is further off the focus position as shown in FIG. 13C, the subject luminous flux exhibits a further less steep optical intensity distribution at the light receiving surface of the image sensor. Stated differently, such a distribution is observed that the pixel of the corresponding image point has a further lowered output value, and further more surrounding pixels have output values.

Figure 14A:
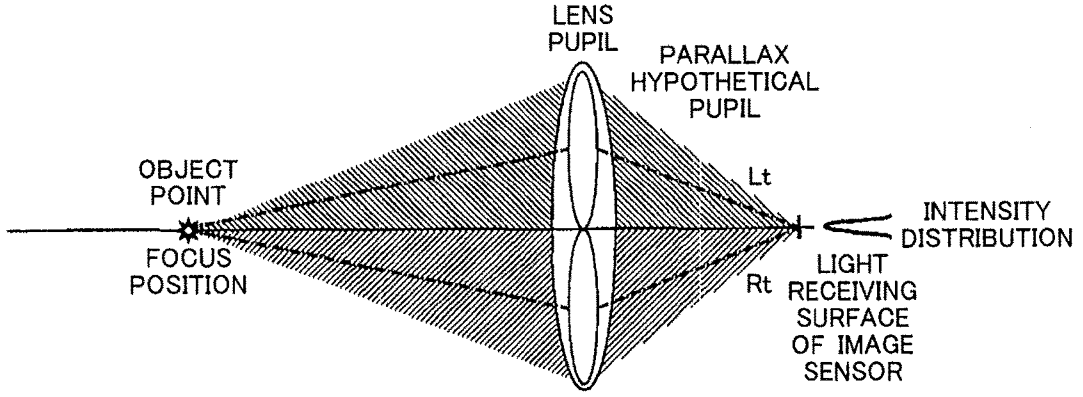
FIGS. 14A, 14B and 14C illustrate the concept of defocusing for a parallax pixel.
Figure 14B:
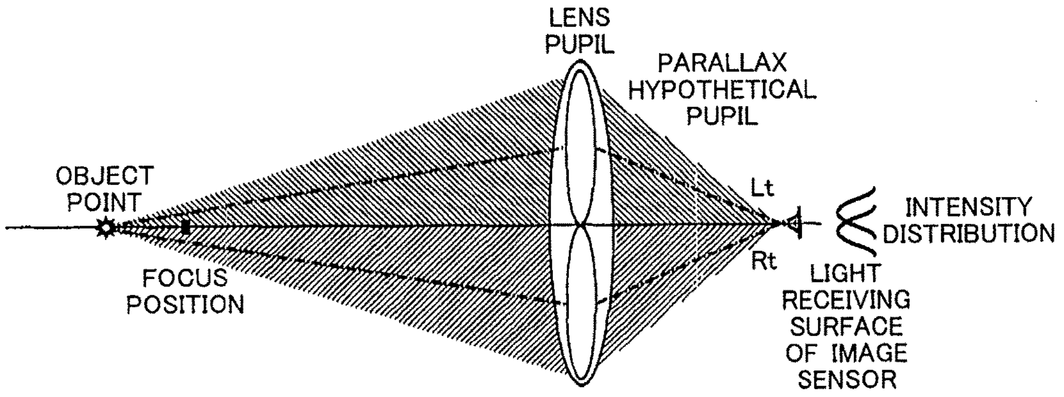
Figure 14C:
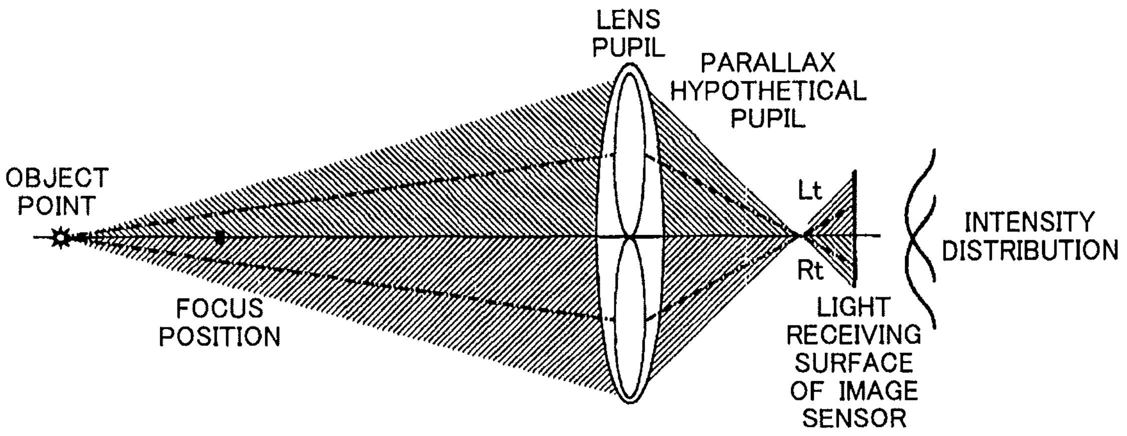

FIGS. 14A to 14C illustrate the concept of defocusing for parallax pixels. A parallax Lt pixel and a parallax Rt pixel receive subject luminous fluxes from two parallax hypothetical pupils that are set symmetrically with respect to the optical axis as the partial regions of a lens pupil.

When an object point, which is a subject, is at a focus position as shown in FIG. 14A, both of the subject luminous flux passing through the respective parallax hypothetical pupils exhibit a steep optical intensity distribution having the pixel of the corresponding image point at the center. If the parallax Lt pixel is arranged in the vicinity of the image point, the pixel corresponding to the image point has the highest output value and the surrounding pixels have radically lowered output values. If the parallax Rt pixel is arranged in the vicinity of the image point, the pixel corresponding to the image point also has the highest output value and the surrounding pixels also have radically lowered output values. Thus, irrespective of which of the parallax hypothetical pupils the subject luminous flux passes through, such a distribution is observed that the pixel corresponding to the image point has the highest output value and the surrounding pixels have radically lowered output values, and the respective distributions match with each other.

On the other hand, if the object point is off the focus position as shown in FIG. 14B, the peak of the optical intensity distribution exhibited by the parallax Lt pixel appears at a position shifted in one direction from the pixel corresponding to the image point and has a lowered output value, when compared with the case where the object point is at the focus position. Furthermore, more pixels have output values. The peak of the optical intensity distribution exhibited by the parallax Rt pixel appears at a position shifted, from the pixel corresponding to the image point, in the opposite direction by the same distance to the peak of the optical intensity distribution exhibited by the parallax Lt pixel and has a lowered output value in a similar manner. Likewise, more pixels have output values. Thus, the identical optical intensity distributions that are less steep than the case where the object point is at the focus position are spaced away by the same distance from the pixel corresponding to the image point. When the object point is further off the focus position as shown in FIG. 14C, the identical optical intensity distributions that are further less steep are further spaced away from the pixel corresponding to the image point when compared with the case shown in FIG. 14B. To sum up, as the object point is shifted away from the focus position, the amount of blur and the disparity increase.

Figure 15A:
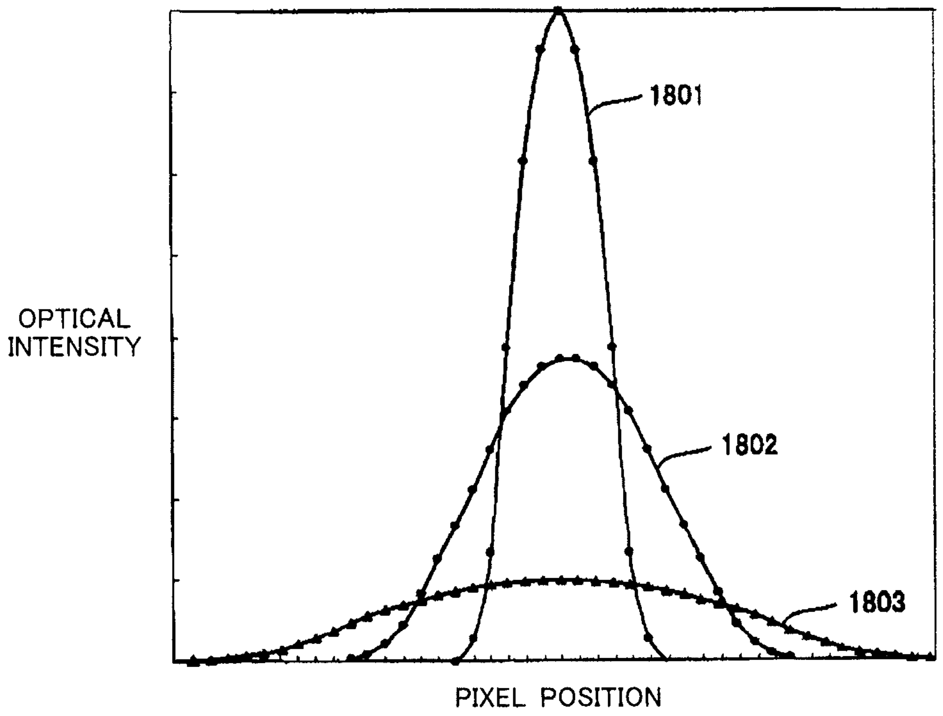
FIGS. 15A and 15B illustrate optical intensity distributions for a no-parallax pixel and a parallax pixel.
Figure 15B:
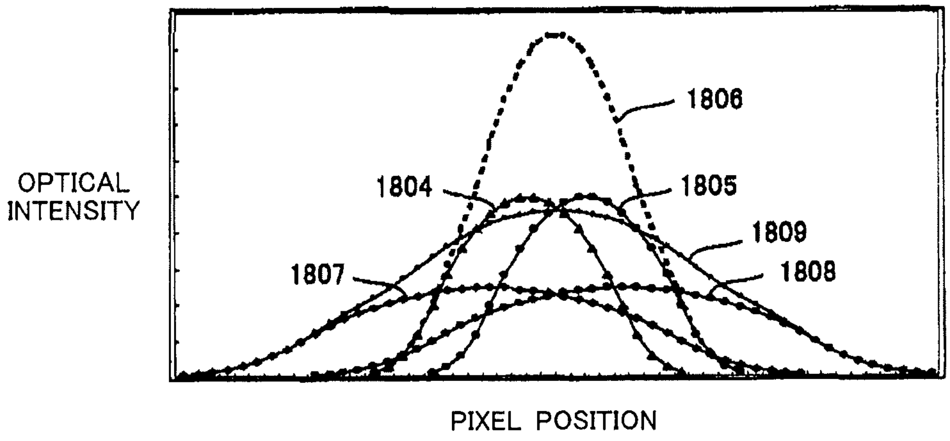

The change in optical intensity distribution illustrated in FIGS. 13A to 13C and the change in optical intensity distribution illustrated in FIGS. 14A to 14C are respectively represented by graphs in FIGS. 15A and 15B. In FIGS. 15A and 15B, the horizontal axis represents the pixel position and the center position represents the pixel position corresponding to the image point. In addition, the vertical axis represents the output value of each pixel, which is substantially in proportion to the optical intensity and thus represented as the optical intensity in FIGS. 15A and 15B.

FIG. 15A is a graph showing the change in optical intensity distribution illustrated in FIGS. 13A to 13C. A distribution curve 1801 represents the optical intensity distribution corresponding to FIG. 13A and the most steep case. A distribution curve 1802 represents the optical intensity distribution corresponding to FIG. 13B, and a distribution curve 1803 represents the optical intensity distribution corresponding to FIG. 13C. When the distribution curves 1802 and 1803 are compared with the distribution curve 1801, it can be seen that the peak value gradually drops and the distribution broadens.

FIG. 15B is a graph showing the change in optical intensity distribution illustrated in FIGS. 14A to 14C. Distribution curves 1804 and 1805 respectively represent the optical intensity distributions of the parallax Lt and Rt pixels shown in FIG. 14B. As seen from FIG. 15B, these distributions are line-symmetrically shaped with respect to the center position. A composite distribution curve 1806 resulting from adding these distributions together is similarly shaped to the distribution curve 1802 corresponding to the case of FIG. 13B, which shows a similar defocused state to FIG. 14B.

Distribution curves 1807 and 1808 respectively represent the optical intensity distributions of the parallax Lt and Rt pixels shown in FIG. 14C. As seen from FIG. 15B, these distributions are also line-symmetrically shaped with respect to the center position. A composite distribution curve 1809 resulting from adding these distributions together is similarly shaped to the distribution curve 1803 corresponding to the case of FIG. 13C, which shows a similar defocused state to FIG. 14C.

Figure 16A:
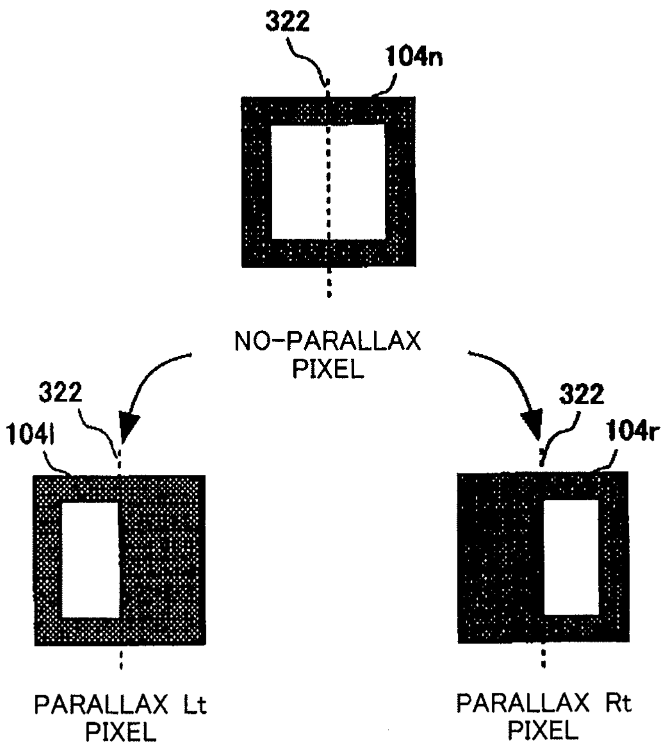
FIGS. 16A, 16B, 16C and 16D illustrate the shape of an opening 104 when there are two types of parallax pixels.

FIGS. 16A to 16D illustrate the shapes of the openings 104 when there are two types of parallax pixels. FIG. 16A shows an example where the shape of an opening 104l of a parallax Lt pixel and the shape of an opening 104*r* of a parallax Rt pixel are the same as the shapes obtained by dividing the shape of an opening 104*n* of a no-parallax pixel along a center line 322. In other words, in the example shown in FIG. 16A, the area of the opening 104*n* of the no-parallax pixel is equal to the sum of the area of the opening 104l of the parallax Lt pixel and the area of the opening 104*r* of the parallax Rt pixel. In the present embodiment, the opening 104*n* of the no-parallax pixel is referred to as a full-open opening, and the openings 104l and 104*r* are referred to as half-open openings. When an opening is positioned at the center of a photoelectric converter element, the opening is referred to as facing in a reference direction. The opening 104l of the parallax Lt pixel and the opening 104*r* of the parallax Rt pixel are displaced in opposite directions to each other with respect to the hypothetical center line 322 coinciding with the center (pixel center) of the corresponding photoelectric converter elements 108. Thus, the opening 104l of the parallax Lt pixel and the opening 104*r* of the parallax Rt pixel respectively cause parallax in one direction with respect to the reference direction and in the opposite direction to the one direction.

Figure 16B:
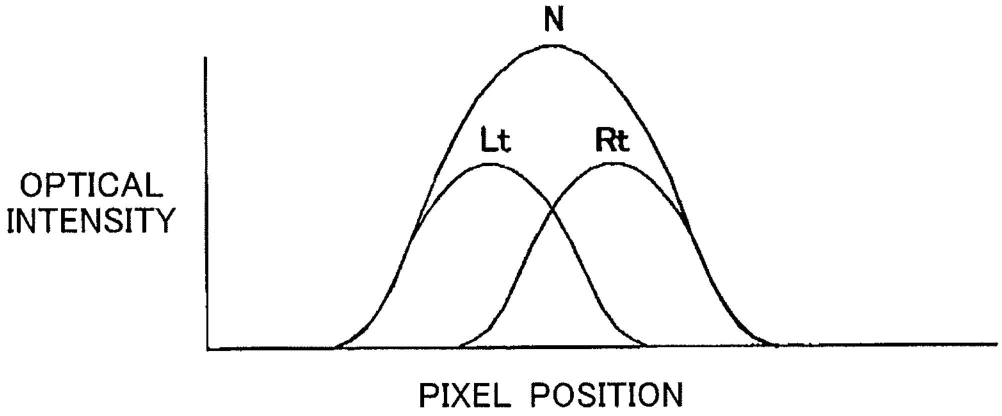

FIG. 16B shows the optical intensity distributions of the pixels having the openings shown in FIG. 16A, observed when the object point is off the focus position. In FIG. 16B, a curve Lt corresponds to the distribution curve 1804 of FIG. 15B and a curve Rt corresponds to the distribution curve 1805 of FIG. 15B. A curve N corresponds to a no-parallax pixel and is similarly shaped to the composite distribution curve 1806 of FIG. 15B. The openings 104*n*, 104l and 104*r* serve as an aperture stop. Thus, the blur width of the no-parallax pixel having the opening 104*n* whose area is twice as large as the opening 104l (opening 104*r*) is approximately the same as the blur width of the curve that is resulting from adding together the curves of the parallax Lt and Rt pixels and shown by the composite distribution curve 1806 of FIG. 15B.

Figure 16C:
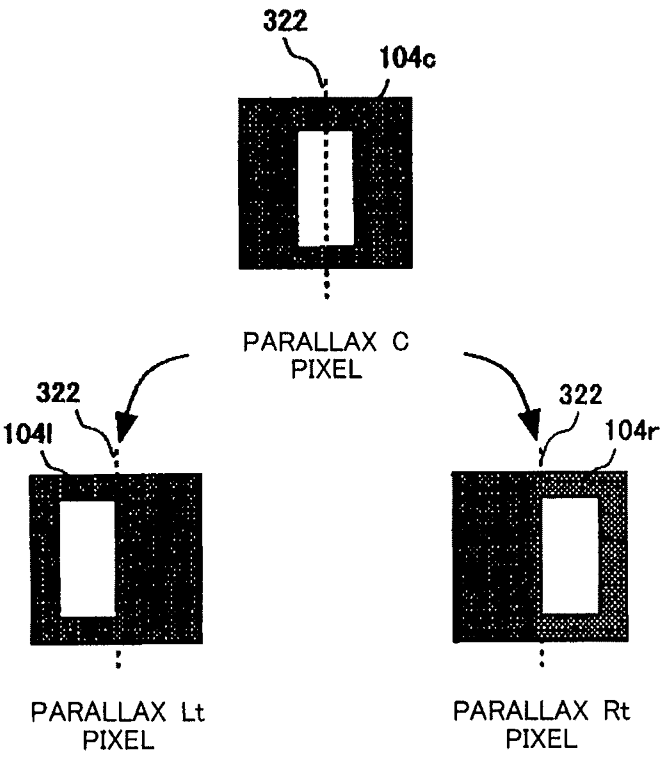

FIG. 16C shows an example where the shape of the opening 104l of the parallax Lt pixel, the shape of the opening 104*r* of the parallax Rt pixel and the shape of the opening 104*c* of the parallax C pixel are all the same. Here, the parallax C pixel means a pixel without eccentricity. Strictly speaking, the parallax C pixel is a parallax pixel that outputs a parallax image, considering the fact that the parallax C pixel guides to the photoelectric converter element 108 only the subject luminous flux whose corresponding partial region is the center portion of the pupil. However, a no-parallax pixel is defined herein as a pixel having an opening corresponding to the reference direction. Thus, the parallax C pixel shown in FIG. 16C that has an opening at the center of a photoelectric converter element in the reference direction like the no-parallax pixel shown in FIG. 16A is referred to as a no-parallax pixel. The openings 104l, 104*r* and 104*c* have half the area of the opening 104*n* shown in FIG. 16A. Like the case shown in FIG. 16A, the openings 104l and 104*r* are in contact with the hypothetical center line 322 coinciding with the center (pixel center) of the photoelectric converter element 108.

Figure 16D:
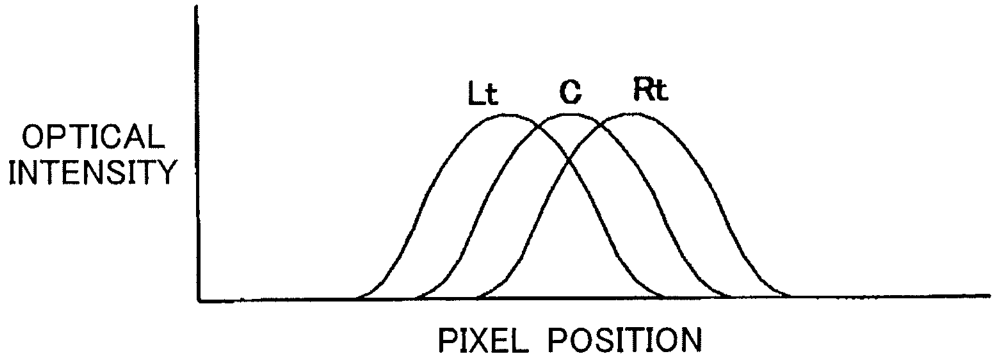

FIG. 16D shows the optical intensity distribution of the pixels having the respective openings shown in FIG. 16C, observed when the object point is off the focus point. In FIG. 16D, a curve Lt corresponds to the distribution curve 1804 of FIG. 15B, and a curve Rt corresponds to the distribution curve 1805 of FIG. 15B. In addition, the openings 104*c*, 104l and 104*r* serve as an aperture stop. Accordingly, the blur width of the parallax C pixel that has the opening 104*c* having the same shape and area as the opening 104l or 104*r* is approximately the same as the blur with of the parallax Lt or Rt pixel.

Figure 17:
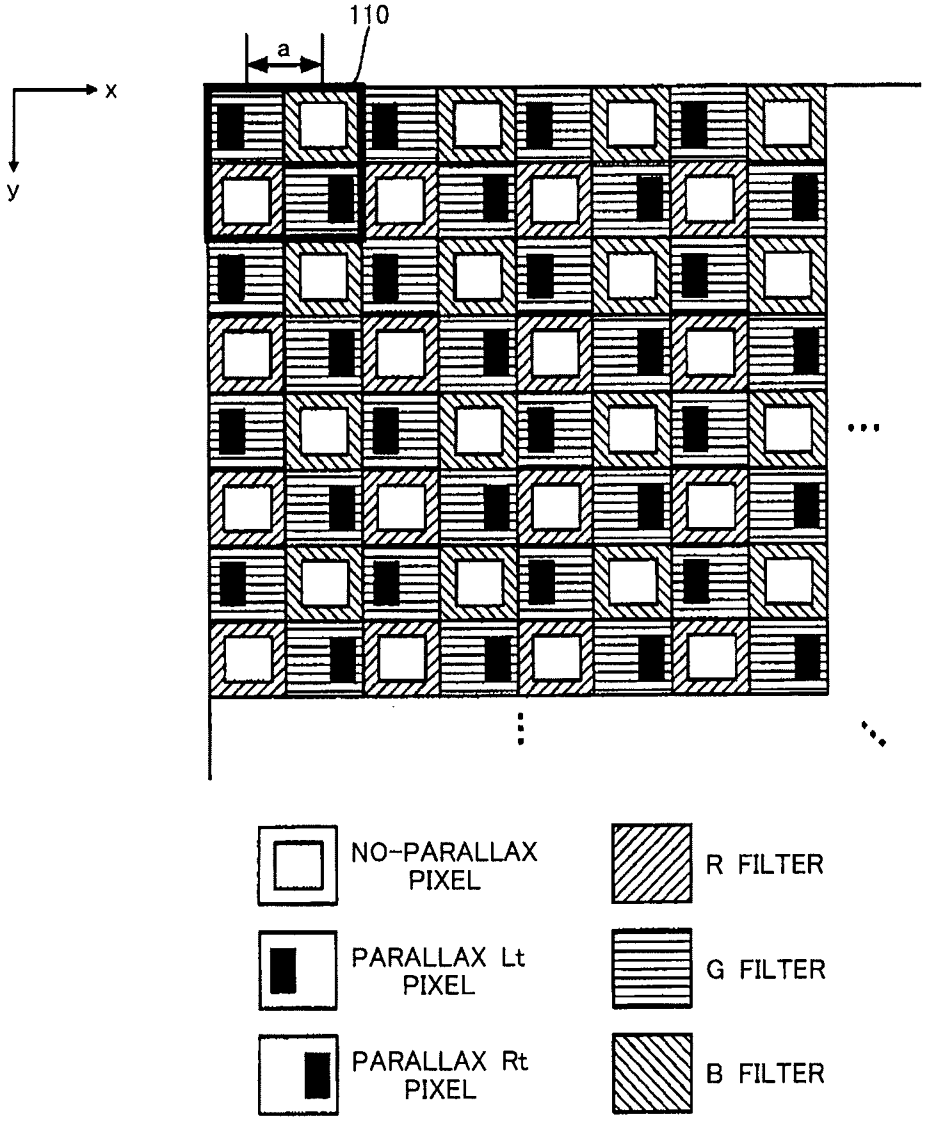
FIG. 17 illustrates one example of a repeating pattern 110 when there are two types of parallax pixels.

FIG. 17 illustrates an exemplary repeating pattern 110 when there are two types of parallax pixels. The coordinate system of the digital camera 10 is defined by the X, Y and Z axes. In the image sensor 100, however, the left most and uppermost pixel is used as a reference, and the right direction is defined as an x axis and the downward direction is defined as a y axis. In the example shown in FIG. 17, four pixels constitute a repeating pattern 110 like the Bayer arrangement. The repeating patterns 110 are arranged periodically horizontally and vertically within the effective pixel region of the image sensor 100. Thus, the primitive lattice of the image sensor 100 is the repeating pattern 110 bounded by the thick solid line in FIG. 17. The R and B pixels are no-parallax pixels, the Gb pixel is allocated to the parallax L pixel and the Gr pixel is allocated to the parallax R pixel. In this case, the openings 104 are determined in such a manner that the parallax Lt and Rt pixels in the same repeating pattern 110 can receive the luminous flux emitted from the same micro region when a subject is at the focus position. In this example, as described with reference to FIG. 16A, the no-parallax pixels have full-open openings and the parallax Lt and Rt pixels have half-open openings. The pixel pitch is denoted by a.

In the example shown in FIG. 17, since the Gb and Gr pixels, which are green pixels having high visual sensitivity, are used as the parallax pixels, the image sensor 100 can be expected to produce high-contrast parallax images. In addition, since the Gb and Gr pixels, which are both green pixels, are used as parallax pixels, it is easy to convert the two outputs into no-parallax outputs. Furthermore, the image sensor 100 can produce high-quality 2D image data based on the combination of the converted no-parallax outputs and the outputs from the R and B pixels, which are no-parallax pixels. Although described in detail later, in the present embodiment, color image data of left and right viewpoints is obtained through relatively simple processing based on conversion, as hypothetical outputs of parallax Lt and Rt pixels having one of R, G and B color filters, which actually do not exist as the pixels of the image sensor 100.

FIG. 1B illustrates the spatial-frequency resolution of the image captured by the image sensor employing the repeating pattern 110 shown in FIG. 17. In FIG. 1B, the spatial-frequency resolution is represented by the k-space of the wave number of $k=2\pi f$, where f denotes the frequency. The frequency resolution region is represented by a first Brillouin zone representative of a Wigner-Seitz cell of the reciprocal lattice space.

When a denotes the pixel pitch as discussed above, the captured image has a resolving power within the range of the Nyquist frequency $k_x=[-\pi/a,+\pi/a]$, $k_y=[-\pi/a,-\pi/a]$, which is bounded by the dotted line, if no color filters and no aperture masks are arranged. Thus, the range bounded by the dotted line represents the resolution limit frequency of the image. In the present embodiment, however, color filters and aperture masks are overlaid on a single sensor surface. Since a single sensor surface can only produce a predetermined amount of information, allocating different functions to the respective pixels means that each pixel produces a reduced amount of information. For example, the aperture masks form parallax pixels, which reduces the relative number of no-parallax pixels and thus decreases the information provided by the no-parallax pixels. The same applies to the color filters. Since the pixels are divided into three groups of R, G and B, each pixel provides less information.

Accordingly, when it comes to an image of a particular color produced by a pixel with a particular aperture mask, the resolution limit frequency of the image does not reach the original Nyquist frequency of the image. To be specific, as shown in FIG. 1B, the G component image $G_{Lt}$ of the left viewpoint, for example, only has the resolving power within the range of $k_x=[-\pi/(2a),+\pi/(2a)$, $k_y=[-\pi/(2a),+\pi/(2a)]$, which is only half the region of the original Nyquist frequency in both of the $k_x$ and $k_y$ axes. The same applies to the G component image $G_{Rt}$ of the right viewpoint, the R component no-parallax image $R_N$ of the middle viewpoint, and the B component no-parallax image $B_N$ of the middle viewpoint.

Therefore, if no solutions are developed, the RGB color image of the left viewpoint and the RGB color image of the right viewpoint may be produced but the resolving power of these images are only within the range of $k_x=[-\pi/(2a),+\pi/(2a)$, $k_y=[-\pi/(2a),+\pi/(2a)]$. Thus, these images are supposed to have but does not actually have the resolving power within the range of the Nyquist frequency $k_x=[-\pi/a,+\pi/a]$, $k_y[-\pi/a,-\pi/a]$.

In the present embodiment, the image processor 205 performs operations to enhance the resolution in order to complement the reduced information of each pixel due to the allocation of different functions to the respective pixels. To be specific, the $G_{Lt}$ and $G_{Rt}$ pixels, which are parallax pixels, are hypothetically replaced with no-parallax pixels $G_N$, to form a Bayer arrangement of no-parallax pixels only. In this way, the existing Bayer interpolation technique can be used to produce, as a no-parallax intermediate image, a color image having the resolving power within the range of the original Nyquist frequency $k_x=[-\pi/a,+\pi/a]$, $k_y=[-\pi/a,-\pi/a]$. Subsequently, the image of the left viewpoint, which only has a low resolving power in the frequency space, is superimposed on the no-parallax intermediate image, such that a color image of the left viewpoint having the resolving power within the range of the original Nyquist frequency can be finally produced. The same applies to a color image of the right viewpoint.

The pixels of the pixel array shown in FIG. 17 are characterized by various combinations of whether they are parallax or no-parallax pixels, which is determined by the openings 104, and whether they are R, G or B pixels, which is determined by the color filters 102. Accordingly, simply arranging the outputs of the image sensor 100 in accordance with its pixel arrangement does not provide image data representing a particular image. In other words, grouping and collecting the outputs from the pixels of the image sensor 100 for each group of pixels with the same characteristic can provide image data representing an image having the characteristic. For example, as has been described with reference to FIG. 11, grouping and collecting the outputs from the parallax pixels according to the types of their openings can provide a plurality of pieces of parallax image data that have parallax therebetween. Here, the image data obtained by grouping and collecting the outputs from the pixels for each group of the pixels having the same characteristic is referred to as plane data.

The image processor 205 receives mosaic image data $M_{mosaic}$ (x,y), which is raw original image data in which the output values of the pixels of the image sensor 100 are arranged in the order of the pixel arrangement of the image sensor 100. Here, a mosaic image means an image each pixel of which lacks at least one of the R, G and B information, and mosaic image data means the data forming the mosaic image. Note that, however, an image each pixel of which lacks at least one of the R, G and B information may not be treated as a mosaic image when the image is not treated as an image, for example, when the image data is constituted by pixel values of monochromatic pixels. Here, an output value is a linear gray level value in proportion to the amount of light received by each of the photoelectric converter elements of the image sensor 100.

In the present embodiment, the image processor 205 performs, at this stage, gain correction to equalize the brightness between the left and right pixels as a whole. The difference between the illuminance of the light incident on the left parallax pixel and the illuminance of the light incident on the right parallax pixel increases not only the relative difference in distribution between the left and right pixels but also the difference in average signal level between the entire left and right images, as the aperture stop is stopped down. In the present embodiment, the gain correction to equalize the brightness levels between the left and right pixels as a whole is referred to as global gain correction.

Figure 18:
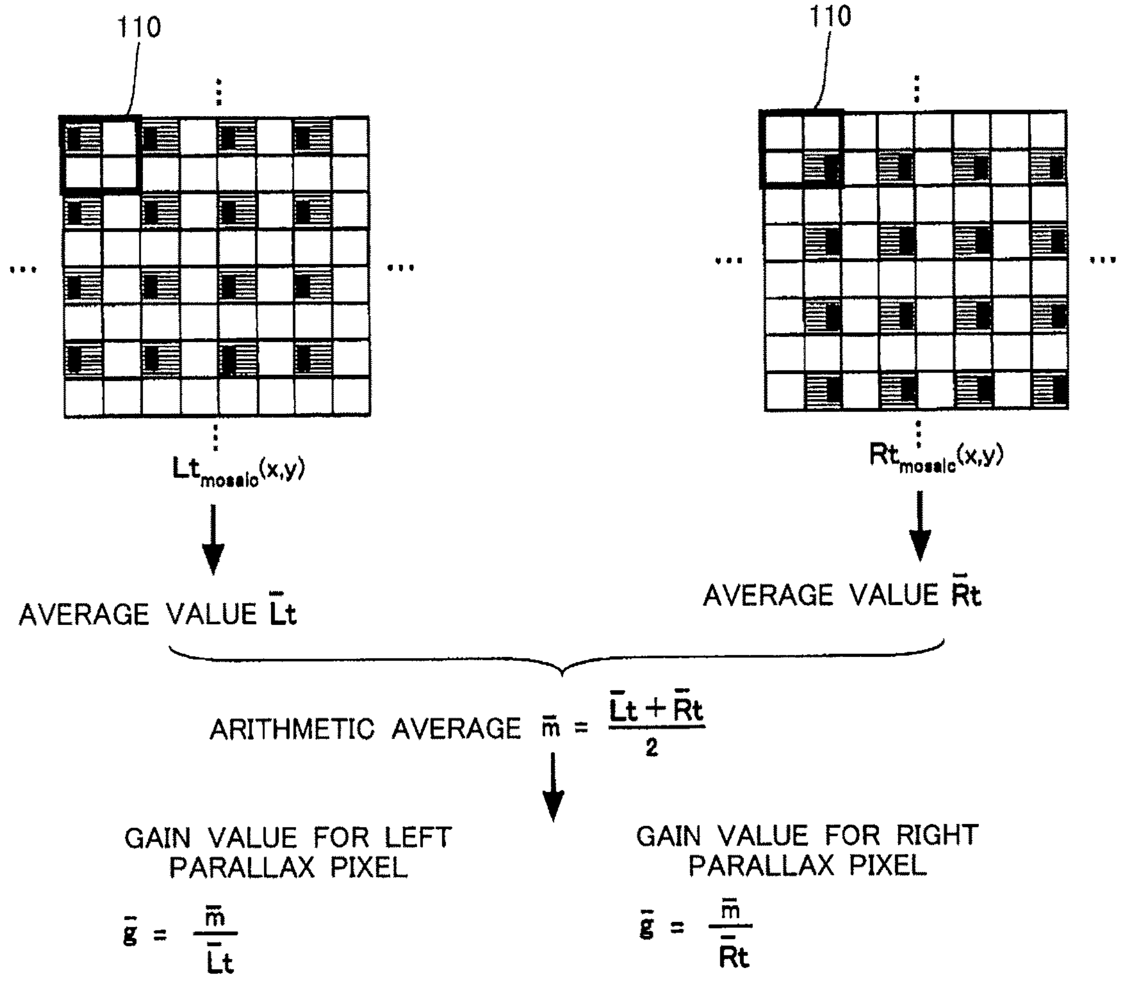
FIG. 18 illustrates how to calculate a gain value.

FIG. 18 is used to illustrate how to calculate gain values. For convenience, in the mosaic image data $M_{mosaic}$ (x,y), mosaic image data of left parallax pixels of the G component is referred to as $Lt_{mosaic}$ (x,y), and mosaic image data of right parallax pixels of the G component is referred to as $Rt_{mosaic}$ FIG. 18 illustrates only the left and right parallax pixels. Note that, in FIG. 18, the pixels are shown according to the example of FIG. 17 in such a manner that the types of the pixels can be understood but it is actually the output values corresponding to the pixels that are arranged.

Figure 19:
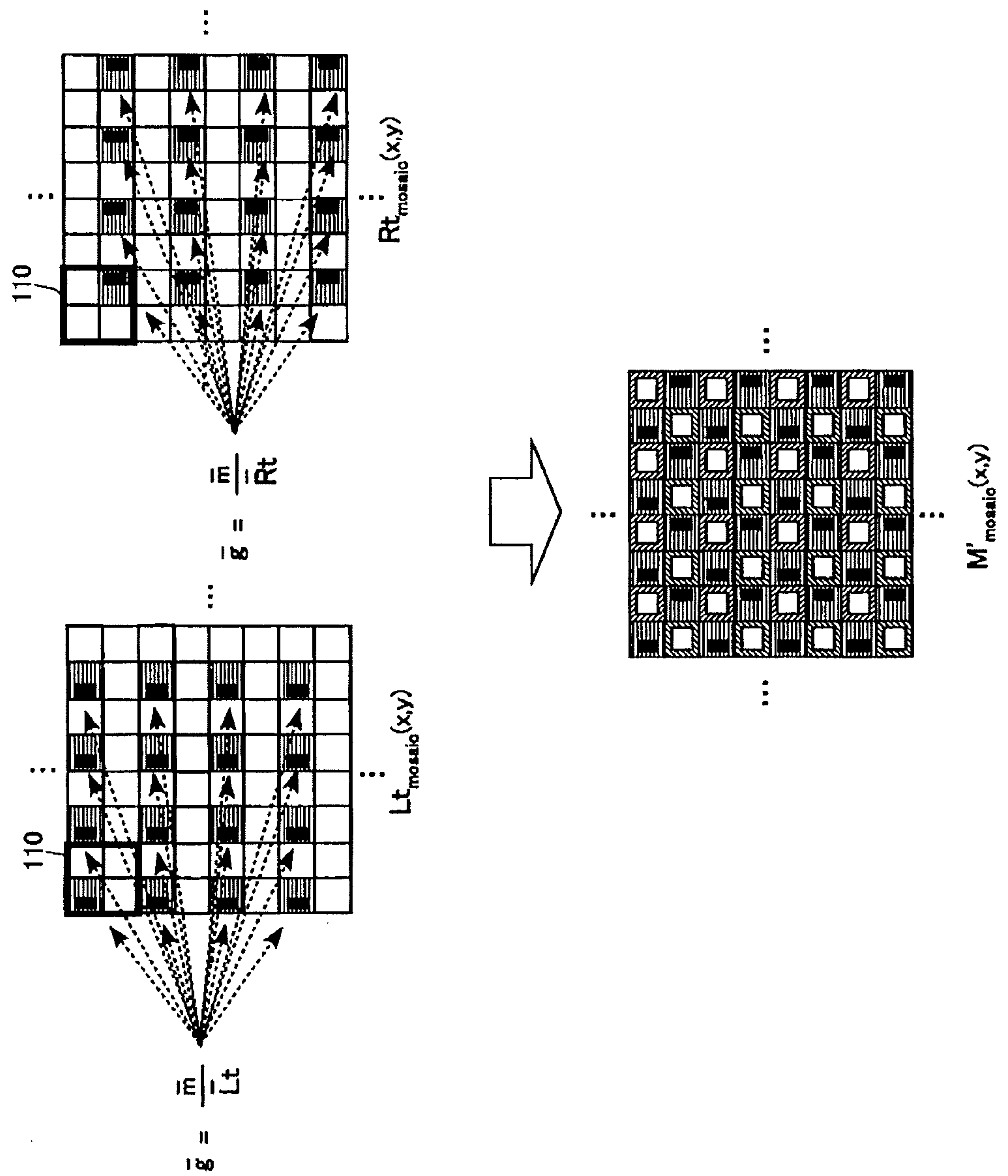
FIG. 19 illustrates how to perform gain correction.

FIG. 19 illustrates the gain correction. The calculating unit 233 of the image processor 205 calculates the gain values for the left and right parallax pixels and performs the gain correction using the calculated gain values on the pixels of $Lt_{mosaic}$ (x,y) and $Rt_{mosaic}$ (x,y) as shown in FIG. 19. To be specific, the gain correction on the left parallax pixels is performed by using the following Expression 1 and the gain correction on the right parallax pixels is performed by using the following Expression 2. For convenience, in the mosaic image data $M'_{mosaic}$ (x,y), mosaic image data of left parallax pixels of the G component is referred to as $Lt'_{mosaic}$ (x,y), and mosaic image data of right parallax pixels of the G component is referred to as $Rt'_{mosaic}$ (x,y).

$$\begin{aligned} Lt'_{mosaic}(x, y) &= Lt_{mosaic}(x, y)\cdot \bar{g}_{Lt} \\ &= Lt_{mosaic}(x, y)\cdot \frac{\bar{Lt}+\bar{Rt}}{2\bar{Lt}} \end{aligned} \quad \text{Expression 1}$$

$$\begin{aligned} Rt'_{mosaic}(x, y) &= Rt_{mosaic}(x, y)\cdot \bar{g}_{Rt} \\ &= Rt_{mosaic}(x, y)\cdot \frac{\bar{Lt}+\bar{Rt}}{2\bar{Rt}} \end{aligned} \quad \text{Expression 2}$$

In this manner, the calculating unit 233 of the image processor 205 can produce the mosaic image data $M'_{mosaic}$ (x,y) by correcting the left parallax pixels in $M_{mosaic}$ (x,y) with a single gain coefficient and correcting the right parallax pixels in $M_{mosaic}$ (x,y) with a single gain coefficient as shown in FIG. 19. Subsequently, the image processor 205 produces left and right parallax images having a low spatial-frequency resolution as provisional parallax images.

Figure 20:
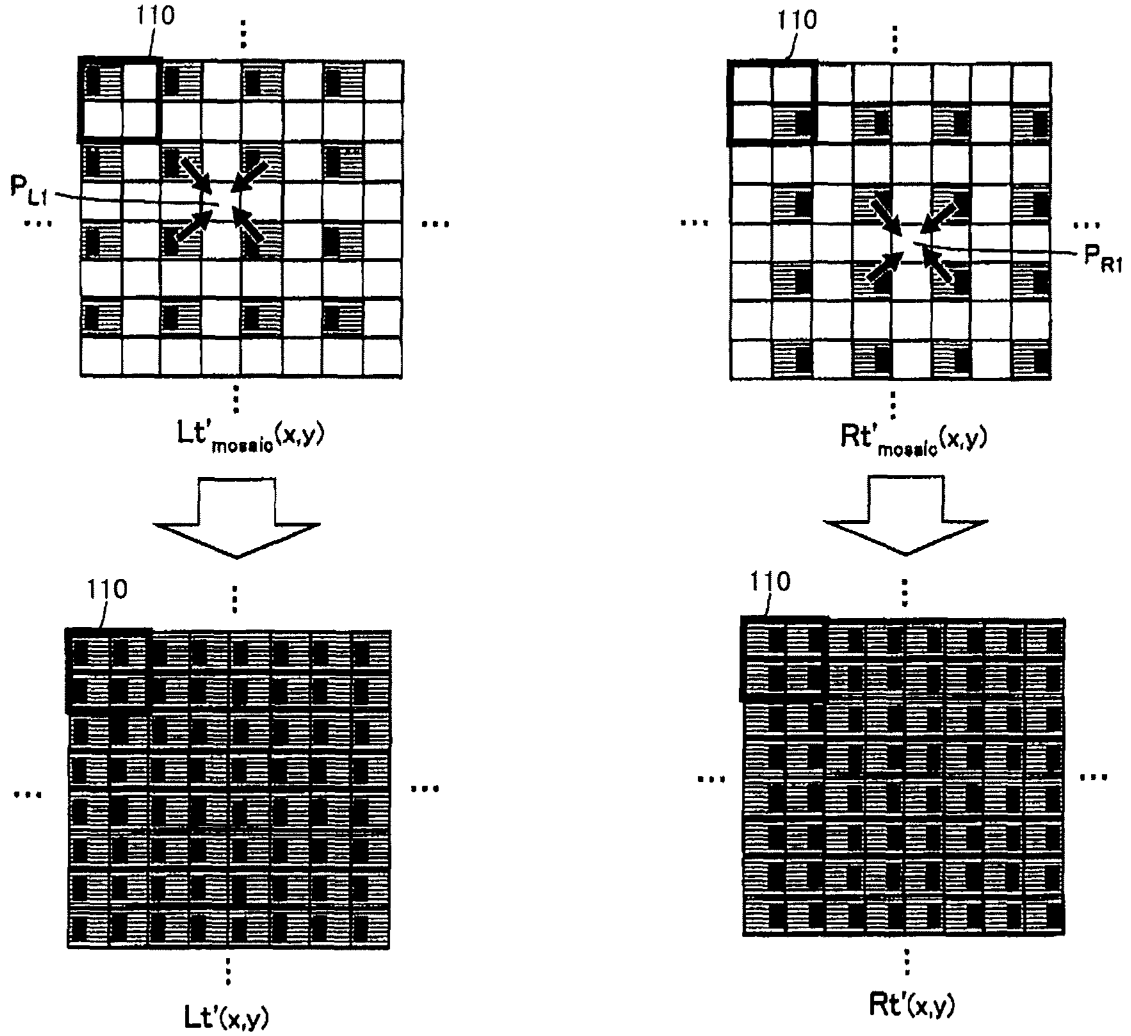
FIG. 20 illustrates how to produce hypothetical parallax images.

FIG. 20 illustrates how to produce the provisional parallax images. The image processor 205 first separates the mosaic image data $M'_{mosaic}$ (x,y) into a plurality of pieces of plane data. At this stage, each plane data has output values only at the pixel positions at which the raw original image data has output values. Thus, the image processor 205 performs interpolation based on each plane data and produces plane data in which the empty pixel positions have been filled with output values.

In FIG. 20, the top left drawing shows $Lt'_{mosaic}$ (x,y), which is the plane data produced by extracting only the left parallax pixels from the mosaic image data $M'_{mosaic}$ (x,y), and the top right drawing shows $Rt'_{mosaic}$ (x,y), which is the plane data produced by extracting only the right parallax pixels. In each drawing, the pixels are shown according to the example of FIG. 17 in such a manner that the types of the pixels can be understood but it is actually the output values corresponding to the pixels that are arranged.

When producing Lt'(x,y), which is the left parallax image data with low spatial-frequency resolution, the calculating unit 233 of the image processor 205 calculates the pixel values for the empty positions by means of interpolation based on the pixel values of the surrounding left parallax pixels. For example, the pixel value of the empty position $P_{L1}$ is calculated by averaging the pixel values of the four obliquely adjacent left parallax pixels. The calculating unit 233 of the image processor 205 performs, on all of the empty positions, interpolation by averaging the pixel values of the surrounding left parallax pixels, to produce Lt' $(x,y)$, which is plane data in which the empty positions have been filled, as shown in the bottom left drawing of FIG. 20. The calculating unit 233 of the image processor 205 may further perform interpolation using the pixel values calculated by the interpolation, or may perform the interpolation using only the output values included in the raw original image data.

Likewise, when producing Rt'(x,y), which is the right parallax image data with a low spatial-frequency resolution, the calculating unit 233 of the image processor 205 calculates the pixel values for the empty positions by means of interpolation based on the pixel values of the surrounding right parallax pixels. For example, the pixel value of the empty position $P_{R1}$ is calculated by averaging the pixel values of the four obliquely adjacent right parallax pixels. The calculating unit 233 of the image processor 205 performs, on all of the empty positions, interpolation by averaging the pixel values of the surrounding right parallax pixels, to produce Rt' $(x,y)$, which is plane data in which the empty positions have been filled, as shown in the bottom right drawing of FIG. 20.

Subsequently, the calculating unit 233 of the image processor 205 performs gain correction on each of the pixels in Lt'(x,y) using the corresponding calculated gain value and also performs gain correction on each of the pixels of Rt'(x,y) using the corresponding calculated gain value. In this manner, uniform illuminance is achieved between the left and right parallax pixels at the same pixel position. In the present embodiment, the gain correction performed in this manner using the gain values calculated on the pixel-by-pixel basis is referred to as local gain correction, as opposed to the above-described global gain correction.

Figure 21:
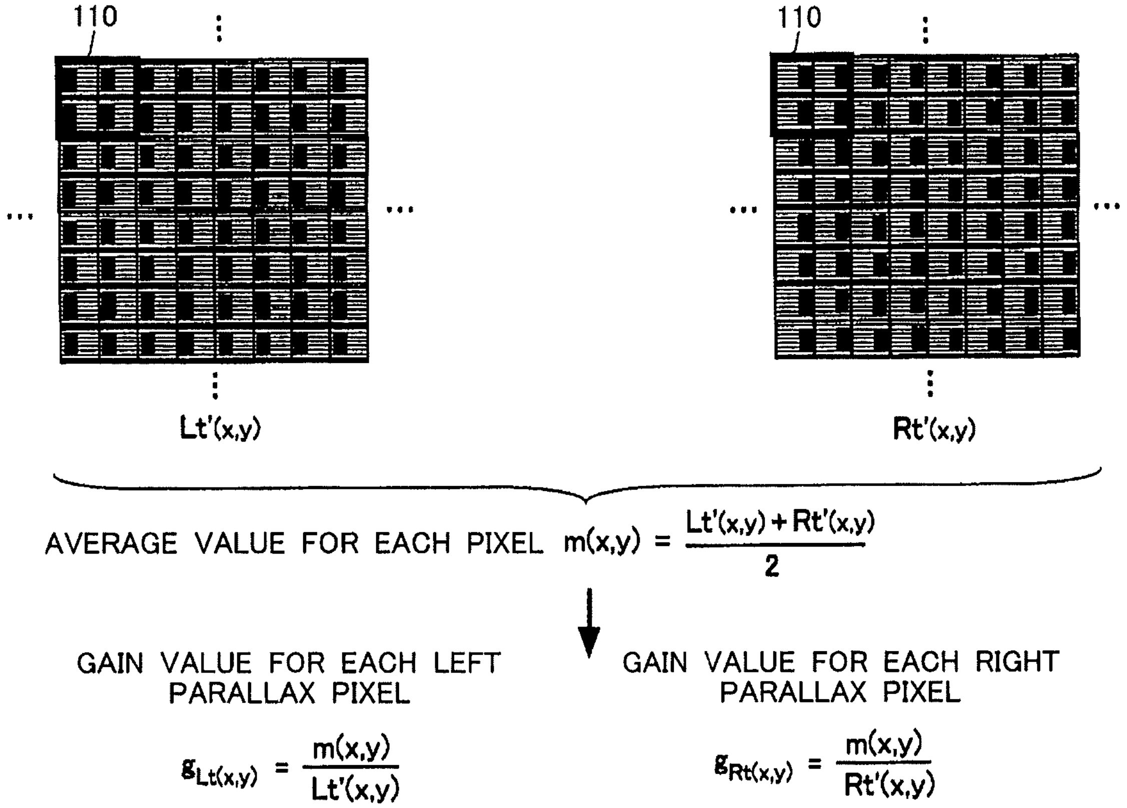
FIG. 21 illustrates how to calculate a gain value.

FIG. 21 illustrates how to calculate the gain values. As shown in FIG. 21, the calculating unit 233 of the image processor 205 calculates the average values on the pixel-by-pixel basis from Lt'(x,y) and Rt'(x,y). For the purposes of the local gain correction, the average values can be calculated in two different ways: arithmetic and geometric averages. Here, the arithmetic average approach is employed so that the blur width of the subject image of the no-parallax pixels of the G component from which parallax has been eliminated can match with the blur width of the subject image of the no-parallax pixels. In this case, specifically speaking, the calculating unit 233 of the image processor 205 calculates the average values using the following Expression 3.

$$m(x, y) = \frac{Lt'(x, y) + Rt'(x, y)}{2} \quad \text{Expression 3}$$

Figure 22:
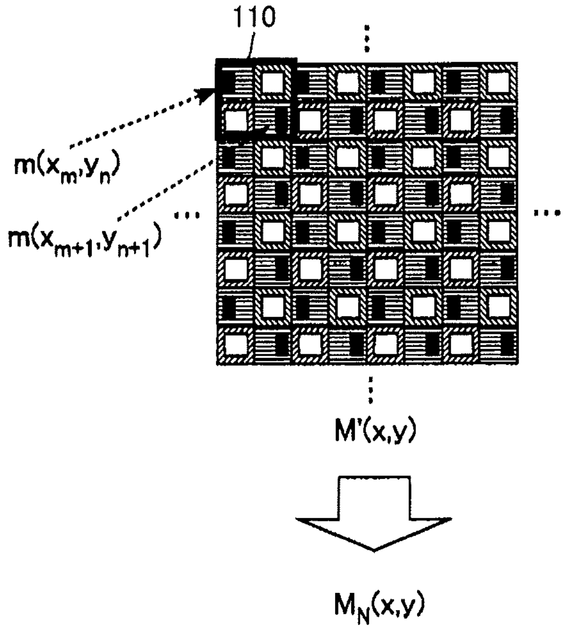
FIG. 22 illustrates how to perform local gain correction.

FIG. 22 illustrates how to perform the local gain correction. As described above, the average value can be obtained by performing the local gain correction on each pixel. Accordingly, the calculating unit 233 of the image processor 205 can perform the local gain correction simply by replacing each of the pixel values of the left and right parallax pixels in the repeating pattern 110 with the $m(x_m, y_n)$ and $m(x_{m+1}, y_{n+1})$ calculated using Expression 3 as shown in FIG. 22. In this sense, the local gain correction can be interpreted as modulation to eliminate the parallax. In this manner, a Bayer arrangement can be obtained in which the pixel values of the parallax Gb and Gr pixels have been replaced with the pixel values of no-parallax G pixels.

The calculating unit 233 of the image processor 205 produces $M_N(x,y)$ by replacing the pixel values of all of the left and right parallax pixels with the corresponding average values calculated using Expression 3. Note that the local gain correction may be performed not on all of the pixels of Lt'(x,y) and Rt'(x,y) but on the pixels corresponding to the positions of the left and right parallax pixels in the Bayer arrangement.

Subsequently, the image processor 205 uses the existing color interpolation technique to produce, as intermediate image data, no-parallax color image data in which each pixel has a resolution enhanced to the Nyquist frequency, from $M_N(x,y)$.

Figure 23:
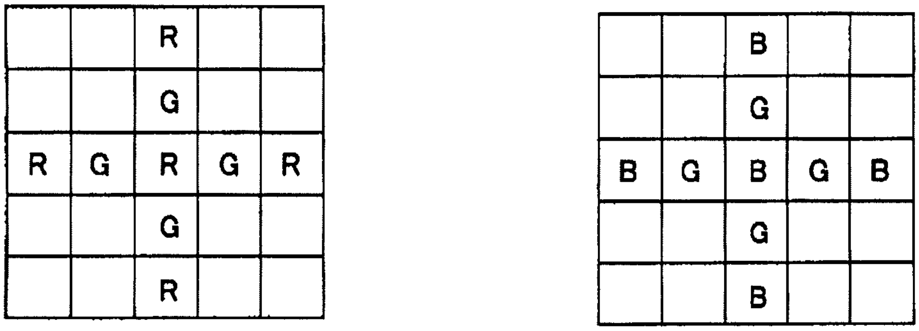
FIG. 23 illustrates G component interpolation.

FIG. 23 illustrates how to perform G component interpolation. G color interpolation is calculated for the position [i,j] of the central R pixel in the left drawing of FIG. 23 based on the pixels shown in the drawing. The position of a B pixel for which the G color interpolation is performed is shown in the right drawing in FIG. 23.

In the present embodiment, the image processor 205 uses five pieces of plane data including Lt'(x,y), Rt'(x,y), $R_N(x,y)$, $G_N(x,y)$, and $B_N(x,y)$ to produce color image data of the left viewpoint and color image data of the right viewpoint. To be specific, the image processor 205 superimposes the parallax components of the provisional parallax images on the no-parallax images to produce left and right color image data. This production operation is referred to as parallax modulation.

The color image data of the left viewpoint is constituted by three pieces of color parallax plane data including red plane data $R_{Lt}(x,y)$, green plane data $G_{Lt}(x,y)$, and blue plane data $B_{Lt}(x,y)$ corresponding to the left viewpoint. Likewise, the color image data of the right viewpoint is constituted by three pieces of color parallax plane data including red plane data $R_{Rt}(x,y)$, green plane data $G_{Rt}(x,y)$, and blue plane data $B_{Rt}(x,y)$ corresponding to the right viewpoint.

Figure 24:
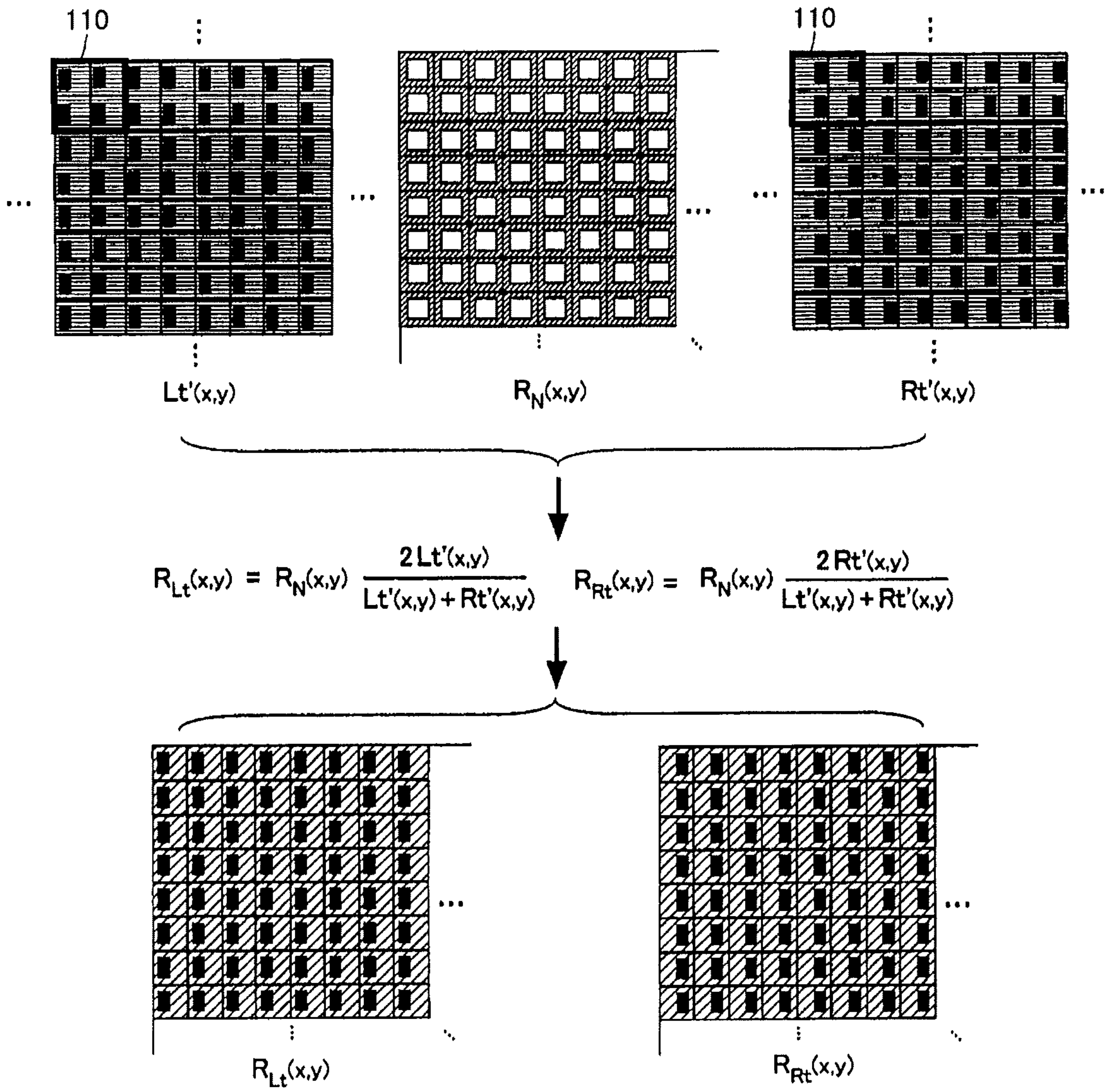
FIG. 24 illustrates how to produce color parallax plane data.

FIG. 24 illustrates how to produce the color parallax plane data. Specifically speaking, FIG. 24 illustrates how to produce the red parallax planes $R_{Rt}(x,y)$ and $R_{Rt}(x,y)$ of the color parallax plane.

In the above description, the primary colors constituting a color subject image are three colors of red, green and blue. However, four or more primary colors may be used including emerald green. In addition, in place of red, green and blue, three complementary colors of yellow, magenta and cyan may be used as the three primary colors.

In the above description, for example, the operations of the pixel value extracting unit 231 and the calculating unit 233 of the image processor 205 are described as the functions of the components of the digital camera 10. The control program to cause the controller 201 and the image processor 205 to operate can cause the hardware components of the digital camera 10 to function as the components that perform the above-described operations. The above series of operations to produce color image data may not be performed by the digital camera 10 but by a device such as an external personal computer or the like. In this case, the device such as an external personal computer or the like functions as an image processing apparatus. The image processing apparatus acquires raw original image data and produces color image data, for example. The image processing apparatus performs the above-described plane separation, plane data interpolation when acquiring the raw original image data. Alternatively, the image processing apparatus may acquire plane data that has been subjected to interpolation by an image-capturing apparatus. When applied to a personal computer and the like, the program relating to the above-described operations can be provided through a recording medium such as CD-ROM and data signals such as the Internet.

In the above description of the second embodiment, a geometric average is used to equalize the blur widths when the signal plane from which parallax has been eliminated between the left and right pixels and the captured signal plane of the no-parallax pixels are averaged. When a geometric average is calculated between the pixel values of the no-parallax pixels and the average values between the left and right parallax pixels, weight was equally allocated to the pixel values and to the average values. Here, the number of parallax pixels is smaller than the number of no-parallax pixels. In addition, the resolving power of the parallax images is lower than the resolving power of the no-parallax images. As described above, for example, while the Nyquist limit of $R_N$ and $B_N$, which are no-parallax images, is kx=[−π/(2a),+π/(2a)], ky=[−π/(2a),+π/(2a)], the Nyquist limit of $R_{Lt}$, $B_{Lt}$, $R_{Rt}$ and $B_{Rt}$, which are parallax images, is kx=[−π/(8a),+π/(8a)], ky=[−π/(8a),−π/(8a)]. Accordingly, if weight is equally allocated to the pixel values of the no-parallax pixels and the average values between the left and right parallax pixels, the resolving power of the resulting image is lower as a whole due to the influence of the resolving power of the parallax images. Thus, some measures need to be taken to retain the resolving power of the resulting image as much as possible to reach the resolving power of the no-parallax images. Here, a geometric average may be calculated considering the density ratio between the no-parallax pixels and the parallax pixels in the pixel array on the image sensor. Specifically speaking, since the ratio of the no-parallax pixels (N), the left parallax pixels (Lt), and the right parallax pixels (Rt) in the second embodiment is N:Lt:Rt=14:1:1, i.e., N:(Lt+Rt)=7:1, weight of ⅞-th power is allocated to the parallax pixels and weight of ⅛-th power is allocated to the no-parallax pixels to attach more importance to the no-parallax pixels of higher density.

As described above, the parallax between the left and right pixels can be eliminated in two different ways depending on whether to select an arithmetic average or a geometric average. When all of the no-parallax pixels have the full-open mask area, the arithmetic average approach may be selected to match the blur width of the subject image from which parallax between the left and right pixels has been eliminated to the blur width corresponding to the full-open mask area. The following a) describes the case where the arithmetic average approach is selected.

a) When an Arithmetic Average is Calculated Between the Left and Right Parallax Pixels The average value for each pixel:

$$m_R(x,y) = [R_N(x,y)]^{\frac{7}{8}} \cdot \left[\frac{R_{Lt}(x,y)+R_{Rt}(x,y)}{2}\right]^{\frac{1}{8}}$$

$$m_G(x,y) = [G_N(x,y)]^{\frac{7}{8}} \cdot \left[\frac{G_{Lt}(x,y)+G_{Rt}(x,y)}{2}\right]^{\frac{1}{8}}$$

$$m_B(x,y) = [B_N(x,y)]^{\frac{7}{8}} \cdot \left[\frac{B_{Lt}(x,y)+B_{Rt}(x,y)}{2}\right]^{\frac{1}{8}}$$

The gain value for each no-parallax pixel:

$$g_{R_N}(x,y) = \frac{m_R(x,y)}{R_N(x,y)} = \sqrt[8]{\frac{R_{Lt}(x,y)+R_{Rt}(x,y)}{2R_N(x,y)}}$$

$$g_{G_N}(x,y) = \frac{m_G(x,y)}{G_N(x,y)} = \sqrt[8]{\frac{G_{Lt}(x,y)+G_{Rt}(x,y)}{2G_N(x,y)}}$$

-continued $$g_{B_N}(x,y) = \frac{m_B(x,y)}{B_N(x,y)} = \sqrt[8]{\frac{B_{Lt}(x,y)+B_{Rt}(x,y)}{2B_N(x,y)}}$$

The gain value for each left parallax pixel:

$$g_{R_{Lt}}(x,y) = \frac{m_R(x,y)}{R_{Lt}(x,y)} = \left[\frac{R_N(x,y)}{R_{Lt}(x,y)}\right]^{\frac{7}{8}} \cdot \left[\frac{R_{Lt}(x,y)+R_{Rt}(x,y)}{2R_{Lt}(x,y)}\right]^{\frac{1}{8}}$$

$$g_{G_{Lt}}(x,y) = \frac{m_G(x,y)}{G_{Lt}(x,y)} = \left[\frac{G_N(x,y)}{G_{Lt}(x,y)}\right]^{\frac{7}{8}} \cdot \left[\frac{G_{Lt}(x,y)+G_{Rt}(x,y)}{2G_{Lt}(x,y)}\right]^{\frac{1}{8}}$$

$$g_{B_{Lt}}(x,y) = \frac{m_B(x,y)}{B_{Lt}(x,y)} = \left[\frac{B_N(x,y)}{B_{Lt}(x,y)}\right]^{\frac{7}{8}} \cdot \left[\frac{B_{Lt}(x,y)+B_{Rt}(x,y)}{2B_{Lt}(x,y)}\right]^{\frac{1}{8}}$$

The gain value for each right parallax pixel:

$$g_{R_{Rt}}(x,y) = \frac{m_R(x,y)}{R_{Rt}(x,y)} = \left[\frac{R_N(x,y)}{R_{Rt}(x,y)}\right]^{\frac{7}{8}} \cdot \left[\frac{R_{Lt}(x,y)+R_{Rt}(x,y)}{2R_{Rt}(x,y)}\right]^{\frac{1}{8}}$$

$$g_{G_{Rt}}(x,y) = \frac{m_G(x,y)}{G_{Rt}(x,y)} = \left[\frac{G_N(x,y)}{G_{Rt}(x,y)}\right]^{\frac{7}{8}} \cdot \left[\frac{G_{Lt}(x,y)+G_{Rt}(x,y)}{2G_{Rt}(x,y)}\right]^{\frac{1}{8}}$$

$$g_{B_{Rt}}(x,y) = \frac{m_B(x,y)}{B_{Rt}(x,y)} = \left[\frac{B_N(x,y)}{B_{Rt}(x,y)}\right]^{\frac{7}{8}} \cdot \left[\frac{B_{Lt}(x,y)+B_{Rt}(x,y)}{2B_{Rt}(x,y)}\right]^{\frac{1}{8}}$$

On the other hand, when all of the no-parallax pixels have the half-open mask area, the geometric average approach may be selected to match the blur width of the subject image from which the parallax between the left and right pixels has been eliminated to the blur width corresponding to the half-open mask area. The following b) describes the case where the geometric average approach is selected.

b) When a Geometric Average is Calculated Between the Left and Right Parallax Pixels The average value for each pixel:

$$m_R(x,y) = [R_N(x,y)]^{\frac{7}{8}} \cdot \left[\sqrt{R_{Lt}(x,y)\cdot R_{Rt}(x,y)}\right]^{\frac{1}{8}}$$

$$m_G(x,y) = [G_N(x,y)]^{\frac{7}{8}} \cdot \left[\sqrt{G_{Lt}(x,y)\cdot G_{Rt}(x,y)}\right]^{\frac{1}{8}}$$

$$m_B(x,y) = [B_N(x,y)]^{\frac{7}{8}} \cdot \left[\sqrt{B_{Lt}(x,y)\cdot B_{Rt}(x,y)}\right]^{\frac{1}{8}}$$

The gain value for each no-parallax pixel:

$$g_{R_N}(x,y) = \frac{m_R(x,y)}{R_N(x,y)} = \sqrt[8]{\frac{\sqrt{R_{Lt}(x,y)\cdot R_{Rt}(x,y)}}{R_N(x,y)}}$$

$$g_{G_N}(x,y) = \frac{m_G(x,y)}{G_N(x,y)} = \sqrt[8]{\frac{\sqrt{G_{Lt}(x,y)\cdot G_{Rt}(x,y)}}{G_N(x,y)}}$$

$$g_{B_N}(x,y) = \frac{m_B(x,y)}{B_N(x,y)} = \sqrt[8]{\frac{\sqrt{B_{Lt}(x,y)\cdot B_{Rt}(x,y)}}{B_N(x,y)}}$$

The gain value for each left parallax pixel:

$$g_{R_{Lt}}(x, y) = \frac{m_R(x, y)}{R_{Lt}(x, y)} = \left[\frac{R_N(x, y)}{R_{Lt}(x, y)}\right]^{\frac{7}{8}} \cdot \left[\sqrt{\frac{R_{Rt}(x, y)}{R_{Lt}(x, y)}}\right]^{\frac{1}{8}}$$

$$g_{G_{Lt}}(x, y) = \frac{m_G(x, y)}{G_{Lt}(x, t)} = \left[\frac{G_N(x, y)}{G_{Lt}(x, y)}\right]^{\frac{7}{8}} \cdot \left[\sqrt{\frac{G_{Rt}(x, y)}{G_{Lt}(x, y)}}\right]^{\frac{1}{8}}$$

$$g_{B_{Lt}}(x, y) = \frac{m_B(x, y)}{B_{Lt}(x, y)} = \left[\frac{B_N(x, y)}{B_{Lt}(x, y)}\right]^{\frac{7}{8}} \cdot \left[\sqrt{\frac{B_{Rt}(x, y)}{B_{Lt}(x, y)}}\right]^{\frac{1}{8}}$$

The gain value for each right parallax pixel:

$$g_{R_{Rt}}(x, y) = \frac{m_R(x, y)}{R_{Rt}(x, y)} = \left[\frac{R_N(x, y)}{R_{Rt}(x, y)}\right]^{\frac{7}{8}} \cdot \left[\sqrt{\frac{R_{Lt}(x, y)}{R_{Rt}(x, y)}}\right]^{\frac{1}{8}}$$

$$g_{G_{Rt}}(x, y) = \frac{m_G(x, y)}{G_{Rt}(x, y)} = \left[\frac{G_N(x, y)}{G_{Rt}(x, y)}\right]^{\frac{7}{8}} \cdot \left[\sqrt{\frac{G_{Lt}(x, y)}{G_{Rt}(x, y)}}\right]^{\frac{1}{8}}$$

$$g_{B_{Rt}}(x, y) = \frac{m_B(x, y)}{B_{Rt}(x, y)} = \left[\frac{B_N(x, y)}{B_{Rt}(x, y)}\right]^{\frac{7}{8}} \cdot \left[\sqrt{\frac{B_{Lt}(x, y)}{B_{Rt}(x, y)}}\right]^{\frac{1}{8}}$$

Likewise, when the parallax modulation is performed, a geometric average can be calculated considering the RGB density ratio among the parallax pixels of each group in the pixel array on the image sensor. To be specific, the RGB density ratio among the left parallax pixels is R:G:B=1:2:1, and the RGB density ratio among the right parallax pixels is also R:G:B=1:2:1. Accordingly, weight of ¼-th power is allocated to the R component parallax modulation, weight of ½-th power is allocated to the G component parallax modulation, and weight of ¼-th power is allocated to the B component parallax modulation to attach importance to the parallax modulation for the G component having high density. The following a) describes the parallax modulation using the arithmetic average as the reference point.

a) Parallax Modulation Using the Arithmetic Average as the Reference Point

The left parallax modulation $$R'_{Lt}(x, y) = R_N(x, y)\sqrt[4]{\frac{2R_{Lt}(x, y)}{R_{Lt}(x, y) + R_{Rt}(x, y)}} \sqrt{\frac{2G_{Lt}(x, y)}{G_{Lt}(x, y) + G_{Rt}(x, y)}} \sqrt[4]{\frac{2B_{Lt}(x, y)}{B_{Lt}(x, y) + B_{Rt}(x, y)}}$$

$$G'_{Lt}(x, y) = G_N(x, y)\sqrt[4]{\frac{2R_{Lt}(x, y)}{R_{Lt}(x, y) + R_{Rt}(x, y)}} \sqrt{\frac{2G_{Lt}(x, y)}{G_{Lt}(x, y) + G_{Rt}(x, y)}} \sqrt[4]{\frac{2B_{Lt}(x, y)}{B_{Lt}(x, y) + B_{Rt}(x, y)}}$$

$$B'_{Lt}(x, y) = B_N(x, y)\sqrt[4]{\frac{2R_{Lt}(x, y)}{R_{Lt}(x, y) + R_{Rt}(x, y)}} \sqrt{\frac{2G_{Lt}(x, y)}{G_{Lt}(x, y) + G_{Rt}(x, y)}} \sqrt[4]{\frac{2B_{Lt}(x, y)}{B_{Lt}(x, y) + B_{Rt}(x, y)}}$$

The right parallax modulation $$R'_{Rt}(x, y) = R_N(x, y)\sqrt[4]{\frac{2R_{Rt}(x, y)}{R_{Lt}(x, y) + R_{Rt}(x, y)}} \sqrt{\frac{2G_{Rt}(x, y)}{G_{Lt}(x, y) + G_{Rt}(x, y)}} \sqrt[4]{\frac{2B_{Rt}(x, y)}{B_{Lt}(x, y) + B_{Rt}(x, y)}}$$

$$G'_{Rt}(x, y) = G_N(x, y)\sqrt[4]{\frac{2R_{Rt}(x, y)}{R_{Lt}(x, y) + R_{Rt}(x, y)}} \sqrt{\frac{2G_{Rt}(x, y)}{G_{Lt}(x, y) + G_{Rt}(x, y)}} \sqrt[4]{\frac{2B_{Rt}(x, y)}{B_{Lt}(x, y) + B_{Rt}(x, y)}}$$

$$B'_{Rt}(x, y) = B_N(x, y)\sqrt[4]{\frac{2R_{Rt}(x, y)}{R_{Lt}(x, y) + R_{Rt}(x, y)}} \sqrt{\frac{2G_{Rt}(x, y)}{G_{Lt}(x, y) + G_{Rt}(x, y)}} \sqrt[4]{\frac{2B_{Rt}(x, y)}{B_{Lt}(x, y) + B_{Rt}(x, y)}}$$

The following b) describes the parallax modulation using the geometric average as the reference point.

b) Parallax Modulation Using the Geometric Average as the Reference Point

The left parallax modulation $$R'_{Lt}(x, y) = R_N(x, y)\sqrt[4]{\frac{R_{Lt}(x, y)}{\sqrt{R_{Lt}(x, y) \cdot R_{Rt}(x, y)}}} \sqrt{\frac{G_{Lt}(x, y)}{\sqrt{G_{Lt}(x, y) \cdot G_{Rt}(x, y)}}} \sqrt[4]{\frac{B_{Lt}(x, y)}{\sqrt{B_{Lt}(x, y) \cdot B_{Rt}(x, y)}}}$$

$$G'_{Lt}(x, y) = G_N(x, y)\sqrt[4]{\frac{R_{Lt}(x, y)}{\sqrt{R_{Lt}(x, y) \cdot R_{Rt}(x, y)}}} \sqrt{\frac{G_{Lt}(x, y)}{\sqrt{G_{Lt}(x, y) \cdot G_{Rt}(x, y)}}} \sqrt[4]{\frac{B_{Lt}(x, y)}{\sqrt{B_{Lt}(x, y) \cdot B_{Rt}(x, y)}}}$$

$$B'_{Lt}(x, y) = B_N(x, y)\sqrt[4]{\frac{R_{Lt}(x, y)}{\sqrt{R_{Lt}(x, y) \cdot R_{Rt}(x, y)}}} \sqrt{\frac{G_{Lt}(x, y)}{\sqrt{G_{Lt}(x, y) \cdot G_{Rt}(x, y)}}} \sqrt[4]{\frac{B_{Lt}(x, y)}{\sqrt{B_{Lt}(x, y) \cdot B_{Rt}(x, y)}}}$$

The right parallax modulation $$R'_{Rt}(x, y) = R_N(x, y)\sqrt[4]{\frac{R_{Rt}(x, y)}{\sqrt{R_{Lt}(x, y) \cdot R_{RT}(x, y)}}} \sqrt{\frac{G_{Rt}(x, y)}{\sqrt{G_{Lt}(x, y) \cdot G_{Rt}(x, y)}}} \sqrt[4]{\frac{B_{Rt}(x, y)}{\sqrt{B_{Lt}(x, y) \cdot B_{Rt}(x, y)}}}$$

$$G'_{Rt}(x, y) = G_N(x, y)\sqrt[4]{\frac{R_{Rt}(x, y)}{\sqrt{R_{Lt}(x, y) \cdot R_{Rt}(x, y)}}} \sqrt{\frac{G_{Rt}(x, y)}{\sqrt{G_{Lt}(x, y) \cdot G_{Rt}(x, y)}}} \sqrt[4]{\frac{B_{Rt}(x, y)}{\sqrt{B_{Lt}(x, y) \cdot B_{Rt}(x, y)}}}$$

$$B'_{Rt}(x, y) = B_N(x, y)\sqrt[4]{\frac{R_{Rt}(x, y)}{\sqrt{R_{Lt}(x, y) \cdot R_{Rt}(x, y)}}} \sqrt{\frac{G_{Rt}(x, y)}{\sqrt{G_{Lt}(x, y) \cdot G_{Rt}(x, y)}}} \sqrt[4]{\frac{B_{Rt}(x, y)}{\sqrt{B_{Lt}(x, y) \cdot B_{Rt}(x, y)}}}$$

The above expressions can be rewritten into the following expressions.

The left parallax modulation $$R'_{Lt}(x, y) = R_N(x, y) \sqrt[4]{\sqrt{\frac{R_{Lt}(x,y)}{R_{Rt}(x,y)}}} \sqrt{\sqrt{\frac{G_{Lt}(x,y)}{G_{Rt}(x,y)}}} \sqrt[4]{\sqrt{\frac{B_{Lt}(x,y)}{B_{Rt}(x,y)}}}$$

$$G'_{Lt}(x, y) = G_N(x, y) \sqrt[4]{\sqrt{\frac{R_{Lt}(x,y)}{R_{Rt}(x,y)}}} \sqrt{\sqrt{\frac{G_{Lt}(x,y)}{G_{Rt}(x,y)}}} \sqrt[4]{\sqrt{\frac{B_{Lt}(x,y)}{B_{Rt}(x,y)}}}$$

$$B'_{Lt}(x, y) = B_N(x, y) \sqrt[4]{\sqrt{\frac{R_{Lt}(x,y)}{R_{Rt}(x,y)}}} \sqrt{\sqrt{\frac{G_{Lt}(x,y)}{G_{Rt}(x,y)}}} \sqrt[4]{\sqrt{\frac{B_{Lt}(x,y)}{B_{Rt}(x,y)}}}$$

The right Parallax modulation $$R'_{Rt}(x, y) = R_N(x, y) \sqrt[4]{\sqrt{\frac{R_{Rt}(x,y)}{R_{Lt}(x,y)}}} \sqrt{\sqrt{\frac{G_{Rt}(x,y)}{G_{Lt}(x,y)}}} \sqrt[4]{\sqrt{\frac{B_{Rt}(x,y)}{B_{Lt}(x,y)}}}$$

$$G'_{Rt}(x, y) = G_N(x, y) \sqrt[4]{\sqrt{\frac{R_{Rt}(x,y)}{R_{Lt}(x,y)}}} \sqrt{\sqrt{\frac{G_{Rt}(x,y)}{G_{Lt}(x,y)}}} \sqrt[4]{\sqrt{\frac{B_{Rt}(x,y)}{B_{Lt}(x,y)}}}$$

$$B'_{Rt}(x, y) = B_N(x, y) \sqrt[4]{\sqrt{\frac{R_{Rt}(x,y)}{R_{Lt}(x,y)}}} \sqrt{\sqrt{\frac{G_{Rt}(x,y)}{G_{Lt}(x,y)}}} \sqrt[4]{\sqrt{\frac{B_{Rt}(x,y)}{B_{Lt}(x,y)}}}$$

Likewise, when a monochrome image sensor is used, a geometric average can be calculated considering the density ratio between the no-parallax pixels and the parallax pixels in the pixel array on the image sensor. To be specific, in the third embodiment, the ratio between the no-parallax pixels (N), the left parallax pixels (Lt) and the right parallax pixels (Rt) is N:Lt:Rt=14:1:1, i.e., N:(Lt+Rt)=7:1. Accordingly, weight of ⅞-th power is allocated to the no-parallax pixels and weight of ⅛-th power is allocated to the parallax pixels to attach importance to the no-parallax pixels having high density. The following a) describes the case where the arithmetic average approach is selected to eliminate the parallax between the left and right pixels.

a) When an Arithmetic Average is Calculated Between the Left and Right Parallax Pixels The average value for each pixel:

$$m(x, y) = [N(x, y)]^{\frac{7}{8}} \cdot \left[\frac{Lt(x, y) + Rt(x, y)}{2}\right]^{\frac{1}{8}}$$

The gain value for each no-parallax pixel:

$$g_N(x, y) = \frac{m(x, y)}{N(x, y)} = \sqrt[8]{\frac{Lt(x, y) + Rt(x, y)}{2N(x, y)}}$$

The gain value for each left parallax pixel:

$$g_{Lt}(x, y) = \frac{m(x, y)}{Lt(x, y)} = \left[\frac{N(x, y)}{Lt(x, y)}\right]^{\frac{7}{8}} \cdot \left[\frac{Lt(x, y) + Rt(x, y)}{2Lt(x, y)}\right]^{\frac{1}{8}}$$

The gain value for each right parallax pixel:

$$g_{Rt}(x, y) = \frac{m(x, y)}{Rt(x, y)} = \left[\frac{N(x, y)}{Rt(x, y)}\right]^{\frac{7}{8}} \cdot \left[\frac{Lt(x, y) + Rt(x, y)}{2Rt(x, y)}\right]^{\frac{1}{8}}$$

The following b) describes the case where the geometric average approach is selected to eliminate the parallax between the left and right pixels.

b) When a Geometric Average is Calculated Between the Left and Right Parallax Pixels The average value for each pixel:

$$m(x,y) = [N(x,y)]^{7/8} \cdot [\sqrt{Lt(x,y) \cdot Rt(x,y)}]^{1/8}$$

The gain value for each no-parallax pixel:

$$g_N(x, y) = \frac{m(x, y)}{N(x, y)} = \sqrt[8]{\frac{\sqrt{Lt(x, y) \cdot Rt(x, y)}}{N(x, y)}}$$

The gain value for each left parallax pixel:

$$g_{Lt}(x, y) = \frac{m(x, y)}{Lt(x, y)} = \left[\frac{N(x, y)}{Lt(x, y)}\right]^{\frac{7}{8}} \cdot \left[\sqrt{\frac{Rt(x, y)}{Lt(x, y)}}\right]^{\frac{1}{8}}$$

The gain value for each right parallax pixel:

$$g_{Rt}(x, y) = \frac{m(x, y)}{Rt(x, y)} = \left[\frac{N(x, y)}{Rt(x, y)}\right]^{\frac{7}{8}} \cdot \left[\sqrt{\frac{Lt(x, y)}{Rt(x, y)}}\right]^{\frac{1}{8}}$$

The arithmetic average approach can be employed considering the density ratio between the no-parallax pixels and the parallax pixels in the pixel array on the image sensor. This is particularly effective when the operations described in the above-described embodiments are realized by hardware. The following describes, for example, a case where an average is calculated between the signal plane from which parallax has been eliminated between the left and right pixels and the captured signal plane of the no-parallax pixels. The arithmetic average approach can be employed as well when parallax modulation is performed, and when a monochrome image sensor is used. The following a) describes the case where the arithmetic average approach is selected to eliminate the parallax between the left and right pixels.

a) When an Arithmetic Average is Calculated Between the Left and Right Parallax Pixels The average value for each pixel:

$$m_R(x, y) = \frac{7}{8} \cdot R_N(x, y) + \frac{1}{8} \cdot \frac{R_{Lt}(x, y) + R_{Rt}(x, y)}{2}$$

$$m_G(x, y) = \frac{7}{8} \cdot G_N(x, y) + \frac{1}{8} \cdot \frac{G_{Lt}(x, y) + G_{Rt}(x, y)}{2}$$

$$m_B(x, y) = \frac{7}{8} \cdot B_N(x, y) + \frac{1}{8} \cdot \frac{B_{Lt}(x, y) + B_{Rt}(x, y)}{2}$$

The gain value for each no-parallax pixel:

$$g_{R_N}(x, y) = \frac{m_R(x, y)}{R_N(x, y)} = \frac{7}{8} + \frac{1}{8} \cdot \frac{R_{Lt}(x, y) + R_{Rt}(x, y)}{2R_N(x, y)}$$

-continued $$g_{G_N}(x, y) = \frac{m_G(x, y)}{G_N(x, y)} = \frac{7}{8} + \frac{1}{8} \cdot \frac{G_{Lt}(x, y) + G_{Rt}(x, y)}{2G_N(x, y)}$$

$$g_{B_N}(x, y) = \frac{m_G(x, y)}{B_N(x, y)} = \frac{7}{8} + \frac{1}{8} \cdot \frac{B_{Lt}(x, y) + B_{Rt}(x, y)}{2B_N(x, y)}$$

The gain value for each left parallax pixel:

$$g_{R_{Lt}}(x, y) = \frac{m_R(x, y)}{R_{Lt}(x, y)} = \frac{7}{8} \cdot \frac{R_N(x, y)}{R_{Lt}(x, y)} + \frac{1}{8} \cdot \frac{R_{Lt}(x, y) + R_{Rt}(x, y)}{2R_{Lt}(x, y)}$$

$$g_{G_{Lt}}(x, y) = \frac{m_R(x, y)}{G_{Lt}(x, y)} = \frac{7}{8} \cdot \frac{G_N(x, y)}{G_{Lt}(x, y)} + \frac{1}{8} \cdot \frac{G_{Lt}(x, y) + G_{Rt}(x, y)}{2G_{Lt}(x, y)}$$

$$g_{B_{Lt}}(x, y) = \frac{m_R(x, y)}{B_{Lt}(x, y)} = \frac{7}{8} \cdot \frac{B_N(x, y)}{B_{Lt}(x, y)} + \frac{1}{8} \cdot \frac{B_{Lt}(x, y) + B_{Rt}(x, y)}{2B_{Lt}(x, y)}$$

The gain value for each right parallax pixel:

$$g_{R_{Rt}}(x, y) = \frac{m_R(x, y)}{R_{Rt}(x, y)} = \frac{7}{8} \cdot \frac{R_N(x, y)}{R_{Rt}(x, y)} + \frac{1}{8} \cdot \frac{R_{Lt}(x, y) + R_{Rt}(x, y)}{2R_{Rt}(x, y)}$$

$$g_{G_{Rt}}(x, y) = \frac{m_R(x, y)}{G_{Rt}(x, y)} = \frac{7}{8} \cdot \frac{G_N(x, y)}{G_{Rt}(x, y)} + \frac{1}{8} \cdot \frac{G_{Lt}(x, y) + G_{Rt}(x, y)}{2G_{Rt}(x, y)}$$

$$g_{B_{Rt}}(x, y) = \frac{m_R(x, y)}{B_{Rt}(x, y)} = \frac{7}{8} \cdot \frac{B_N(x, y)}{B_{Rt}(x, y)} + \frac{1}{8} \cdot \frac{B_{Lt}(x, y) + B_{Rt}(x, y)}{2B_{Rt}(x, y)}$$

The following b) describes the case where the geometric average approach is selected to eliminate the parallax between the left and right pixels.

b) When a Geometric Average is Calculated Between the Left and Right Parallax Pixels The average value for each pixel:

$$m_R(x,y)=7/8 \cdot R_N(x,y)+1/8 \cdot \sqrt{R_{Lt}(x,y) \cdot R_{Rt}(x,y)}$$

$$m_G(x,y)=7/8 \cdot G_N(x,y)+1/8 \cdot \sqrt{G_{Lt}(x,y) \cdot G_{Rt}(x,y)}$$

$$m_B(x,y)=7/8 \cdot B_N(x,y)+1/8 \cdot \sqrt{B_{Lt}(x,y) \cdot B_{Rt}(x,y)}$$

The gain value for each no-parallax pixel:

$$g_{R_N}(x, y) = \frac{m_R(x, y)}{R_N(x, y)} = \frac{7}{8} + \frac{1}{8} \cdot \frac{\sqrt{R_{Lt}(x, y) + R_{Rt}(x, y)}}{R_N(x, y)}$$

$$g_{G_N}(x, y) = \frac{m_G(x, y)}{G_N(x, y)} = \frac{7}{8} + \frac{1}{8} \cdot \frac{\sqrt{G_{Lt}(x, y) + G_{Rt}(x, y)}}{G_N(x, y)}$$

$$g_{B_N}(x, y) = \frac{m_B(x, y)}{B_N(x, y)} = \frac{7}{8} + \frac{1}{8} \cdot \frac{\sqrt{B_{Lt}(x, y) + B_{Rt}(x, y)}}{B_N(x, y)}$$

The gain value for each left parallax pixel:

$$g_{R_{Lt}}(x, y) = \frac{m_R(x, y)}{R_{Lt}(x, y)} = \frac{7}{8} \cdot \frac{R_N(x, y)}{R_{Lt}(x, y)} + \frac{1}{8} \cdot \sqrt{\frac{R_{Rt}(x, y)}{R_{Lt}(x, y)}}$$

$$g_{G_{Lt}}(x, y) = \frac{m_G(x, y)}{G_{Lt}(x, y)} = \frac{7}{8} \cdot \frac{G_N(x, y)}{G_{Lt}(x, y)} + \frac{1}{8} \cdot \sqrt{\frac{G_{Rt}(x, y)}{G_{Lt}(x, y)}}$$

$$g_{B_{Lt}}(x, y) = \frac{m_G(x, y)}{B_{Lt}(x, y)} = \frac{7}{8} \cdot \frac{B_N(x, y)}{B_{Lt}(x, y)} + \frac{1}{8} \cdot \sqrt{\frac{B_{Rt}(x, y)}{B_{Lt}(x, y)}}$$

The gain value for each right parallax pixel:

$$g_{R_{Rt}}(x, y) = \frac{m_R(x, y)}{R_{Rt}(x, y)} = \frac{7}{8} \cdot \frac{R_N(x, y)}{R_{Rt}(x, y)} + \frac{1}{8} \cdot \sqrt{\frac{R_{Lt}(x, y)}{R_{Rt}(x, y)}}$$

$$g_{G_{Rt}}(x, y) = \frac{m_G(x, y)}{G_{Rt}(x, y)} = \frac{7}{8} \cdot \frac{G_N(x, y)}{G_{Rt}(x, y)} + \frac{1}{8} \cdot \sqrt{\frac{G_{Lt}(x, y)}{G_{Rt}(x, y)}}$$

$$g_{B_{Rt}}(x, y) = \frac{m_B(x, y)}{B_{Rt}(x, y)} = \frac{7}{8} \cdot \frac{B_N(x, y)}{B_{Rt}(x, y)} + \frac{1}{8} \cdot \sqrt{\frac{B_{Lt}(x, y)}{B_{Rt}(x, y)}}$$

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An image processing method for converting a first image into a second image, the first image being input by capturing, through a single optical system, subject images from a left viewpoint, a right viewpoint, and a reference viewpoint in a reference direction simultaneously with different pixels, using an image sensor that is represented by a color system having first to n-th (n 2:1) color components and constituted by a plurality of pixels each of which has color information corresponding to a single color component, the image sensor having a pixel array structured in such a manner that pixels of a first color component include at least three types of pixels including a left parallax pixel having an aperture mask to cause parallax in a left direction with respect to the reference direction, a right parallax pixel having an aperture mask to cause parallax in a right direction with respect to the reference direction and a no-parallax pixel having an aperture mask to create the reference viewpoint, the second image being an image in which each of the pixels has color information corresponding the first to n-th color components for the reference viewpoint, the image processing method comprising:

producing color information corresponding to the first color component for the right viewpoint, based on captured color information corresponding to the right parallax pixel of the first color component, for a position of the left parallax pixel of the first color component of the first image;

producing color information corresponding to the first color component for the reference viewpoint, based on captured color information corresponding to the no-parallax pixel of the first color component, for a position of the left parallax pixel of the first color component of the first image;

calculating an average value between two viewpoints, or between the color information corresponding to the first color component for the left viewpoint captured by the image sensor and the produced color information corresponding to the first color component for the right viewpoint, on the position of the left parallax pixel of the first color component of the first image;

producing color information corresponding to the first color component for the left viewpoint, based on captured color information corresponding to the left parallax pixel of the first color component, for a position of the right parallax pixel of the first color component of the first image;

producing color information corresponding to the first color component for the reference viewpoint, based on captured color information corresponding to the no-parallax pixel of the first color component, for the position of the right parallax pixel of the first color component of the first image;

calculating an average value between two viewpoints, or between (i) color information corresponding to the first color component for the right viewpoint captured by the image sensor and (ii) the produced color information corresponding to the first color component for the left viewpoint, on the position of the right parallax pixel of the first color component of the first image;

calculating an average value between three viewpoints, or between (i) color information corresponding to the calculated average value of the first color component between the two viewpoints corresponding to the left viewpoint and the right viewpoint and (ii) the produced color information corresponding to the first color component for the reference viewpoint, on the position of the right parallax pixel of the first color component of the first image;

producing color information corresponding to the first color component for the left viewpoint, based on captured color information corresponding to the left parallax pixel of the first color component, for a position of the no-parallax pixel of the first color component of the first image;

producing color information corresponding to the first color component for the right viewpoint, based on captured color information corresponding to the right parallax pixel of the first color component, for the position of the no-parallax pixel of the first color component of the first image;

calculating an average value between two viewpoints, or between (i) the produced color information corresponding to the first color component for the left viewpoint and (ii) the produced color information corresponding to the first color component for the right viewpoint, on the position of the no-parallax pixel of the first color component of the first image;

calculating an average value between three viewpoints, or between (i) color information corresponding to the calculated average value of the first color component between the two viewpoints corresponding to the left viewpoint and the right viewpoint and (ii) color information corresponding to the first color component for the reference viewpoint captured by the image sensor, on the position of the no-parallax pixel of the first color component of the first image;

combining the color information corresponding to the first color component of the calculated average values between the three viewpoints with the color information corresponding to the remaining color components of the first image to output a third image in which each pixel has color information corresponding to a single color component; and producing the second image based on the color information of the third image;

wherein the average value between the three viewpoints is calculated with the three viewpoints being allocated unequal weights.

2. The image processing method as set forth in claim 1, further comprising: producing an image of the left viewpoint of the first color component for each pixel based on the color information corresponding to the left parallax pixel of the first color component; producing an image of the right viewpoint of the first color component for each pixel based on the color information corresponding to the right parallax pixel of the first color component; newly producing an image of the left viewpoint of the first to the n-th color components based on at least the produced image of the left viewpoint of the first color component and the second image of the reference viewpoint of the first to the n-th color components; and newly producing an image of the right viewpoint of the first to the n-th color components based on at least the produced image of the right viewpoint of the first color component and the second image of the reference viewpoint of the first to n-th color components.

3. The image processing method as set forth in claim 1, wherein when the aperture mask of the no-parallax pixel of the image sensor has an opening area equal to a sum of opening areas of the aperture mask of the left parallax pixel and the aperture mask of the right parallax pixel, the average value between the two viewpoints, or the left and right viewpoints is determined by calculating an arithmetic average.

4. The image processing method as set forth in claim 1, wherein when the aperture mask of the no-parallax pixel of the image sensor has the same opening area as the aperture mask of the left parallax pixel or the aperture mask of the right parallax pixel, the average value between the two viewpoints, or the left and right viewpoints is determined by calculating a geometric average.

5. The image processing method as set forth in claim 1, wherein the average value between the three viewpoints is determined by calculating a geometric average.

6. The image processing method as set forth in claim 1, wherein the production of the second image from the third image includes:

calculating degrees of similarity in at least two directions based on the color information of the third image;

comparing the degrees of similarity to determine a direction of a higher degree of similarity; and interpolating a color component missing in the third image based on color information in the direction of the higher degree of similarity.

7. The image processing method as set forth in claim 6, wherein the calculation of the degree of similarity includes:

calculating a degree of similarity between pixels of the same color component; and calculating a degree of similarity between pixels of different color components.

8. The image processing method as set forth in claim 1, wherein the production of the second image from the third image includes calculating an interpolation value simultaneously using color information corresponding to the color component missing in the third image and color information corresponding to a color component different from the missing color component.

9. The image processing method as set forth in claim 1, wherein the average value between the three viewpoints is calculated with weights being allocated according to a pixel density distribution ratio between the left parallax pixels, the right parallax pixels and the no-parallax pixels in the pixel array.

* * * * *